US012670879B2

(12) United States Patent
Fang et al.

(10) Patent No.: US 12,670,879 B2
(45) Date of Patent: Jun. 30, 2026

(54) DISPLAY PANEL AND DISPLAY MODULE

(71) Applicants: Fuzhou BOE Optoelectronics Technology Co., Ltd., Fuzhou (CN); BOE TECHNOLOGY GROUP CO., LTD., Beijing (CN)

(72) Inventors: Xin Fang, Beijing (CN); Wenchao Wang, Beijing (CN); Xu Xu, Beijing (CN); Jinliang Wang, Beijing (CN); Zecun Zeng, Beijing (CN); Tianyang Han, Beijing (CN); Xiaolong Chen, Beijing (CN); Jixiang Chen, Beijing (CN); Longgan Hu, Beijing (CN)

(73) Assignees: Fuzhou BOE Optoelectronics Technology Co., Ltd., Fuzhou (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 19/114,173

(22) PCT Filed: Sep. 23, 2022

(86) PCT No.: PCT/CN2022/121062
§ 371 (c)(1),
(2) Date: Mar. 21, 2025

(87) PCT Pub. No.: WO2024/060238
PCT Pub. Date: Mar. 28, 2024

(65) Prior Publication Data
US 2026/0112327 A1 Apr. 23, 2026

(51) Int. Cl.
*G09G 3/36* (2006.01)
*G02F 1/1362* (2006.01)
*H10D 86/40* (2025.01)

(52) U.S. Cl.
CPC ..... *G09G 3/3607* (2013.01); *G02F 1/136286* (2013.01); *G09G 3/3677* (2013.01);
(Continued)

(58) Field of Classification Search
CPC .............. G09G 3/3266; G09G 3/3674; G09G 2310/0267; G09G 2310/0278; G09G 2310/0281
See application file for complete search history.

(56) References Cited

U.S. PATENT DOCUMENTS

| | | | | |
|---|---|---|---|---|
| 5,757,450 A * | 5/1998 | Fujii | ..................... | G02F 1/1345 |
| | | | | 349/151 |
| 8,405,809 B2 * | 3/2013 | Lee | ........................ | G02F 1/1345 |
| | | | | 349/149 |
| 2007/0216845 A1 * | 9/2007 | Liao | .................... | G02F 1/13452 |
| | | | | 349/149 |

* cited by examiner

*Primary Examiner* — Kevin M Nguyen
(74) *Attorney, Agent, or Firm* — The Webb Law Firm

(57) ABSTRACT

A display panel includes a display area and a peripheral area. The peripheral area includes a first signal line arrangement region including first signal lines and a second signal line arrangement region including second signal lines. First lead-out lines are led out from the first lead-out positions included in a border of the first signal line arrangement region and are connected to the first signal lines. A first lead-out line is connected to a data line. A first reference signal line is led out from a first reference lead-out position and connected to a first reference data line. Second lead-out lines are led out from second lead-out positions included in a border of the second signal line arrangement region, and are electrically connected to the second signal lines; and second lead-out line is electrically connected to a gate line.

20 Claims, 16 Drawing Sheets

(52) U.S. Cl.

CPC ... *H10D 86/441* (2025.01); *G09G 2300/0408* (2013.01); *G09G 2300/0426* (2013.01); *G09G 2310/0286* (2013.01); *G09G 2320/0219* (2013.01); *G09G 2330/06* (2013.01)

100

100

DISPLAY PANEL AND DISPLAY MODULE

CROSS-REFERENCE TO RELATED APPLICATION

This application is the United States national phase of International Patent Application No. PCT/CN2022/121062, filed Sep. 23, 2022, the disclosure of which is hereby incorporated by reference in its entirety.

BACKGROUND OF THE INVENTION

Field of the Invention

The present disclosure relates to the field of display technologies, and in particular, to a display panel and a display module.

Description of Related Art

The display panel has a display area and a frame area, and the display area is used to display images. Existing display panels have a wide bezel.

SUMMARY OF THE INVENTION

In an aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines including a first reference lead-out line, data lines including a first reference data line, a plurality of second lead-out lines, and gate lines. a border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line; the plurality of first lead-out positions include a first reference lead-out position, and the first reference lead-out line is led out from the first reference lead-out position and electrically connected to the first reference data line; a width of the first signal line arrangement region corresponding to the first reference lead-out position is b0; a width b of the first signal line arrangement region corresponding to at least partially continuously distributed first target lead-out positions except for the first reference lead-out position satisfies: $b0-[int(k\Delta1/P1)](W_{data}+S_{data}) \leq b \leq b0-[int(k\Delta1/P1)-1](W_{data}+S_{data})$, where $\Delta1$ is a distance between a first target lead-out position and the first reference lead-out position in the first direction, P1 is an arrangement period of a pixel in the first direction, k is a number of sub-pixels in the pixel, $W_{data}$ is a width of a first signal line, and $S_{data}$ is a distance between adjacent first signal lines of the plurality of first signal lines. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction.

In some embodiments, the first direction is perpendicular to the second direction; an extension direction of at least part of the first signal line arrangement region and an extension direction of at least part of the second signal line arrangement region are each different from both the first direction and the second direction.

In some embodiments, for the at least partially continuously distributed first target lead-out positions, a width b1 of the first signal line arrangement region corresponding to a first target lead-out position corresponding to a sub-pixel with a same color as a sub-pixel electrically connected to the first reference data line satisfies: $b1=b0-[int(k\Delta1/P1)](W_{data}+S_{data})$.

In some embodiments, the at least partially continuously distributed first target lead-out positions include three continuously distributed first target lead-out positions, and the three continuously distributed first target lead-out positions are electrically connected to three sub-pixels of a pixel in a one-to-one correspondence, an overall width of three first lead-out lines corresponding to the three continuously distributed first target lead-out positions is less than or equal to an arrangement period of a sub-pixel in the first direction.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. The plurality of second lead-out positions include a second reference lead-out position, and the second reference lead-out line is led out from the second reference lead-out position and is electrically connected to the reference gate line; a width of the second signal line arrangement region corresponding to the second reference lead-out position is c0; among at least partially continuously distributed second target lead-out positions except for the second reference lead-out position, a width c of the second signal line arrangement region corresponding to each second target lead-out position satisfies: $c0-[int(k\Delta2/P1)+1](W_{gate}+S_{gate}) \leq c \leq c0-[int(k\Delta2/P1)-1](W_{gate}+S_{gate})$, where $\Delta2$ is a distance between a second target lead-out position and the second reference lead-out position in the first direction, $W_{gate}$ is a width of a second signal line, and $S_{gate}$ is a distance between adjacent second signal lines of the plurality of signal lines.

In some embodiments, a distance between the first reference lead-out position and the second reference lead-out position in the first direction is less than the arrangement period of the pixel in the first direction; the at least partially continuously distributed second target lead-out positions and the at least partially continuously distributed first target lead-out positions are alternately distributed in the first direction.

In some embodiments, among the at least partially continuously distributed first target lead-out positions, m second target lead-out positions are provided on each of two sides of every three first target lead-out positions, where m is one of three values 4, 5, or 6.

In some embodiments, the three first target lead-out positions are arranged at equal intervals, and the m second target lead-out positions are arranged at equal intervals; a distance between the three first target lead-out positions is greater than a distance between the m second target lead-out positions.

In some embodiments, the three first target lead-out positions are arranged at equal intervals, and the m second target lead-out positions are arranged at equal intervals; a width occupied by the three first target lead-out positions in the first direction is less than a width occupied by the m second target lead-out positions in the first direction.

In some embodiments, an included angle between a first lead-out line and a first signal line electrically connected thereto is greater than or equal to 90 degrees; an included angle between a second lead-out line and a second signal line electrically connected thereto is greater than or equal to 90 degrees.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. The plurality of second lead-out positions include a second reference lead-out position, and the second reference lead-out line is led out from the second reference lead-out position and is electrically connected to the reference gate line; a width of the second signal line arrangement region corresponding to the second reference lead-out position is c0; among at least partially continuously distributed second target lead-out positions except for the second reference lead-out position, a width c of the second signal line arrangement region corresponding to each second target lead-out position satisfies: $c0-[int(\Delta3/P_{sub2})+1](W_{gate}+S_{gate}) \leq c \leq c0-[int(\Delta3/P_{sub2})-1](W_{gate}+S_{gate})$, where $\Delta3$ is a distance between a second target lead-out position and the second reference lead-out position in the second direction, $P_{sub2}$ is an arrangement period of a sub-pixel in the second direction, $W_{gate}$ is a width of a second signal line, and $S_{gate}$ is a distance between adjacent second signal lines.

In some embodiments, the gate lines further include a target gate line; for the at least partially continuously distributed second target lead-out positions, a width c1 of the second signal line arrangement region corresponding to a second lead-out position electrically connected to the target gate line spaced an odd-numbered gate lines from the reference gate line satisfies: $c1=c0-[int(\Delta3/P_{sub2})](W_{gate}+S_{gate})$.

In some embodiments, the width c satisfies: $c=c0-[int(\Delta3/P_{sub2})](W_{gate}+S_{gate})$.

In some embodiments, the width b satisfies: $b=b0-[int(k\Delta1/P1)](W_{gate}+S_{gate})$, where P1 is the arrangement period of the pixels in the first direction.

In some embodiments, the first signal line arrangement region is closer to the display area than the second signal line arrangement region, or the second signal line arrangement region is closer to the display area than the first signal line arrangement region.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. In a case where the second signal line arrangement region is closer to the display area than the first signal line arrangement region, and the first lead-out lines are led out in the second direction, an included angle $\theta 1$ between a first signal line that is located in the first signal line arrangement region and is immediately adjacent to the second signal line arrangement region and a second signal line that is located in the second signal line arrangement region and is immediately adjacent to the first signal line arrangement region satisfies: $\sin \theta 1 = [I1(W_{data}+S_{data}) \cos \alpha 1]/P1$, where $\alpha 1$ is an included angle between the second signal line that located in the second signal line arrangement region and is immediately adjacent to the first signal line arrangement region and the first direction, I1 is a number of first target lead-out positions corresponding to a range of the arrangement period of the pixel in the first direction, and P1 is the arrangement period of the pixel in the first direction.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. In a case where the first signal line arrangement region is closer to the display area than the second signal line arrangement region, and the second lead-out lines are led out in the second direction, an included angle $\theta 2$ between a first signal line that is located in the first signal line arrangement region and is immediately adjacent to the second signal line arrangement region and a second signal line that is located in the second signal line arrangement region and is immediately adjacent to the first signal line arrangement region satisfies: $\sin \theta 2 = [I2(W_{gate}+S_{gate}) \cos \alpha 2]/P1$, where $\alpha 2$ is an included angle between the first signal line that located in the first signal line arrangement region and is immediately adjacent to the second signal line arrangement region and the first direction, I2 is a number of second target lead-out positions corresponding to a range of the arrangement period of the pixel in the first direction, and P1 is the arrangement period of the pixel in the first direction.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. In a case where the first signal line arrangement region is closer to the display area than the second signal line arrangement region, and the second lead-out lines are led out in the first direction, an included angle $\theta 3$ between a first signal line that is located in the first signal line arrangement region and is immediately adjacent to the second signal line arrangement region and a second signal line that is located in the second signal line arrangement region and is immediately adjacent to the first signal line arrangement region satisfies: $\sin \theta3=[I3 \ (W_{gate}+S_{gate}) \sin \alpha3]/P2$, where $\alpha3$ is an included angle between the first signal line that is located in the first signal line arrangement region and is immediately adjacent to the second signal line arrangement region and the first direction, I3 is a number of second target lead-out positions corresponding to a range of an arrangement period of a pixel in the second direction, and P2 is the arrangement period of the pixel in the second direction.

In some embodiments, the second signal line arrangement region is closer to the display area than the first signal line arrangement region, an included angle $\theta$ between a first signal line that is located in the first signal line arrangement region and is immediately adjacent to the second signal line arrangement region and a second signal line that is located in the second signal line arrangement region and is immediately adjacent to the first signal line arrangement region is in a range of 1° to 5°, inclusive.

In some embodiments, a width of the first lead-out line is greater than a width of a first signal line connected thereto; and/or a width of the second lead-out line is greater than a width of a second signal line connected thereto.

In yet another aspect, a display panel is provided. The display panel includes a display area and a peripheral area; the display area includes a plurality of pixels arranged in an array extending in a first direction and a second direction, each pixel includes a plurality of sub-pixels arranged in the first direction; the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction. The first signal line arrangement region and the second signal line arrangement region are both in a shape of a narrow strip, and include borders that are close to and non-overlapping with each other, and the borders extend in a same direction. The display panel comprises: a plurality of first lead-out lines, data lines, a plurality of second lead-out lines including a second reference lead-out line, and gate lines including a reference gate line. A border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line. A border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction. The display panel includes a gate driving circuit located in the peripheral area, wherein the gate driving circuit has a plurality of shift register units, at least part of the plurality of shift register units are electrically connected to the gate lines for sending gate driving signals to the gate lines; an overall span of the plurality of shift register units in the second direction is less than an overall span of the pixels in the display area in the second direction.

In some embodiments, the display area includes a column of pixels with a longest span, in a plane where the display panel is located, a first orthographic projection of the plurality of shift register units on a straight line where the column of pixels with the longest span is located is within a second orthographic projection of the column of pixels with the longest span on the straight line where the column of pixels with the longest span is located.

In some embodiments, a distribution period of shift register units on at least one side of the display area is less than a distribution period of a sub-pixel in the second direction.

In some embodiments, a distribution contour of the shift register units distributed on the at least one side of the display area is the same as an outer contour of the display area on a corresponding side thereof.

In some embodiments, a ratio of the first orthographic projection to the second orthographic projection is in a range of [0.1, 0.9].

In some embodiments, the plurality of shift register units are located on two sides of the display area.

In some embodiments, a border of the display area and a signal line arrangement region closest thereto are further provided with a common electrode lead line therebetween, and the signal line arrangement region closest to the border of the display area is the first signal line arrangement region or the second signal line arrangement region; a contour of at least part of the common electrode lead line is the same as an corresponding outer contour of the display area, or dummy sub-pixels are provided at a periphery of the display area, and the at least part of the common electrode lead line extends to fit an outer contour of a whole composed of sub-pixels and the dummy sub-pixels in the display area.

In some embodiments, a minimum distance a between an outer contour of the display area and a signal line arrangement region closest thereto is greater than or equal to $$2\sqrt{P1^2 + P2^2};$$

the signal line arrangement region closest to a border of the display area is the first signal line arrangement region or the second signal line arrangement region.

In some embodiments, the arrangement period P1 of the pixel in the first direction is in a range of [60 μm, 900 μm]; an arrangement period P2 of the pixel in the second direction is in a range of [60 μm, 900 μm]; and a width $P_{sub1}$ of a sub-pixel in the first direction is in a range of [20 μm, 900 μm]; a width $P_{sub2}$ of the sub-pixel in the second direction is in a range of [20 μm, 900 μm].

In some embodiments, the width $W_{data}$ of the first signal line is in a range of [1 μm, 20 μm]; the distance $S_{data}$ between the adjacent first signal lines is in a range of [1 μm, 20 μm]; and a width $W_{gate}$ of a second signal line is in a range of [1 μm, 20 μm]; a distance $S_{gate}$ of adjacent second signal lines is in a range of [1 μm, 20 μm].

In some embodiments, the first reference lead-out position is a first lead-out position closest to a position of the first signal line arrangement region with a maximum width.

In some embodiments, the second reference lead-out position is a second lead-out position closest to a position of the second signal line arrangement region with a maximum width.

In some embodiments, the display panel includes a data line bonding region, the data line bonding region includes a plurality of data line bonding pins, and the first signal lines are electrically connected to the data line bonding pins in a one-to-one correspondence; the first signal line arrangement region is located in a region between a non-display area that is between the gate driving circuit in the peripheral area and the display area and a non-display area that is between the data line bonding region and the display area; and the second signal line arrangement region is located in a region between a non-display area that is between the gate driving circuit in the peripheral area and the display area and a non-display area that is between the data line bonding region and the display area.

In some embodiments, the display panel includes a data line bonding region, wherein the data line bonding region includes a plurality of data line bonding pins, and the first signal lines are electrically connected to the data line bonding pins in a one-to-one correspondence; and the display panel comprises a gate line bonding region, wherein the gate line bonding region includes a plurality of gate line bonding pins, and the second signal lines are electrically connected to the gate line bonding pins in a one-to-one correspondence. The first signal line arrangement region is located in a region between a non-display area that is between the gate line bonding region in the peripheral area and the display area and a non-display area that is between the data line bonding region and the display area; and the second signal line arrangement region is located in a region between a non-display area that is between the gate line bonding region in the peripheral area and the display area and a non-display area that is between the data line bonding region and the display area.

In another aspect, a display module is provided. The display module includes the display panel as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

Figures 14A, 14B:
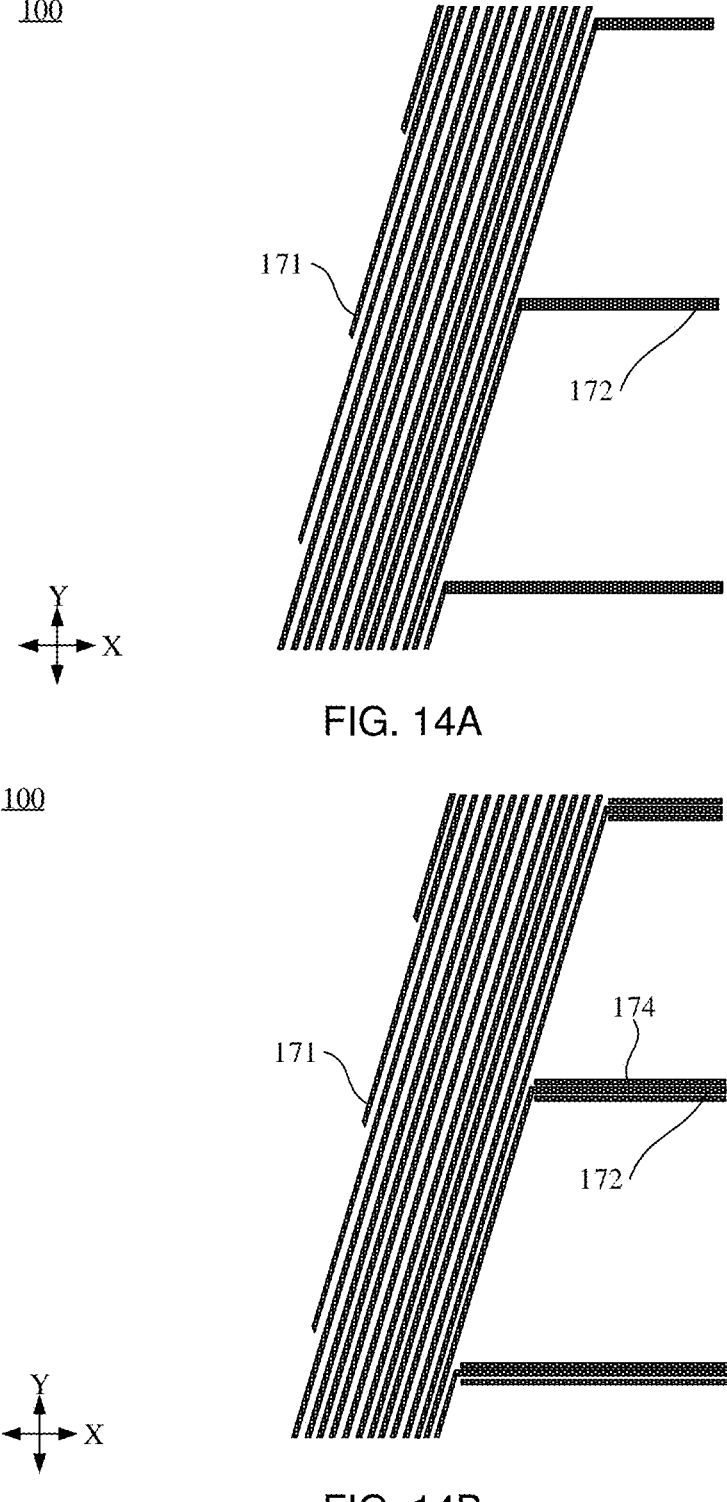
Figure 15:
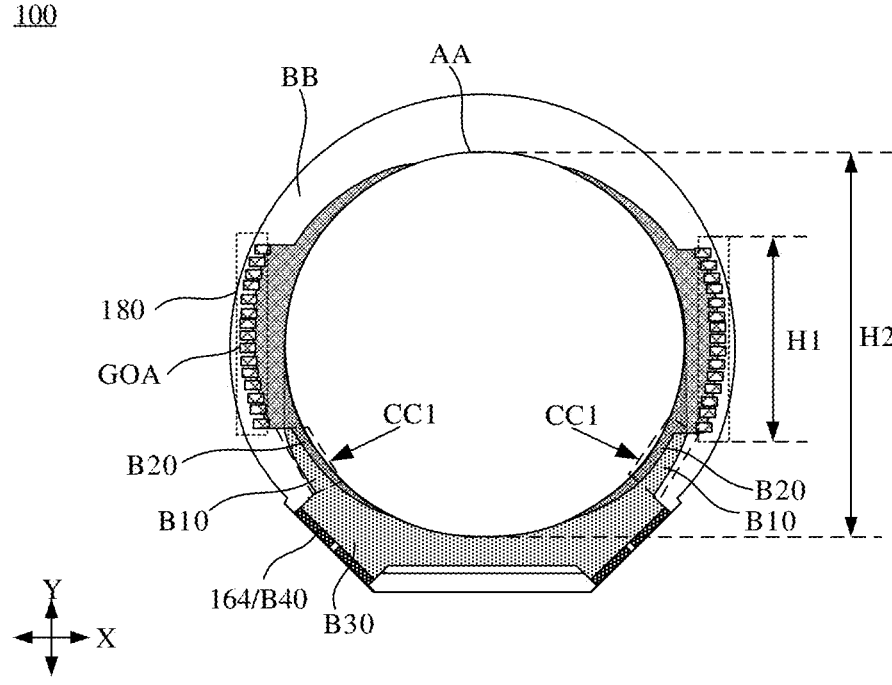
Figure 16:
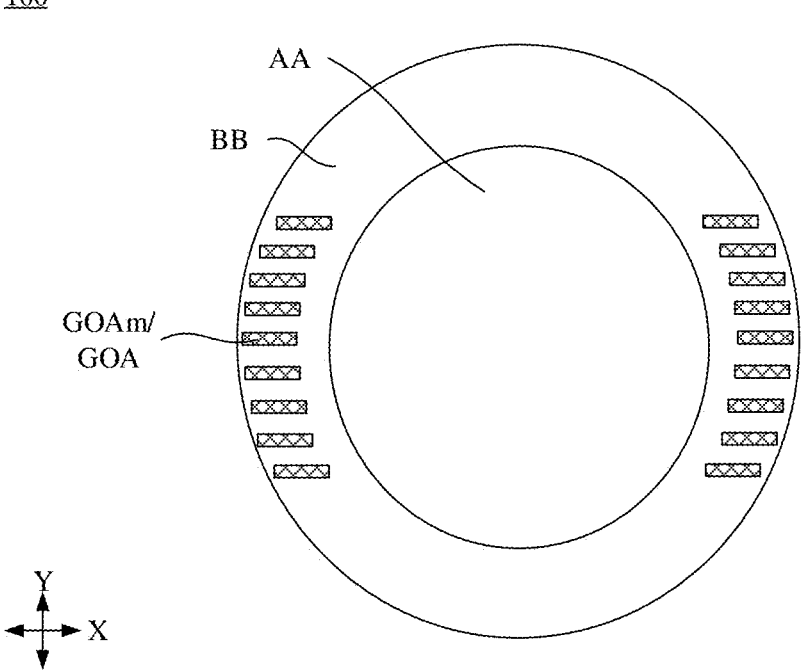
Figure 17:
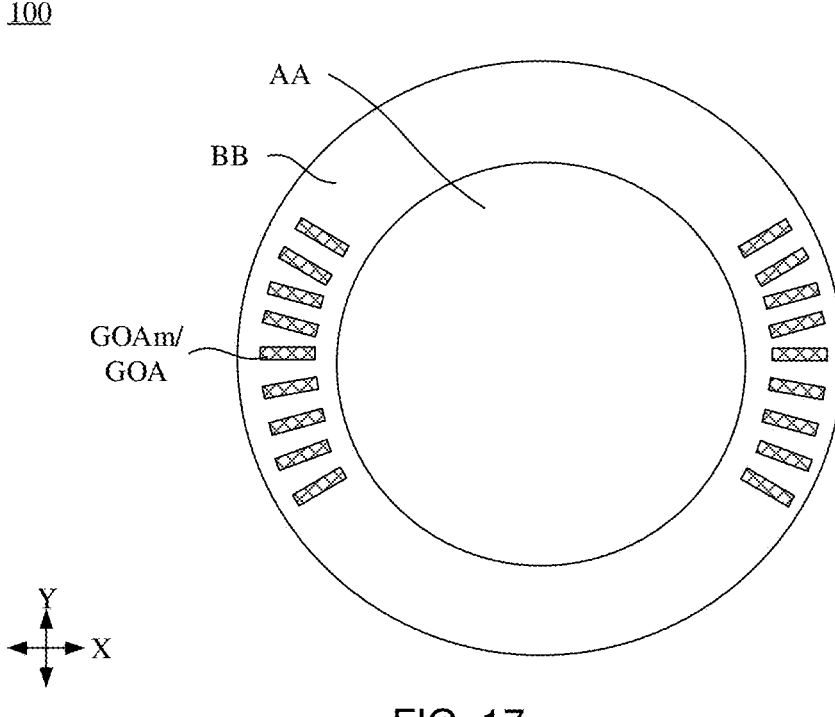
Figure 18:
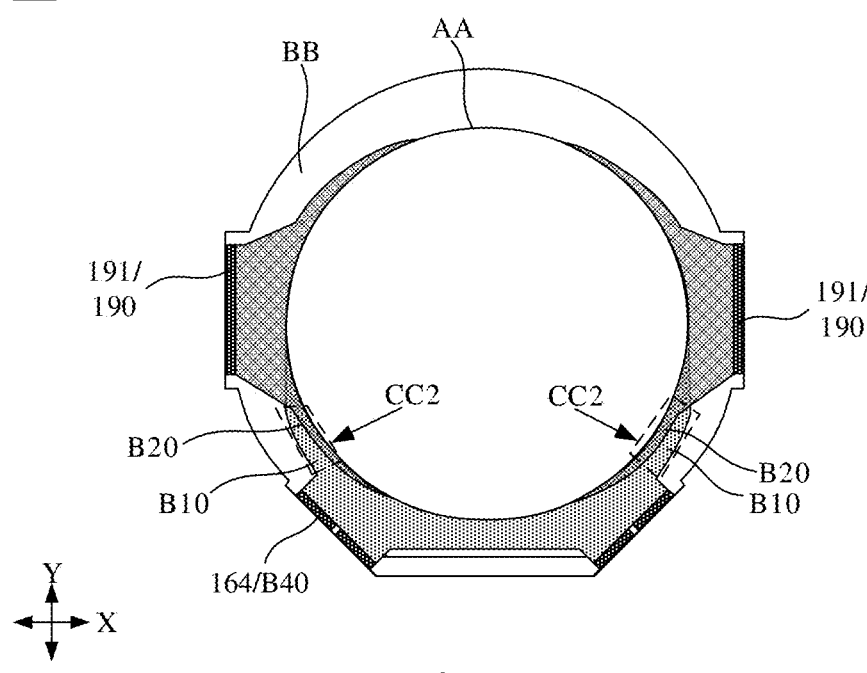
Figure 19:
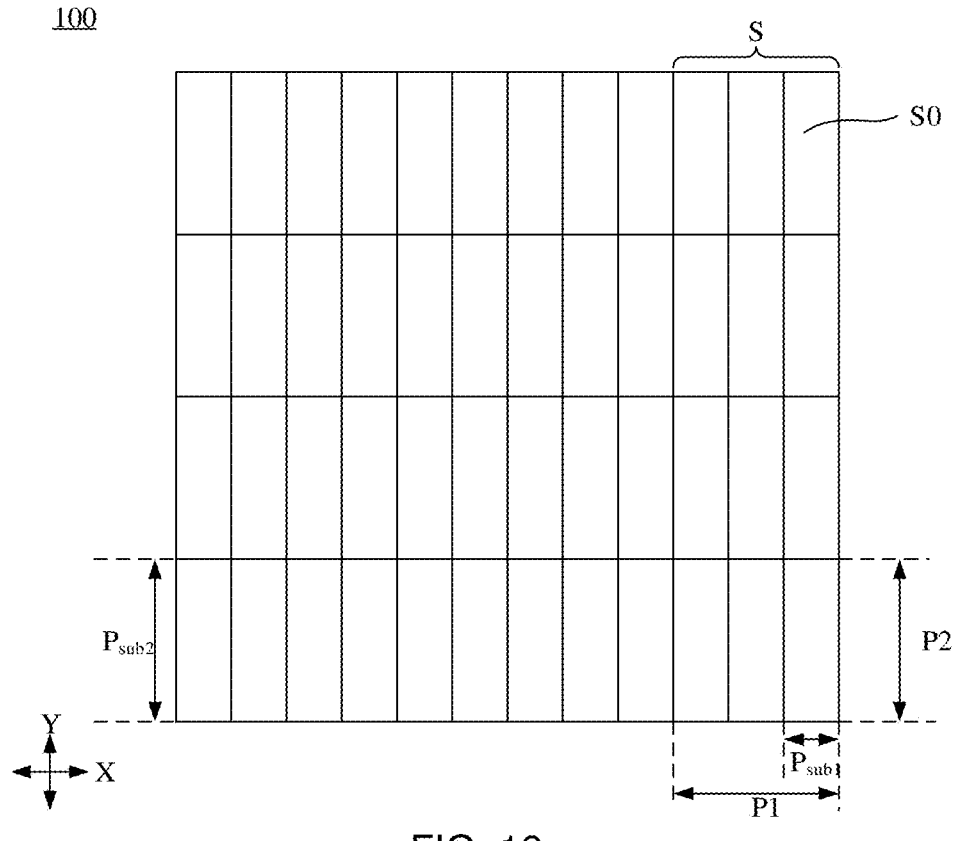
Figure 20:
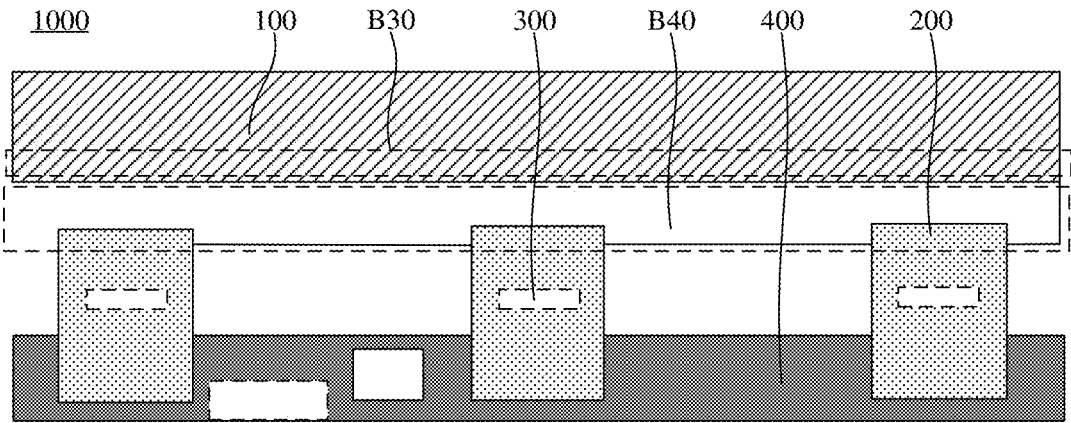

FIG. I3 is a structural diagram of a display panel, in accordance with some embodiments;

FIG. 14A is a structural diagram of a display panel, in accordance with some embodiments;

FIG. 14B is a structural diagram of a display panel, in accordance with some embodiments;

FIG. 15 is a structural diagram of a display panel, in accordance with some embodiments;

FIG. 16 is a structural diagram of a display panel, in accordance with some embodiments;

FIG. 17 is a structural diagram of a display panel, in accordance with some embodiments;

FIG. 18 is a structural diagram of a display panel, in accordance with some embodiments;

FIG. 19 is a structural diagram of a display panel, in accordance with some embodiments; and FIG. 20 is a structural diagram of a display module, in accordance with some embodiments.

DESCRIPTION OF THE INVENTION

The technical solutions in some embodiments of the present disclosure will be described clearly and completely with reference to the accompanying drawings; however, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

The phrase "A and/or B" includes the following three combinations: only A, only B, and a combination of A and B.

The term such as "about", "substantially", and "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 1:
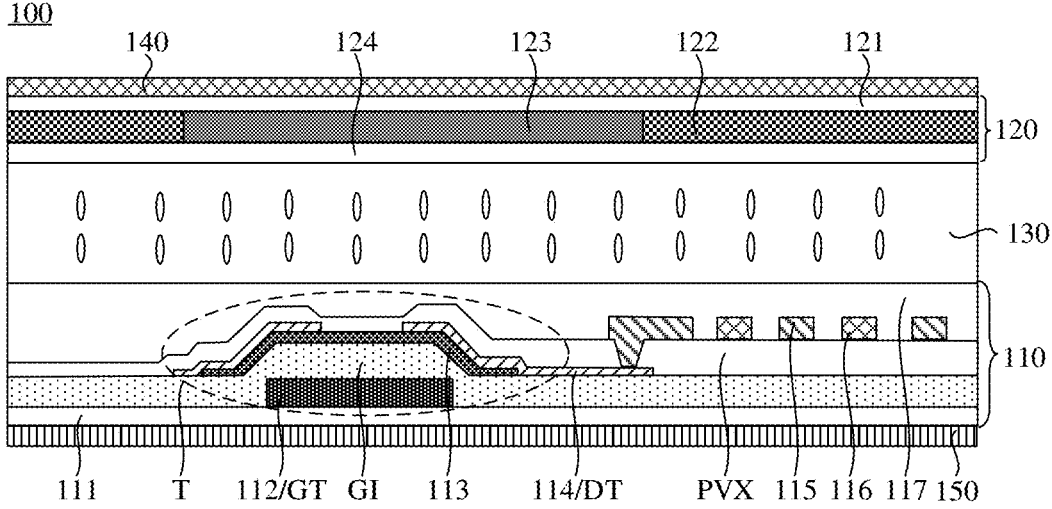
FIG. 1 is a structural diagram of a display panel, in accordance with some embodiments.

FIG. 1 is a structural diagram of a display panel 100, in accordance with some embodiments.

Referring to FIG. 1, some embodiments of the present disclosure provide a display panel 100. The display panel may be a liquid crystal display panel. A structure of the liquid crystal display panel is schematically described below.

Referring to FIG. 1, in some examples, the display panel 100 includes an array substrate 110, an opposite substrate 120, and a liquid crystal layer 130 disposed between the array substrate 110 and the opposite substrate 120.

The array substrate 110 includes: a first substrate 111, and a gate metal layer 112, a gate insulating layer GI, an active layer 113, a source-drain metal layer 114 and a passivation layer PVX that are sequentially arranged on the first substrate 111. The source-drain metal layer 114 is lapped on the active layer 113.

In addition, the array substrate 110 further includes a pixel electrode 115 and a common electrode 116; the pixel electrode 115 is connected to the source-drain metal layer 114 through a via hole.

Referring to FIG. 1, in some examples, the pixel electrode 115 and the common electrode 116 may be disposed in a same layer; in this case, the pixel electrode 115 and the common electrode 116 are each of a comb structure including a plurality of stripe-shaped sub-electrodes.

In some other examples, the pixel electrode 115 and the common electrode 116 may be disposed in different layers; in this case, an insulating layer is provided between the pixel electrode 115 and the common electrode 116. In this case, the common electrode 116 is disposed on the first substrate 111, and the pixel electrode 115 is disposed on the gate insulating layer GI.

In addition, in some other examples, the array substrate 110 may only include the pixel electrode 115 and not include the common electrode 116. In this case, the common electrode 116 may be located in the opposite substrate 120.

Referring to FIG. 1, the array substrate 110 further includes a planarization layer 117; the gate metal layer 112, the gate insulating layer GI, the active layer 113, the source-drain metal layer 114, the passivation layer PVX and the pixel electrode 115 are all located between the first substrate 111 and the planarization layer 117.

Referring to FIG. 1, the opposite substrate 120 includes: a second substrate 121, and a color filter layer 124, a black matrix pattern 123, and a protective layer 124 that are disposed on the second substrate 121. The color filter layer 122 and the black matrix pattern 123 are located between the second substrate 121 and the protective layer 124. In this case, the opposite substrate 120 may be also referred to as a color filter (CF) substrate.

The color filter layer 122 includes at least red photoresist units, green photoresist units and blue photoresist units, and the red photoresist units, the green photoresist units and the blue photoresist units are directly opposite to the sub-pixels in the array substrate 110 in a one-to-one correspondence. The black matrix pattern 123 is used for spacing apart the red photoresist unit, the green photoresist unit and the blue photoresist unit.

In some embodiments, the display panel 100 is a black and white display panel, and the opposite substrate 120 may not include the color filter layer 122; in some embodiments, the color filter layer 122 may also be replaced by a colorless light-transmitting material, such as transparent resin.

Referring to FIG. 1, the display panel 100 further includes an upper polarizer 140 disposed on a side of the opposite substrate 120 away from the liquid crystal layer 130 and a lower polarizer 150 disposed on a side of the array substrate 110 away from the liquid crystal layer 130.

The multiple film layers in the display panel 100 are introduced above, and the planar structure of the display panel 100 will be introduced below.

Figure 2A:
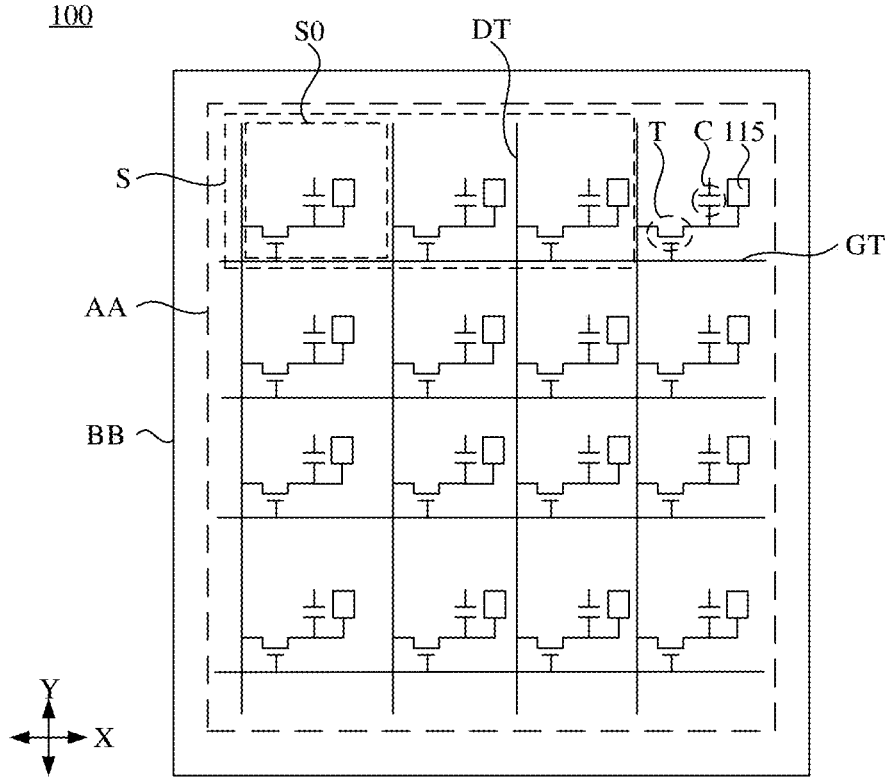
FIG. 2A is a structural diagram of a display panel, in accordance with some embodiments.
Figure 2B:
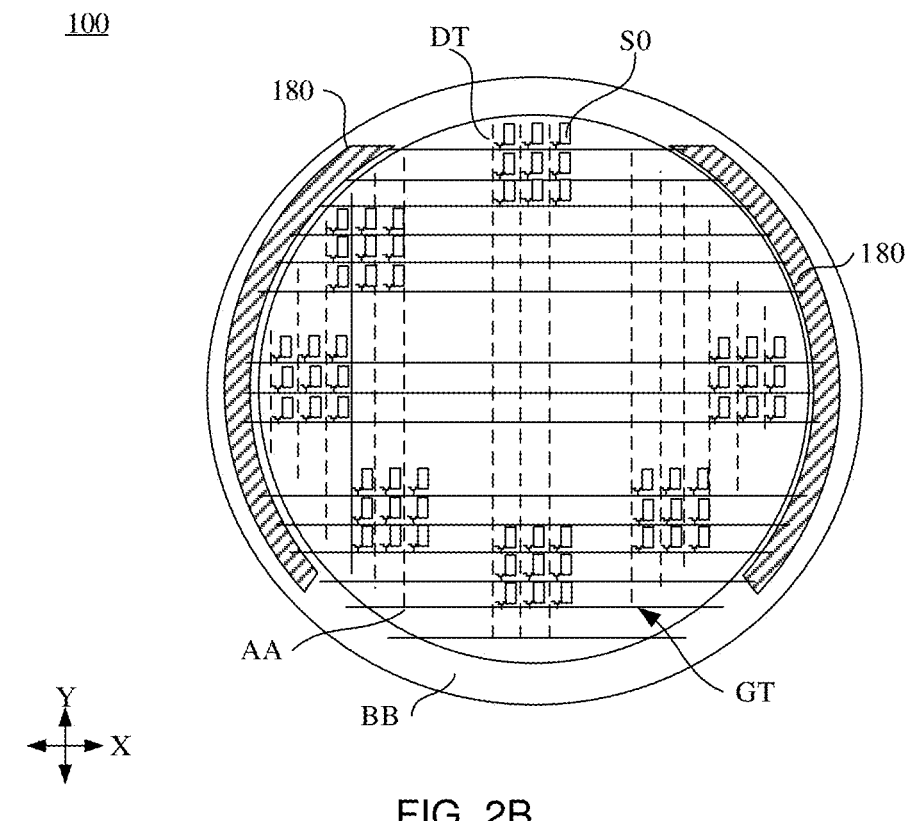
FIG. 2B is a structural diagram of a display panel, in accordance with some embodiments.

FIG. 2A is a structural diagram of the display panel 100, in accordance with some embodiments. FIG. 2B is a structural diagram of the display panel, in accordance with some other embodiments.

Referring to FIGS. 2A and 2B, the display panel 100 includes a display area AA and a peripheral area BB, and the peripheral area BB is disposed on at least one side of the display area AA. In some examples, the peripheral area BB is arranged around the display area AA.

Referring to FIGS. 2A and 2B, the display area AA includes a plurality of pixels S arranged in an array, and the array extends in a first direction X and a second direction Y. Each pixel S includes a plurality of sub-pixels S0 arranged in the first direction X. Referring to FIG. 2A, a direction pointed by the arrow X is the first direction, and a direction pointed by the arrow Y is the second direction.

Referring to FIG. 2A, the display panel 100 further includes a plurality of gate lines GT extending in the first direction X and a plurality of data lines DT extending in the second direction Y. The plurality of gate lines GT and the plurality of data lines DT may define a plurality of sub-pixel regions. A sub-pixel S0 is located in a sub-pixel region. The plurality of gate lines GT are located in the gate metal layer 112 (as shown in FIG. 1). The plurality of data lines DT are located in the source-drain metal layer 114 (as shown in FIG. 1).

The sub-pixel S0 includes a thin film transistor (TFT) T, a pixel electrode 115 and a common electrode 116. The sub-pixel S0 may further include a storage capacitor C (not as shown in FIG. 1).

The thin film transistor T includes a gate, a source, a drain and a channel; the gate of the thin film transistor T is electrically connected to the gate line GT. In some examples, part of the gate line GT is also used as the gate of the thin film transistor T. The source and the drain are located in the source-drain metal layer 114 (as shown in FIG. 1), and the channel is located in the active layer 113 (as shown in FIG. 1).

Referring to FIG. 2A, a gate line GT is electrically connected to the gates of the thin film transistors T in a row of sub-pixels S0, and a data line DT is electrically connected to the sources of the thin film transistors T in a column of sub-pixels S0, and the drain of the thin film transistor T is electrically connected to the pixel electrode 115.

The common electrode 116 (as shown in FIG. 1) is electrically connected to a common voltage line, thereby receiving a common voltage from the common voltage line.

In a case where the thin film transistor T is turned on under control of a gate driving signal on the gate line GT connected to the gate of the thin film transistor T, a data voltage from the data line DT is transmitted to the pixel electrode 115 through the thin film transistor T. An electric field may be created between the pixel electrode 115 and the common electrode 116. In a case where the data voltages respectively transmitted to the pixel electrodes 115 are different, the electric fields created between the pixel electrodes 115 and the common electrode 116 are different. Due to the characteristics of dielectric anisotropy of liquid crystals, the liquid crystal molecules located in the sub-pixel region rotate (that is, the arrangement direction of the liquid crystal molecules changes), causing the refractive index or light transmittance of the liquid crystal to change accordingly, thereby controlling the amount of light emitted from the sub-pixel region to control the luminance of the sub-pixel S0.

In some embodiments, a shape of an outer contour of the display area AA includes an arc. For example, the display area AA is in a shape of a rounded rectangle; the rounded rectangle may be understood to mean that at least one vertex corner of the rectangle is a rounded corner. In some examples, referring to FIG. 2B, the display area AA may be in a shape of a circle. In some other examples, the display area AA may be in a shape of an ellipse.

Some structures in the display area AA of the display panel 100 are described above, and some structures in the peripheral area BB will be described below.

Figure 3:
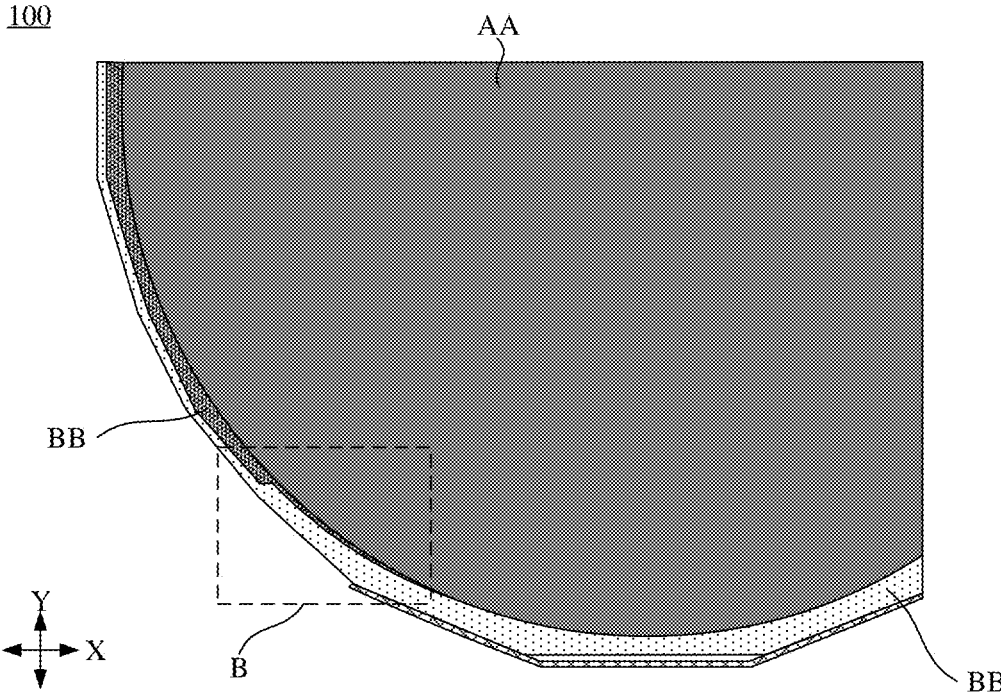
FIG. 3 is a structural diagram of a display panel, in accordance with some embodiments.
Figure 4:
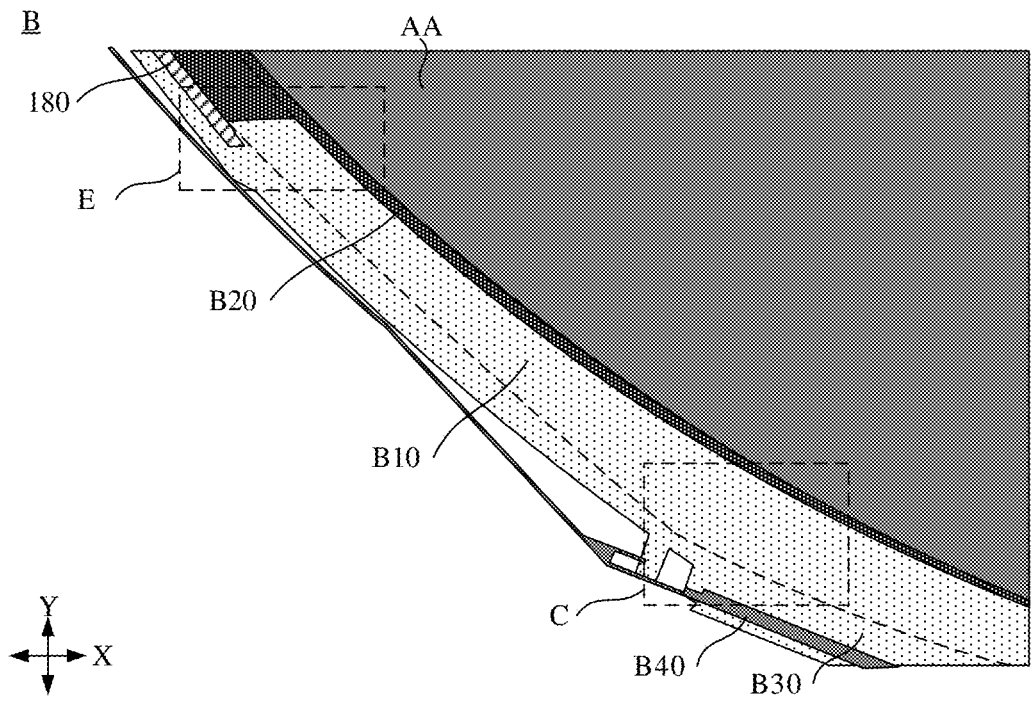
FIG. 4 is a partial enlarged view of the region B in FIG. 3.

FIG. 3 is a structural diagram of the display panel 100, in accordance with some embodiments. FIG. 4 is a partial enlarged view of the region B in FIG. 3.

Referring to FIGS. 3 and 4, the peripheral area BB includes a first signal line arrangement region B10 and a second signal line arrangement region B20 that are all arranged around the display area AA. The first signal line arrangement region B10 and the second signal line arrangement region B20 are both in a shape of a narrow strip, and include borders that are close to and non-overlapping with each other, and the borders extend in a same direction. It will be noted that the borders of the first signal line arrangement region B10 and the second signal line arrangement region B20 extend in the same direction, which means that the borders of the first signal line arrangement region B10 and the second signal line arrangement region B20 are conformal on a side close to each other.

In an embodiment, in the first signal line arrangement region B10 and the second signal line arrangement region B20, the border of one that is close to the display area AA and the outer contour of the display area AA are conformal, and the borders of the first signal line arrangement region B10 and the second signal line arrangement region B20 that are close to each other are conformal.

In some examples, a part of the first signal line arrangement region B10 is located on a side of a part of the second signal line arrangement region B20 away from the display area AA.

In some other examples, a part of the second signal line arrangement region B20 is located on a side of a part of the first signal line arrangement region B10 away from the display area AA.

The first signal line arrangement region B10 and the second signal line arrangement region B20 are both in a shape of a narrow strip, and include borders that are close to and non-overlapping with each other (with reference to Border 2 and Border 3 in FIG. 7), which may be understood as that part of the border of the first signal line arrangement region B10 and part of the border of the second signal line arrangement region B20 are close to and non-overlapping with each other.

Figure 5A:
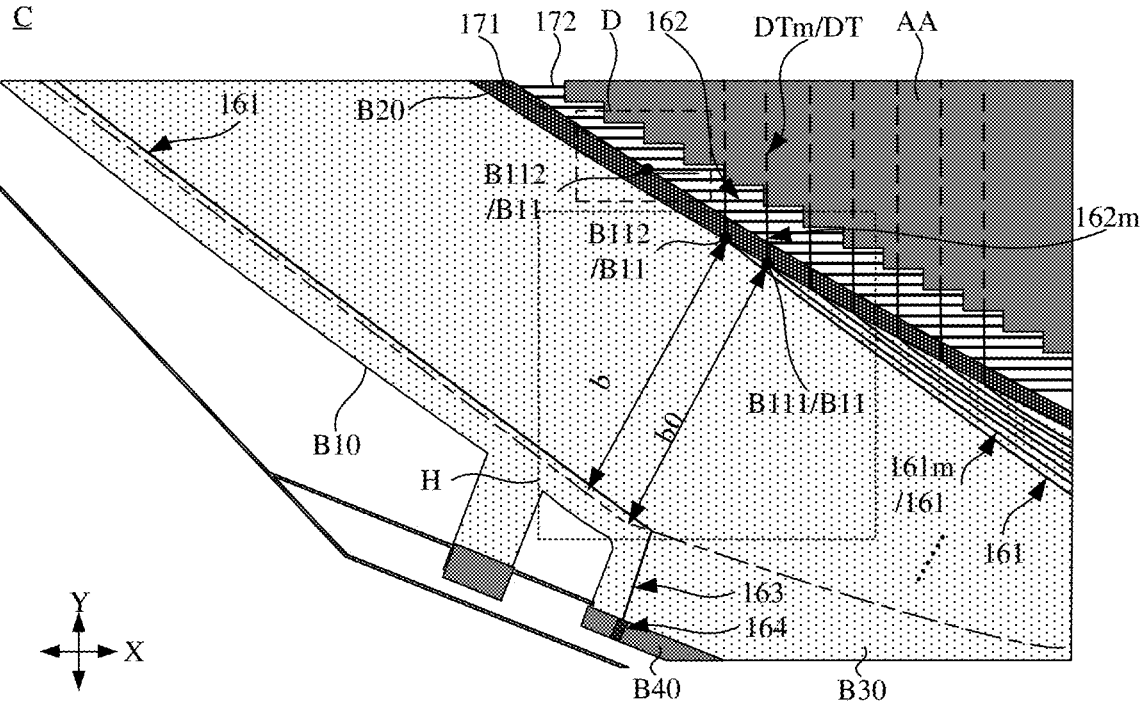
FIG. 5A is a partial enlarged view of the region C in FIG. 4.

FIG. 5A is a partial enlarged view of the region C in FIG. 4.

Referring to FIG. 5A, the first signal line arrangement region B10 includes a plurality of first signal lines 161 extending in a same direction; the border of the first signal line arrangement region B10 that is proximate to the display area AA includes a plurality of first lead-out positions B11, and a plurality of first lead-out lines 162 are led out from the plurality of first lead-out positions B11 in one-to-one correspondence and are electrically connected to the plurality of first signal lines 161 in one-to-one correspondence. The first lead-out line 162 is electrically connected to the data line DT; the plurality of first lead-out positions B11 include a single first reference lead-out position B111, a first reference lead-out line 162m is led out from the first reference lead-out position B111 and is electrically connected to a first reference data line DTm. In FIG. 5A, for the convenience of illustrating the first signal lines 161, only part of the first signal lines 161 is shown, and the remaining part of the first signal lines 161 is omitted, and " . . . " indicates the omitted first signal line 161. The extension direction, arrangement, lead-out positions and other characteristic rules of the first signal lines 161 represented by " . . . " are consistent with the characteristic rules of the first signal lines 161 shown in the figure.

The plurality of first signal lines 161 extending in the same direction may be understood as the plurality of first signal lines 161 extending conformally to one another. For example, the first signal lines 161 have the same width, and a distance between every two first signal lines 161 is the same.

In addition, the peripheral area BB may also be provided with a third signal line arrangement region B30 and a data line bonding region B40 therein. The third signal line arrangement region B30 is dispose on a side of the first signal line arrangement region B10 away from the display area AA, and the data line bonding region B40 is located on a side of the third signal line arrangement region B30 away from the display area AA. The third signal line arrangement region B30 is provided with a plurality of first lead-in lines 163 therein, and the data line bonding region B40 is provided with a plurality of data line bonding pins 164 therein. The plurality of first lead-in lines 163 may be set to be electrically connected to the plurality of first signal lines 161 in one-one correspondence, and the plurality of first lead-in lines 163 may be set to be electrically connected to the plurality of data line bonding pins 164 in one-one correspondence.

In some embodiments, at a connection position of the first lead-in line 163 and the first signal line 161, the extension direction of the first lead-in line 163 is different from that of the first signal line 161; at a connection position of the first signal line 161 and the first lead-out line 162, the extension direction of the first signal line 161 is different from that of the first lead-out line 162. That is, the first lead-in line 163 and the first signal line 161 may have an obvious boundary (e.g., a bend) therebetween, and the first signal line 161 and the first lead-out line 162 may have an obvious boundary (e.g., a bend) therebetween. It will be understood that the obvious boundary is only an obvious boundary in geometric shape, and does not necessarily mean that different line segments are formed through different processes; that is, at least two of the first lead-in line 163, the first signal line 161, and the first lead-out line 162 may be formed in a single process. In some examples, the first lead-in line 163 may include one or more line segments. For example, the first lead-in line 163 includes two line segments.

It will be understood that, the description that the first reference signal line 161$m$ is led out from the first reference lead-out position B111 may be understood that the first reference signal line 161$m$ is led out at the first reference lead-out position B111 through a first reference lead-out line 162$m$.

In an embodiment, a first signal line 161 is electrically connected to a data line DT through a first lead-out line 162, and the other end of the first signal line 161 is connected to a first lead-in line 163, and an end of the first lead-in line 163 away from the first signal line 161 is electrically connected to a data line bonding pin 164. The data line bonding pin 164 is electrically connected to a source driver chip, and the source driver chip may transmit a data signal to the data line DT through the first lead-in line 163, the first signal line 161 and the first lead-out line 162 in sequence.

In some examples, the plurality of data line bonding pins 164 may be divided into a plurality of groups, and one group of data line bonding pins 164 may be electrically connected to one source driver chip.

For example, the first lead-in lines 163, the first signal lines 161 and the first lead-out lines 162 are provided in the gate metal layer 112 (as shown in FIG. 1); that is, the first lead-in lines 163, the first signal lines 161 and the first lead-out lines 162 are provided in a same layer as the gate lines GT.

A width of the first signal line arrangement region B10 corresponding to the first reference lead-out position B111 is b0; among first target lead-out positions B112 that are at least partially continuously distributed except for the first reference lead-out position B111, a width b of the first signal line arrangement region B10 corresponding to each first target lead-out position B112 satisfies:

$$b0-[\text{int}(k\Delta1/P1)](W_{data}+S_{data})\leq b\leq b0-[\text{int}(k\Delta1/P1)-1](W_{data}+S_{data}).$$

It will be noted that, a width of the first signal line arrangement region B10 corresponding to a region between the first target lead-out position B112 and the first reference lead-out position B111 except for the first target lead-out position B112 may also be designed to satisfy the above formula.

$\Delta1$ is a distance between the first target lead-out position B112 and the first reference lead-out position B111 in the first direction X, P1 is an arrangement period of a pixel S in the first direction X, k is the number of the sub-pixel S0 in the pixel S, $W_{data}$ is a width of the first signal line 161, and $S_{data}$ is a distance between adjacent first signal lines 161. In the first signal line arrangement region B10 corresponding to a region from the first reference lead-out position B111 to the first target lead-out positions B112 that are at least partially continuously distributed except for the first reference lead-out position B111, the first signal lines 161 have the same width, and the distance between the first signal lines 161 is the same.

int is a function rounding down.

It will be noted that the first reference lead-out position B111 is one of the plurality of first lead-out positions B11, and its position may not be clearly defined; in some embodiments, the first reference lead-out position B111 may be set to be a first lead-out position B11 closest to the position of the line arrangement region B10 having the maximum width.

The width b0 of the first signal line arrangement region B10 corresponding to the first reference lead-out position B111 may be defined as a dimension, in a direction perpendicular to the extension direction of the first reference signal line 161$m$, of the first signal line arrangement region B10 at the first reference lead-out position B111. At the first reference lead-out position B111, the width b0 of the first signal line arrangement region B10 includes the width of the first reference signal line 161$m$.

Among the first target lead-out positions B112 at least partially continuously distributed except for the first reference lead-out position B111, the width b of the first signal line arrangement region B10 corresponding to each first target lead-out position B112 may be defined as a dimension, in a direction perpendicular to the extension direction of the first signal line 161 closest to the display area AA at the first target lead-out position B112, of the first signal line arrangement region B10 at the first target lead-out position B112. At each first target lead-out position B112, the width b of the first signal line arrangement region B10 may include the width of the first signal line 161 led out from the first target lead-out position B112.

The width b0 of the first signal line arrangement region B10 at the first reference lead-out position B111 and the width b of the first signal line arrangement region B10 at the first target lead-out position B112 will be described below.

Figure 5B:
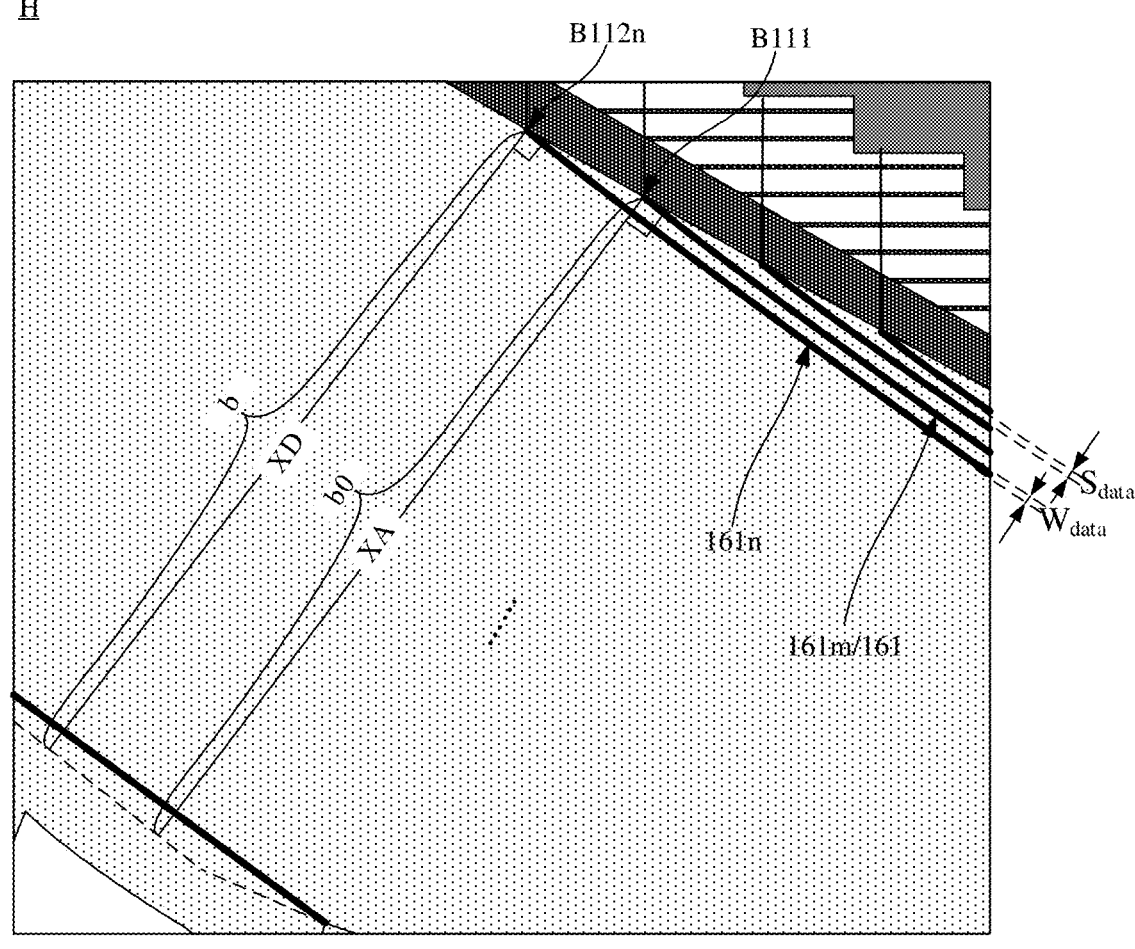
FIG. 5B is a partial enlarged view of the region H in FIG. 5A.

FIG. 5B is a partial enlarged view of the region H in FIG. 5A. In FIG. 5B, for the convenience of illustrating the first signal line 161, only part of the first signal lines 161 is shown, and the remaining part of the first signal lines 161 is omitted, where " . . . " indicates the omitted first signal lines 161. The extension direction, arrangement, lead-out positions and other characteristic rules of the first signal lines 161 represented by " . . . " are consistent with the characteristic rules of the first signal lines 161 shown in the figure.

Referring to FIG. 5B, a first reference line segment XA perpendicular to the first reference signal line $161m$ is made passing through the first reference lead-out position B111, an endpoint of the first reference line segment XA intersects the first reference lead-out position B111, and the other endpoint intersects the border of the first signal line arrangement region B10 away from the display area AA. A length of the first reference line segment XA is the width b0 of the first signal line arrangement region B10 at the first reference lead-out position B111.

Referring to FIG. 5B, at the first target lead-out position B112$n$, the first signal line 161 closest to the display area AA is represented by 161$n$. A reference line segment XD perpendicular to the first signal line 161$n$ is made passing through the first target lead-out position B112$n$, an endpoint of the reference line segment XD intersects the first target lead-out position B112$n$, and the other endpoint intersects the border of the first signal line arrangement region B10 away from the display area AA; the length of the reference line segment XD is the width b of the first signal line arrangement region B10 corresponding to the first target lead-out position B112$n$. It will be noted that the width of the first signal line arrangement region B10 corresponding to the first target lead-out position B112$n$ includes the width of the first signal line 161$n$ closest to the display area AA at the first target lead-out position B112.

Since the plurality of first signal lines are arranged in parallel and extend in the same direction in the first signal line arrangement region B10, the width of the first signal line arrangement region B10 corresponding to each first lead-out position B11 is related to the number and arrangement period of the multiple first signal lines passed by the reference line segment XD corresponding to the first lead-out position B11; the arrangement period of the multiple first signal lines 161 is equal to a sum of the width of the first signal line 161 and the distance between two adjacent first signal lines 161. Therefore, the position of the first signal line arrangement region B10 with the maximum width is the position where the corresponding reference line segment passes through the greatest number of first signal lines. The width of the first signal line arrangement region B10 at other positions is related to the number of first signal lines passed by the reference line segment XD corresponding to the position.

In an embodiment, the first reference lead-out position B111 is set to be the first lead-out position B11 closest to the position of the first signal line arrangement region B10 with the maximum width, and the width of the first signal line arrangement region B10 gradually decreases on both sides of the position of the first signal line arrangement region B10 with the maximum width.

Figure 5C:
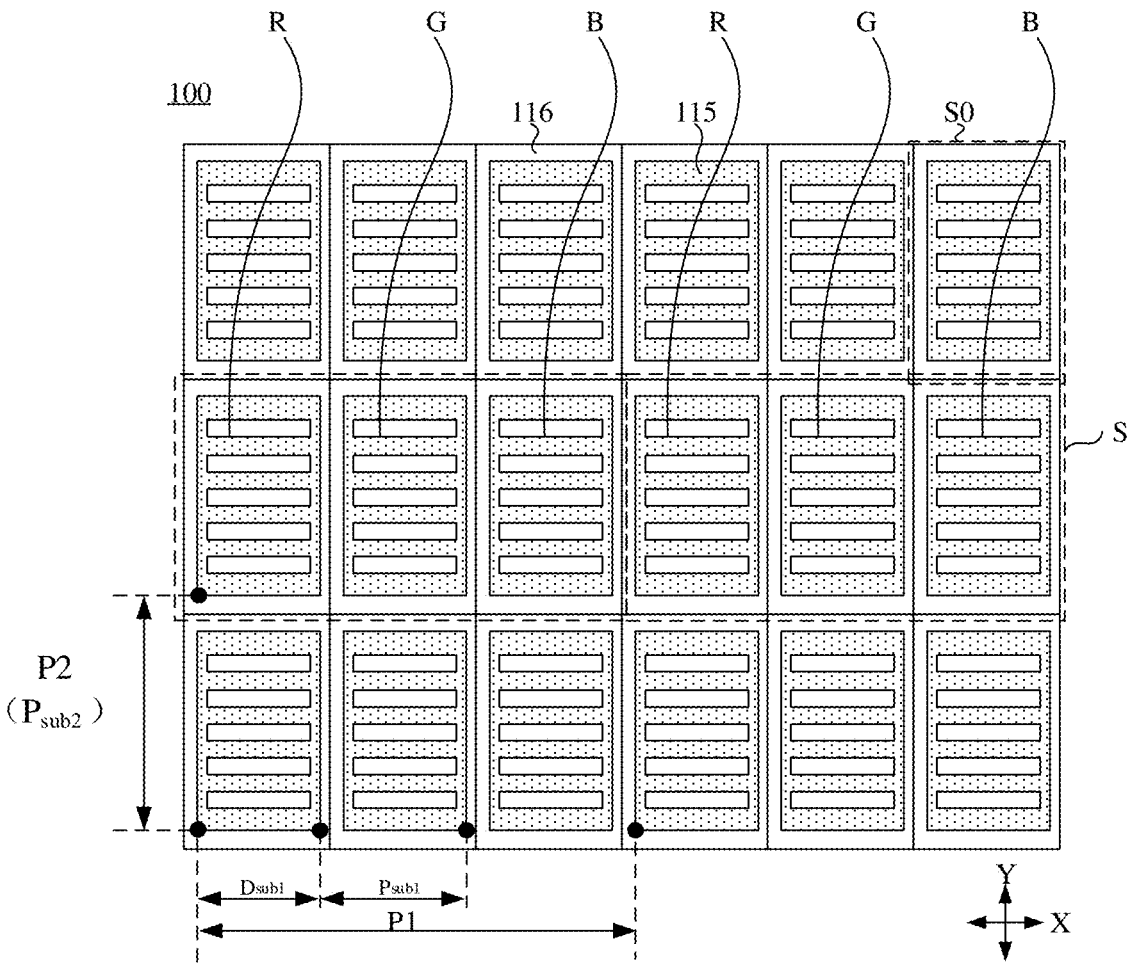
FIG. 5C is a structural diagram of a display panel, in accordance with some embodiments.

FIG. 5C is a structural diagram of the display panel, in accordance with some embodiments.

Referring to FIG. 5C, the arrangement period P1 of the pixel S in the first direction X may be understood as a distance between the same positions of two adjacent pixels S in the first direction X. The same positions of two adjacent pixels S may be understood as the same positions respectively in the two pixels S, for example, may be the center of the pixel S, or the center of the sub-pixel S0 on the left side in the pixel S, or the lower left corner of sub-pixel S0 on the left side of the pixel S, or the lower left corner of the pixel electrode of the sub-pixel S0 on the left in the pixel S.

For the liquid crystal display panel, a width $D_{sub1}$ of a sub-pixel S0 in the first direction X refers to a width of the pixel electrode corresponding to the sub-pixel S0 in the first direction X.

For the display panel (e.g., OLED, QLED or QD-OLED) based on electroluminescence as the display principle, a width $D_{sub1}$ of a sub-pixel S0 in the first direction X may refer to a width of the electroluminescent material corresponding to the sub-pixel S0 in the first direction X.

The width of the pixel S in the first direction X will be described below by considering a liquid crystal display panel as an example.

Referring to FIG. 5C, the sub-pixel S0 includes a pixel electrode 115 and a common electrode 116. The pixel electrode 115 may have a comb-tooth shape, and the common electrode 116 may be continuously arranged in a one-piece whole layer or in one-to-one correspondence with the pixel electrode 115. The common electrode 116 may be located in the same substrate as the pixel electrode 115, or the common electrode 116 and the pixel electrodes 15 may be located in different substrates that are separated by the liquid crystal layer. The pixel S includes three sub-pixels S0, and therefore the pixel S includes three pixel electrodes 115. As shown in FIG. 5C, the arrangement period P1 of the pixel S in the first direction X is defined by using the lower left corner of the pixel electrode 115 of the sub-pixel S0 on the left proximate to the pixel S. The width $D_{sub1}$ of the sub-pixel S0 in the first direction X is defined by using the maximum width of the pixel electrode 115 of the sub-pixel S0 in the first direction X. As shown in FIG. 5O, the pixel S may include a red sub-pixel R, a green sub-pixel G, and a blue sub-pixel B. It will be noted that, the red sub-pixel R, the green sub-pixel G, and the blue sub-pixel B have a different width $D_{sub1}$.

Figure 6:
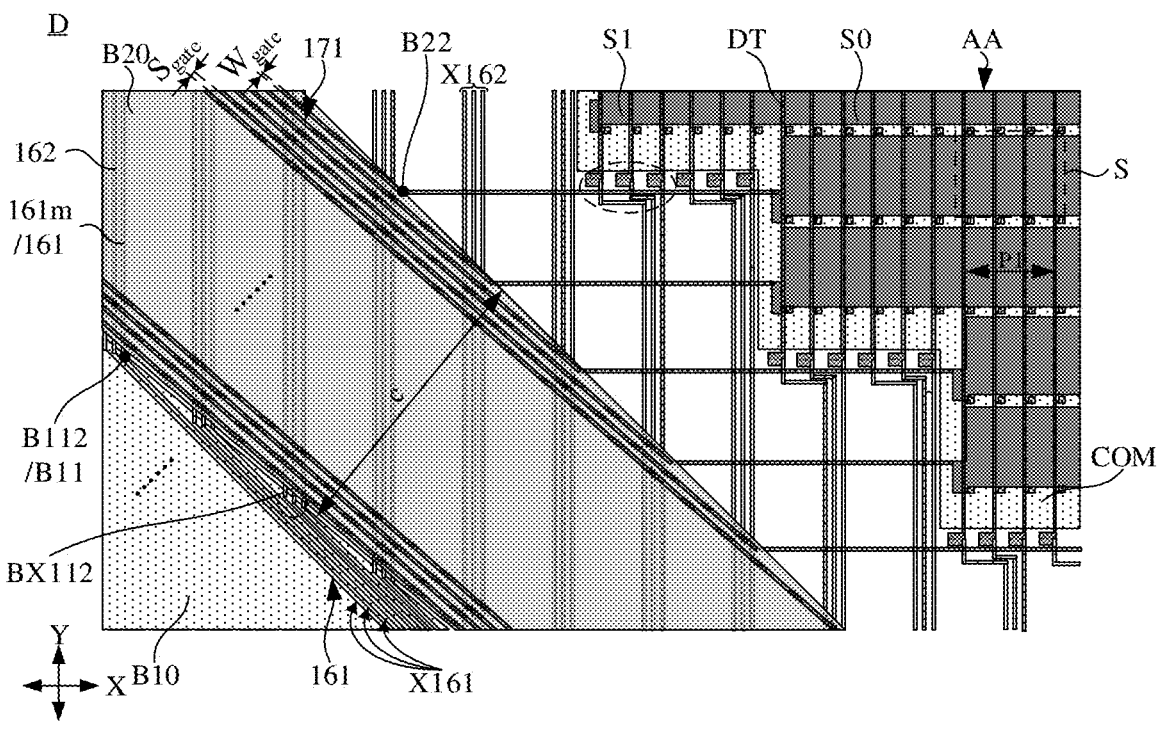
FIG. 6 is a partial enlarged view of the region D in FIG. 5A.

FIG. 6 is a partial enlarged view of the region D in FIG. 5A. In FIGS. 6, 7, 9A, 9B, 10 and 11, for the convenience of illustrating the first signal lines 161, only part of the first signal lines 161 is shown, and the remaining part of the first signal lines 161 is omitted, where " . . . " in the first signal line arrangement region B10 indicates the omitted first signal lines 161. The extension direction, arrangement, lead-out positions and other characteristic rules of the first signal lines 161 represented by " . . . " are consistent with the characteristic rules of the first signal lines 161 shown in the figure. In order to facilitate the illustration of the second signal lines 171, only part of the second signal lines 171 is shown, and the remaining part of the second signal lines 171 is omitted, where the " . . . " in the second signal line arrangement region B20 indicates the omitted second signal lines 171. The extension direction, arrangement, lead-out positions and other characteristic rules of the second signal lines 171 represented by " . . . " are consistent with characteristic rules of the second signal lines 171 shown in the figure. Referring to FIG. 6, the at least partially continuously distributed first target lead-out positions B112 (e.g., N first target lead-out positions B112) may be divided into one or more groups of first target lead-out positions BX112; each group of the first target lead-out positions BX112 may include one or more first target lead-out positions B112, and correspondingly, one or more first lead-out lines 162 may be led out from a group of first target lead-out positions BX112. The one or more first lead-out lines 162 led out from a group of first target lead-out positions BX112 are defined as a group of first lead-out lines X162.

In an embodiment, a group of first target lead-out positions BX112 includes one first target lead-out position B112, that is, each first target lead-out position B112 independently constitutes a group. In this case, the distances between the first target lead-out positions B112 may be equal, or the distances between the first target lead-out positions B112 may have no periodic distribution differences.

In an embodiment, a group of first target lead-out positions BX112 includes multiple first target lead-out positions B112, and the distance between adjacent first target lead-out positions B112 in a group of first target lead-out positions BX112 is obviously less than a distance between a first target lead-out position B112 in the group and a first target lead-out position B112 outside the group. Alternatively, the distance between the first target lead-out positions B112 in each group of first target lead-out positions BX112 is a first distance, the shortest distance between the first target extraction position B112 in the group and the first target extraction position B112 outside the group is a second distance, and the first distance is less than the second distance.

In a case where a group of first target lead-out positions BX112 includes multiple first target lead-out positions B112, the number of first target lead-out positions B112 in a group of first target lead-out positions BX112 may be two, three, four or more, which are not listed here.

Figure 7:
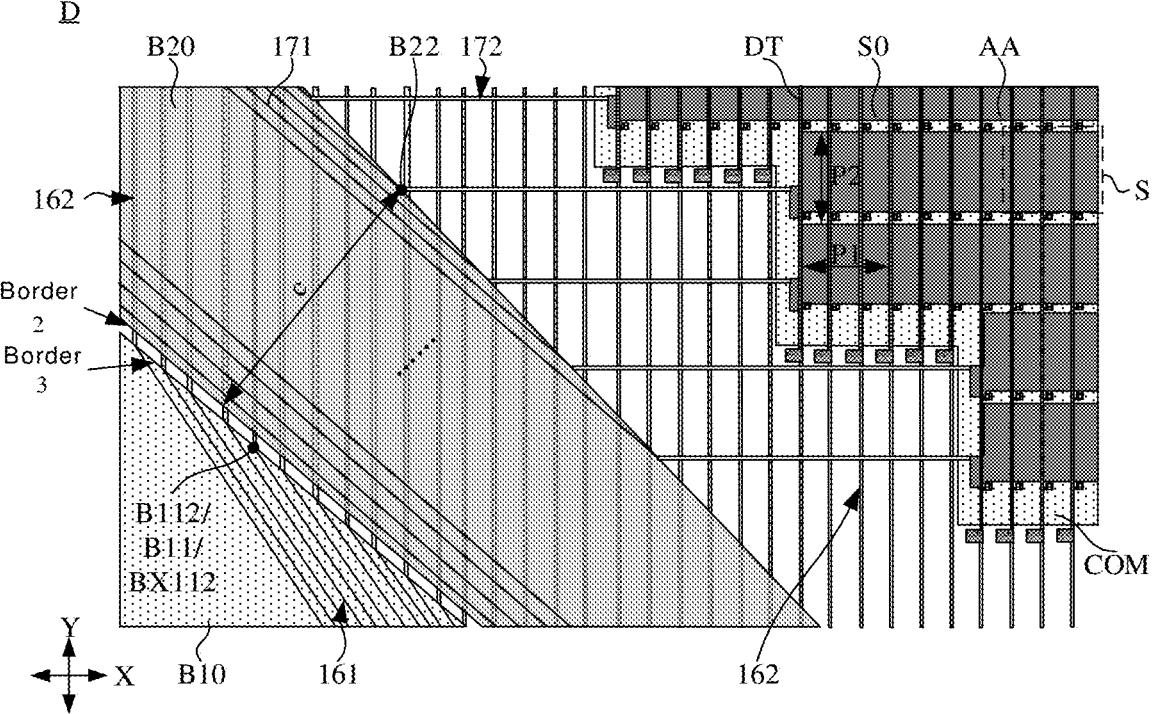
FIG. 7 is another partial enlarged view of the region D in FIG. 5A.

FIG. 7 is another partial enlarged view of the region D in FIG. 5A.

As shown in FIG. 7, in the case where each group of first target lead-out positions BX112 includes only one first target lead-out position B112, the at least partially continuously distributed first target lead-out positions B112 are arranged at equal intervals, and each first lead-out line 162 is led out from a first target lead-out position B112, and the multiple first lead-out lines 162 are arranged at equal intervals. As shown in FIG. 6, in a case where each group of first target lead-out positions BX112 includes three first target lead-out positions B112, the three first target lead-out positions B112 are close to one another, and three first lead-out lines 162 corresponding to the three first target lead-out positions B112 are close to one another. Referring to FIG. 6, in this case, the plurality of first signal lines 161 included in the first signal line arrangement region B10 are arranged at equal intervals and extend in the same direction, and the at least partially continuously distributed first target lead-out positions B112 are not arranged at equal intervals.

Referring to FIG. 6, in some examples, a group of first target lead-out positions BX112 includes multiple first target lead-out positions B112. In this case, a distance between first target lead-out positions B112 that are closest to each other in two adjacent groups of first target lead-out positions BX112 is greater than a distance between two adjacent first target lead-out positions B112 in a group of first target lead-out positions BX112. For example, multiple first lead-out lines 162 led out from a group of first target lead-out positions BX112 may be respectively connected to multiple data lines DT electrically connected to the plurality of sub-pixels S0 in the pixel S. For example, the pixel S includes three sub-pixels, and correspondingly, a group of first target lead-out positions BX112 includes three first target lead-out positions B112. A data line DT is electrically connected to a column of sub-pixels S0.

In an embodiment, k first target lead-out positions B112 are provided in a region covered by an orthographic projection of a width interval of one pixel S in the second direction Y in the first signal line arrangement region B10. In the first direction, with each passing a width interval of the pixel S, k first target lead-out positions B112 are provided in the first signal line layout area B10, and the k first target lead-out positions B112 may belong to a same group of first target lead-out positions BX112. The width interval of the pixel S refers to an interval spanned by an arrangement period P1 of the pixel S in the first direction X. k may be the number of sub-pixels S0 in one pixel S. It will be noted that "passing" is used multiple times in the present disclosure. In the present disclosure, "passing" means that orthographic projections of two structures in a specified direction overlap, or an orthographic projection of a structure in a specified direction is within a specified length interval. For example, the first signal line arrangement region B10 passes through a width interval of a pixel S in the first direction X, which means that a projection of the width interval of the pixel S in the second direction Y covers the first signal line arrangement region B10. For example, the first signal line arrangement region B10 passes through a column of pixels S in the first direction X, which means that an orthographic projection of the column of pixels S in the second direction Y covers the first signal line arrangement region B10.

For example, a pixel includes three sub-pixels, and k is 3. As shown in FIG. 6, a group of first target lead-out positions B112 includes three first target lead-out positions B112; that is, in the at least partially continuously distributed first target lead-out positions B112 (e.g., N first target lead-out positions B112), every three first target lead-out positions B112 are in a group; first target lead-out positions BX112 in a group are close to one another, and the three first target lead-out positions B112 are almost at the same position. That is, in a case where three first signal lines 161 are led out from almost the same position, with each passing a width interval of a pixel S, a group of first signal lines X161 are led out from the first signal line arrangement region B10, i.e., three first signal lines 161 are led out from the first signal line arrangement region B10 through the first lead-out lines 162, so that it is possible to reduce three first signal lines 161 in the first signal line arrangement region B10. On a side of the first reference lead-out position B111, for each reduction of one first signal line 161, the width of the first signal line arrangement region B10 will decrease by $W_{data} + S_{data}$.

For example, with each passing a column of pixels S, a group of first signal lines X161 is led out from the first signal line arrangement region B10, and the number of first signal lines 161 in each group of first signal lines X161 is 3.

$\Delta 1/P1$ represents the number of columns of pixels S passed by the first signal line arrangement region B10 between the first target lead-out position B112 and the first reference lead-out position B111 in the first direction X.

A column of pixels S includes k columns of sub-pixels S0, a column of sub-pixels S0 is electrically connected to a data line DT, and the data lines DT are in one-to-one correspondence with the first signal lines 161. Therefore, at the region between the first target lead-out position B112 and the first reference lead-out position B111, there are $k \cdot \Delta 1/P1$ first signal lines 161 led out from the first signal line arrangement region B10 through the first lead-out lines 162, i.e., $k \cdot \Delta 1/P1$ first lead-out position B11 are provided in the region.

In some examples, in the case where a group of first target lead-out locations BX112 includes multiple first target lead-out positions B112, portions of the multiple first lead-out lines 162 corresponding to the multiple first target lead-out locations B112 may extend in the second direction Y.

Moreover, the first lead-out line 162 and the data line DT electrically connected thereto may not be on the same straight line. For example, as shown in the dotted circle in FIG. 6, at the position where the first lead-out line 162 is connected to the data line DT, the first lead-out line 162 may be bent to achieve connection. It will be understood that, in this case, the first target lead-out position B112 corresponding to the first lead-out line 162 is not on a straight line with the data line DT connected to the first lead-out line 162.

With each leading out a first signal line 161, the width of the first signal line arrangement region B10 will be reduced by $(W_{data}+S_{data})$. Therefore, after $k \cdot \Delta 1/P1$ first signal lines 161 are led out, the width of the first signal line arrangement region B10 will be reduced by $(k\Delta 1/P1) (W_{data}+S_{data})$.

The first signal line arrangement region B10 and the second signal line arrangement region B20 are each in shape of a narrow strip and include borders that are close to and non-overlapping with each other, the borders extend in the same direction. Thus, among the at least partially continuously distributed first target lead-out positions B112 except for the first reference lead-out position B111, in a case where the width b of the first signal line arrangement region B10 corresponding to each first target lead-out position B112 satisfies: $b0-[int(k\Delta 1/P1)](W_{data}+S_{data}) \le b \le b0-[int(k\Delta 1/P1)-1](W_{data}+S_{data})$, it is possible to achieve orderly lead out of the first signal lines 161 while ensuring that the display panel has a narrow bezel, which avoids unnecessary cross-connections between the first signal line 161 and other signal lines, thereby reducing the overlapping capacitance of signal lines and improving the display effect of the display panel. Optionally, the width of the first signal line arrangement region B10 corresponding to the region between the first target lead-out position B112 and the first reference lead-out position B111 is also designed to satisfy the above formula. Thus, it is possible to further standardize the shape of the first signal line arrangement region B10 between the first lead-out positions B11, so as to ensure the orderly extension of the first signal line arrangement region B10 and improve the reliability of the display panel.

In an embodiment, the first target lead-out position(s) B112 may be located in a group of first target lead-out positions BX112, and the number of the first target lead-out positions B112 in the group of first target lead-out positions BX112 may be three. The first lead-out lines 162 corresponding to the three first target lead-out positions B112 are respectively electrically connected to three data lines DT, and the three data lines DT are respectively electrically connected to three sub-pixels S0, and the three sub-pixels are located in the same pixel S.

In an embodiment, the extension direction of at least part of the first signal line arrangement region B10 and the extension direction of at least part of the second signal line arrangement region B20 are each different from both the first direction X and the second direction Y. For example, the first direction X is perpendicular to the second direction Y. That is, the extension direction of at least part of the first signal line arrangement region B10 and the extension direction of at least part of the second signal line arrangement region B20 are each different from the row extension direction of the sub-pixels S0; the extension direction of at least part of the first signal line arrangement region B10 and the extension direction of at least part of the second signal line arrangement region B20 are each different from the column extension direction of the sub-pixels S0. In the embodiments, in a case where the outer contour of the display area AA is not in a shape of a rectangle, it is possible to ensure that a narrower bezel may still be achieved. The outer outline of the display area AA may be in a shape of a quadrangle that is not a rectangle, a pentagon, a hexagon, an octagon, an ellipse, or a circle, or may be an irregular shape. For example, in a case where the outer outline of the display area AA is in a shape of an octagon, the octagon may be shaped as a rectangle with four corners cut off, i.e., four sides of the octagon are parallel to the row extension direction or column extension direction of the sub-pixels S0, the extension direction of at least part of the first signal line arrangement region B10 and the extension direction of at least part of the second signal line arrangement region B20 are parallel to an extension direction of at least one of the other four sides of the octagon. For example, in a case where the outer contour of the display area AA is in a shape of an ellipse, at least part of the first signal line arrangement region B10 or at least part of the second signal line arrangement region B20 extends conformally to the outer contour of the display area AA. In an embodiment, referring to FIGS. 3 and 4, the outer contour of the display area AA includes an arc, and at least part of the first signal line arrangement region B10 and at least part of the second signal line arrangement region B20 may be arranged on a side of the arc-shaped display area AA away from the center of display area AA.

Referring to FIG. 7, in some other examples, in the at least partially continuously distributed first target lead-out positions B112, a group of first target lead-out positions BX112 may include only one first target lead-out position B112. In this case, it may be considered that the first target lead-out positions B112 are not grouped. In this case, with each passing a column of pixels S in the first direction X, k first target lead-out positions B112 are provided in the first signal line arrangement region B10. In the embodiments, with each passing a column of sub-pixels S0, a first target lead-out position B112 is provided in the first signal line arrangement region B10.

For example, among the at least partially continuously distributed first target lead-out positions B112, any two adjacent first target lead-out positions B112 have the same distance in the first direction X.

For example, among the at least partially continuously distributed first target lead-out positions B112, the distance between two adjacent first target lead-out positions B112 in the first direction X is equal to the arrangement period of the sub-pixel S0 in the first direction X. It will be noted that the arrangement period of the sub-pixel S0 in the first direction X may be greater than a width $D_{sub1}$ of a sub-pixel S0 in the first direction X, that is, it is necessary to provide a gap between sub-pixels S0 for a signal line (e.g., a data line DL) to pass through. For example, the sub-pixels S0 have the same arrangement period in the first direction X.

In some examples, in a case where a group of first target lead-out positions BX112 includes a first target lead-out position B112, the first lead-out line 162 may extend in the second direction Y, and the first lead-out line 162 and the data line DT connected thereto are located on a same straight line. For example, the first target lead-out position B112 corresponding to the first lead-out line 162 is also located on the straight line where the data line DT connected to the first lead-out line 162 is located.

The layout in the first signal line arrangement region B10 has been described above, and the layout in the second signal line arrangement region B20 will be described below.

Referring to FIG. 7, the second signal line arrangement region B20 includes a plurality of second signal lines 171 extending in the same direction. The second signal line arrangement region B20 includes a plurality of second lead-out positions B22 near the border of the display area AA. A plurality of second lead-out lines 172 are led out from the plurality of second lead-out positions B22 in one-to-one correspondence, and are electrically connected to the plurality of second signal lines 171 in one-to-one correspondence; the second lead-out lines 172 are electrically connected to the gate lines GT.

The plurality of second signal lines 171 extend in the same direction, which may be understood that the plurality of second signal lines 171 extend conformally to one another. For example, the second signal lines 171 have the same width, and a distance between every two second signal lines 171 is the same.

A second signal line 171 is electrically connected to a gate line GT (as shown in FIG. 2A) through a second lead-out line 172.

Figure 8:
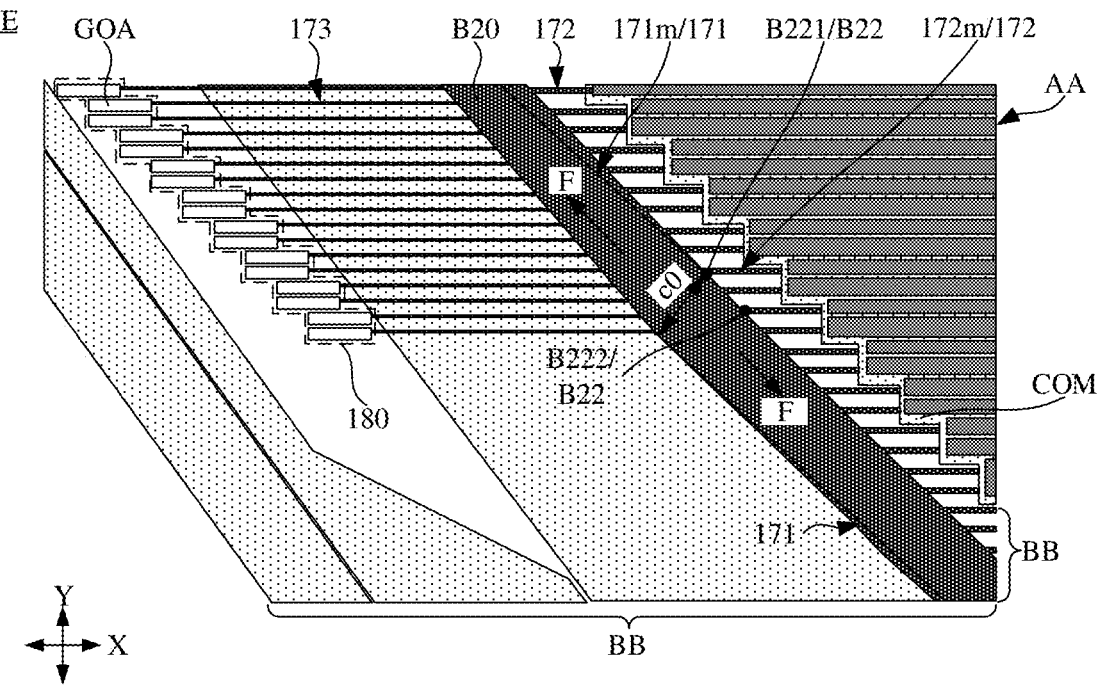
FIG. 8 is a partial enlarged view of the region E in FIG. 4.

FIG. 8 is a partial enlarged view of the region E in FIG. 4.

Referring to FIG. 8, the peripheral area BB is further provided with a plurality of second lead-in lines 173 therein. The plurality of second lead-in lines 173 are located on a side of the second signal line arrangement region B20 away from the display area AA, and the plurality of second lead-in lines 173 are electrically connected to the plurality of second signal lines 171 in one-to-one correspondence.

In some embodiments, at a connection position of the second lead-in line 173 and the second signal line 171, an extension direction of the second lead-in line 173 is different from that of the second signal line 171; at a connection position of the second signal line 171 and the second lead-out line 172, the extension direction of the second signal line 171 is different from that of the second lead-out line 172. That is, the second lead-in line 173 and the second signal line 171 may have an obvious boundary (e.g., a bend) therebetween, and the second signal line 171 and the second lead-out line 172 may have an obvious boundary (e.g., a bend) therebetween. It will be understood that the obvious boundary is only an obvious boundary in geometric shape, and does not necessarily mean that different line segments are formed through different processes; that is, at least two of the second lead-in line 173, the second signal line 171, and the second lead-out line 172 may be formed in a single process. In some examples, the second lead-in line 173 may include one or more line segments. For example, the second lead-in line 173 includes two line segments. In some examples, the second lead-in line 173 may include one or more line segments. For example, the second lead-in line 173 includes two line segments.

In an embodiment, a second signal line 171 is electrically connected to a gate line GT through a second lead-out line 172, and the other end of the second signal line 171 is connected to the second lead-in line 173.

In some examples, an end of the second lead-in line 173 away from the second signal line 171 may be electrically connected to a shift register unit. Thus, the shift register unit may output a gate driving signal to the second lead-in line 173, and the gate driving signal is transmitted to the gate line GT through the second lead-in line 173 and the second lead-out line 172 in sequence.

In some other examples, the peripheral area BB may be provided with a plurality of gate line bonding pins, and the plurality of gate line bonding pins are disposed on a side, away from the second signal line arrangement region B20, of a region where the plurality of second lead-in lines 173 are located. The plurality of gate line bonding pins are used to electrically connected to a gate driver chip; the gate driver chip outputs a gate drive signal, and the gate drive signal is transmitted to the gate line GT through the gate line bonding pin, the second lead-in line 173, the second signal line 171 and the second lead-out line 172. For example, the second lead-in lines 173, the second signal lines 171 and the second lead-out lines 172 are disposed in the source-drain metal layer 114 (as shown in FIG. 1); that is, the second lead-in lines 173, the second signal lines 171 and the second lead-out lines 172 are arranged in a same layer as the data lines DT.

Referring to FIG. 7, at least one first lead-out position B11 and at least one second lead-out position B22 are alternately arranged in the first direction X. It will be noted that, m first lead-out positions B11 and n second lead-out positions B22 are alternately arranged in the first direction X, which may be understood that m first lead-out positions B11 are arranged first, then n second lead-out positions B22 are arranged, and then m first lead-out positions B11 are arranged, and then n second lead-out positions are arranged, and so on. For example, FIG. 7 shows that three first lead-out positions B11 and one second lead-out position B22 are alternately arranged in the first direction X.

In some examples, one first lead-out position B11 and multiple second lead-out positions B22 may be alternately arranged in the first direction X. In this case, multiple second lead-out positions B22 are provided between two adjacent first lead-out positions B11.

In some other examples, multiple first lead-out positions B11 and a second lead-out position B22 may be alternately arranged in the first direction X. In this case, multiple first lead-out positions B11 are provided between two adjacent second lead-out positions B22.

In some other examples, multiple first lead-out positions B11 and multiple second lead-out positions B22 may be alternately arranged in the first direction X.

The first signal lines 161 are arranged in the first signal line arrangement region B10, and the second signal lines 171 are arranged in the second signal line arrangement region B20. Therefore, the first signal lines 161 do not overlap with the second signal lines 171. If two signal lines overlap, a capacitance will be generated between the two signal lines, thereby generating a load. However, the first signal line 161 does not overlap with the second signal line 171, so that the load of the first signal line 161 and the second signal line 171 is small.

Furthermore, in some examples, the film layer where the second signal lines 171 are located is located on a side of the film layer where the first signal lines 161 are located away from the first substrate 111. If the first signal line 161 overlaps with the second signal line 171, then when the second signal line 171 passes the first signal line 161, the second signal line 171 will have a climbing phenomenon, at which time, the second signal line 171 may break due to the segment difference. In addition, an insulating layer is provided between the first signal line 161 and the second signal line 171. Therefore, the insulating layer may have a climbing phenomenon, so that the insulating layer may have a segment difference, causing part of the first signal line 161 to be exposed. When the second signal line 171 is provided, the second signal line 171 and the first signal line 161 will be short-circuited, thereby causing a short-circuit between the second signal line 171 and the first signal line 161. Therefore, in some embodiments of the present disclosure, the first signal line 161 does not overlap with the second signal line 171, it is possible to avoid the phenomenon of the break of the signal line and the short-circuit between the first signal line 161 and the second signal line 171.

In some embodiments, the first direction X is perpendicular to the second direction Y, which facilitates the arrangement of the sub-pixels S0.

In some embodiments, for the at least partially continuously distributed first target lead-out positions B112, a width b1 of the first signal line arrangement region B10 corresponding to the first target lead-out position B112 corresponding to the sub-pixel S0 with the same color as the sub-pixel S0 electrically connected to the first reference data line DTm satisfies: $b1=b0-[int(k\Delta 1/P1)](W_{data}+S_{data})$.

Multiple sub-pixels S0 in a column of sub-pixels S0 have the same color. In this case, $k-1$ sub-pixels S0 are provided at intervals between two adjacent sub-pixels S0 of the same color in the first direction X.

There are $int(k\cdot\Delta 1/P1)$ fewer first signal lines 161 in the first signal line arrangement region B10 corresponding to the first target lead-out position B112 than in the first signal line arrangement region B10 corresponding to the first reference lead-out position B111. Therefore, the width of the first signal line arrangement region B10 at the first target lead-out position B112 is reduced by $[int(k\Delta 1/P1)](W_{data}+S_{data})$ compared to the width of the first signal line arrangement region B10 at the first reference lead-out position B111. Therefore, the width b1 of the first signal line arrangement region B10 corresponding to the first target lead-out position B112 satisfies: $b1=b0-[int(k\Delta 1/P1)](W_{data}+S_{data})$, so as to further ensure that the orderly lead out of the first lead-out lines 162 to reduce the overlapping capacitance of the signal lines.

In some examples, the above formula of $b0-[int(k\Delta 1/P1)](W_{data}+S_{data})\leq b\leq b0-[int(k\Delta 1/P1)-1](W_{data}+S_{data})$ is applicable to a region in the first signal line arrangement region B10 and provided with no a third signal line arrangement region B30 on a side of the region away from the display area AA.

In some examples, the above formula of $b1=b0-[int(k\Delta 1/P1)](W_{data}+S_{data})$ is applicable to a part of the first signal line arrangement region B10 and provided with no a third signal line arrangement region B30 on a side of the part away from the display area AA.

Referring to FIG. 6, in some embodiments, for the at least partially continuously distributed first target lead-out positions B112, there are three continuously distributed first target lead-out positions B112, and the three continuously distributed first target lead-out positions B112 are electrically connected to three sub-pixels S0 of a pixel S in a one-to-one correspondence. An overall width of the three first lead-out lines 162 corresponding to the three continuously distributed first target lead-out positions B112 is less than or equal to the arrangement period $P_{sub1}$ of the sub-pixel S0 in the first direction X.

It will be noted that the overall width of multiple first lead-out lines 162 may be understood as a sum of a sum of the widths of the multiple first lead-out lines 162 and a sum of the widths of the gaps between all adjacent first lead-out lines 162. For example, the overall width of the three first lead lines 162 may be understood as follows: the three first lead-out lines 162 are intercepted in a direction perpendicular to the extension direction of the three first lead-out lines 162 to obtain three interception sections arranged in sequence, i.e., two interception sections located on both sides and one interception section located in the middle of the two interception sections; the two interception sections located on both sides each have an endpoint relative to the three interception sections as a whole, and a distance between the two endpoints is the overall width of the three first lead-out lines 162.

It will be noted that the arrangement period $P_{sub1}$ of the sub-pixel S0 in the first direction X may be understood as a distance between the same positions of two adjacent sub-pixels S0 in a pixel S in the first direction X. The same positions of two adjacent sub-pixels S0 may be understood as the same position of the two sub-pixels S0, for example, the center of the sub-pixel S0, or the lower right corner of the sub-pixel S0 (as shown in FIG. 5C).

The overall width of three first lead-out lines 162 corresponding to three continuously distributed first target lead-out positions B112 is less than or equal to the arrangement period $P_{sub1}$ of a sub-pixel S0 in the first direction X. In this case, the three continuously distributed first target lead-out positions B112 may be a group of first target lead-out positions B112. In addition, the overall width of the three first lead-out lines 162 corresponding to the three continuously distributed first target lead-out positions B112 is less than or equal to the arrangement period $P_{sub1}$ of a sub-pixel S0 in the first direction X. In this way, when performing etching process to form the lead-out lines, the arrangement density of the three first lead-out lines 162 may be as close as possible to the arrangement density of the first signal lines 161 to ensure that the first lead-out lines 162 have a sufficient line width.

The width of the second signal line arrangement region B20 will be described below.

Figure 9A:
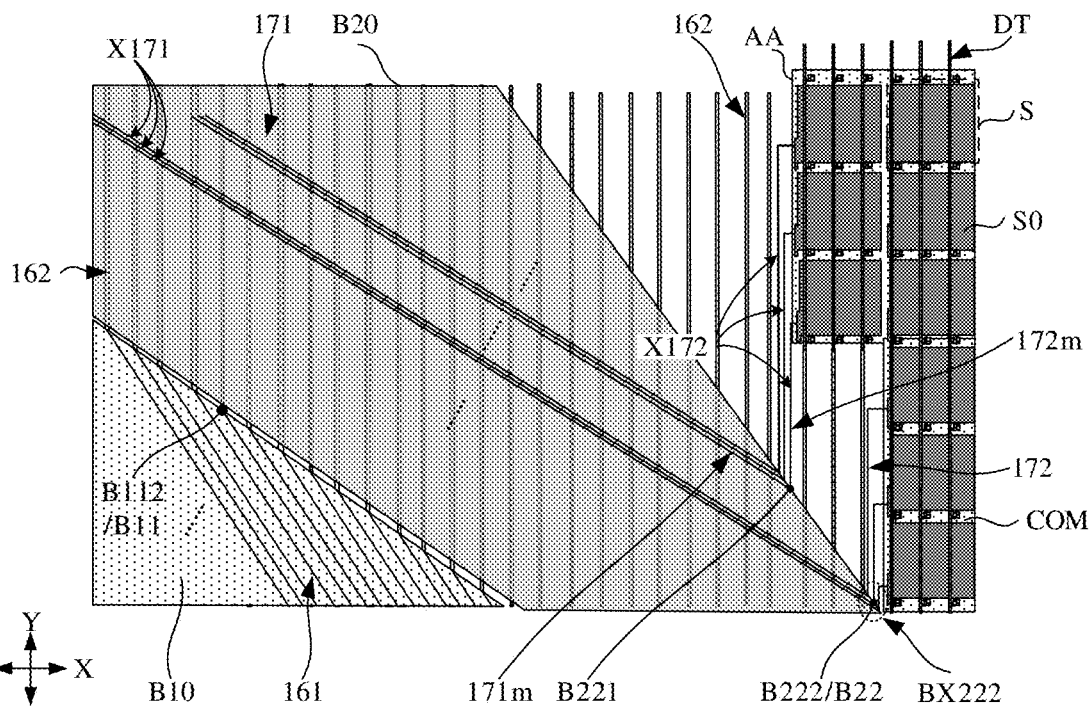
FIG. 9A is a structural diagram of a display panel, in accordance with some embodiments.

FIG. 9A is a structural diagram of the display panel, in accordance with some embodiments.

Referring to FIG. 9A, in some embodiments, the plurality of second lead-out positions B22 include a second reference lead-out position B221, and a second reference lead-out line 172m is led out from the second reference lead-out position B221 and is electrically connected to a second reference gate line (i.e., a reference gate line); a width of the second signal line arrangement region B20 corresponding to the second reference lead-out position B221 is c0 (as shown in FIG. 8); at least partially continuously distributed second target lead-out positions B222 except for the second reference lead-out position B221, a width c of the second signal line arrangement region B20 corresponding to each second target lead-out position B222 satisfies: $c0-[int(k\Delta 2/P1)+1](W_{gate}+S_{gate})\leq c\leq c0-[int(k\Delta 2/P1)-1](W_{gate}+S_{gate})$.

$\Delta 2$ is a distance in the first direction X between the second target lead-out position and the second reference lead-out position B221, $W_{gate}$ is the width of the second signal line 171, and $S_{gate}$ is the distance between adjacent second signal lines 171. In the second signal line arrangement region B20 corresponding to a region from the second reference lead-out position B221 to the second target lead-out positions B222 that are at least partially continuously distributed except for the second reference lead-out position B221, the second signal lines 171 have the same width, and the distance between the second signal lines 171 is the same.

Among the second target lead-out positions B222 at least partially continuously distributed except for the second reference lead-out position B221, the width c of the second signal line arrangement region B20 corresponding to each second target lead-out position B222 may be defined as a dimension, in a direction perpendicular to the extension direction of the second signal line 171 closest to the display area AA at the second target lead-out position B222, of the second signal line arrangement region B20 at the second target lead-out position B222. It will be noted that, at each second target lead-out position B222, the width c of the second signal line arrangement region B20 may include the width of the second signal line 171 led out from the second target lead-out position B222.

It will be noted that the second reference lead-out position B221 is one of the second lead-out positions B22, and its position may not be clearly defined. In some embodiments, the second reference lead-out position B221 is a second lead-out position B22 closest to the position of the second signal line arrangement region B20 with the maximum width; the width of the second signal line arrangement region B20 gradually decreases on both sides of the position of the second signal line arrangement region B20 with the maximum width.

Since the plurality of second signal lines 171 are arranged in parallel and extend in the same direction in the second signal line arrangement region B20, the width of the second signal line arrangement region B20 corresponding to each second lead-out position B22 is relates to the number and the arrangement period of second signal lines 171 included in the second signal line arrangement region B20 at the second lead-out position B22. The arrangement period of the second signal lines 171 is equal to a sum of the widths of the second signal lines 171 and the distance between two adjacent second signal lines 171. Therefore, the position of the second signal line arrangement region B20 with the maximum width is the position where the greatest number of the included second signal lines 171.

It will be noted that the at least partially continuously distributed second target lead-out positions B222 may include one or more groups of second target lead-out positions BX222. Each group of second target lead-out positions BX222 may include one or more second target lead-out positions B222. Correspondingly, there may be one or more second signal lines 171 each led out from a group of second target lead-out positions BX222 through the second lead-out line 172. The one or more second lead-out lines 172 led out from a group of second target lead-out positions BX222 are defined as a group of second lead-out lines X172.

It will be noted that the understanding of "group" of one or more groups of second target lead-out positions BX222 is the same as the understanding of "group" of the aforementioned "one or more groups of first target lead-out positions BX112", and will not be repeated here.

In a case where a group of second target lead-out positions BX222 includes multiple second target lead-out positions B112, the number of second target lead-out positions B222 in a group of second target lead-out positions BX222 may be two, three, four or more, which are not listed here.

Figure 9B:
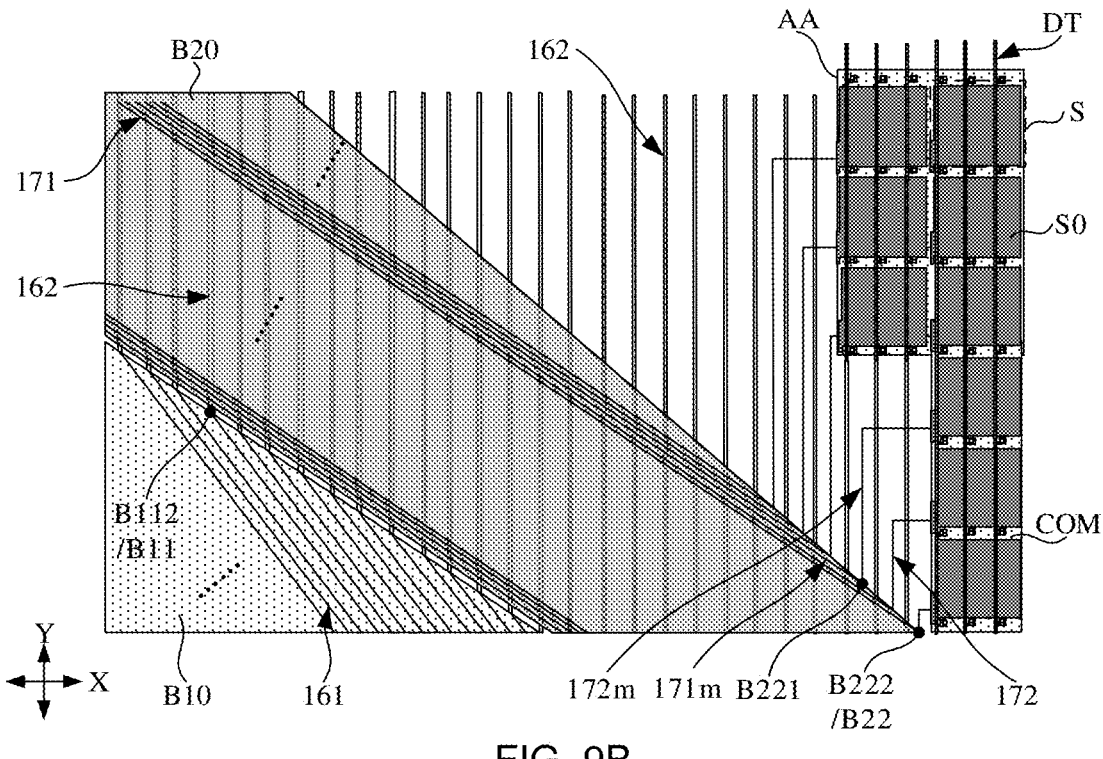
FIG. 9B is a structural diagram of a display panel, in accordance with some embodiments.

FIG. 9B is a structural diagram of the display panel, in accordance with some embodiments.

In some examples, as shown in FIG. 9B, in the case where each group of second target lead-out positions BX222 includes only one second target lead-out position B222; in this case, it may be considered that each second target lead-out position BX222 independently constitutes a group. In this case, the at least partially continuously distributed second target lead-out positions B222 may be arranged at equal intervals, that is, the distances between the second target lead-out positions B222 may be equal. In this case, each second lead-out line 172 may be led out from a second lead-out position B22, and the plurality of second lead-out lines 172 are arranged at equal intervals. In some other examples, as shown in FIG. 9A, in the case where each group of second target lead-out positions BX222 includes multiple second target lead-out positions B222, the multiple second target lead-out positions B222 are close to one another, and multiple second lead-out lines 172 corresponding to the multiple second target lead-out positions B222 are close to one another. Referring to FIG. 9A, in this case, the plurality of second signal lines 171 included in the second signal line arrangement region B20 are arranged at equal intervals and extend in the same direction, and the at least partially continuously distributed second target lead-out positions B222 are not arranged at equal intervals.

Referring to FIG. 9A, in some examples, a group of second target lead-out positions BX222 includes multiple second target lead-out positions B222. In this case, a distance between second target lead-out positions B222 that are closest to each other in two adjacent groups of second target lead-out positions BX222 is greater than a distance between two adjacent second target lead-out positions B222 in a group of second target lead-out positions BX222. For example, multiple second lead-out lines 172 led out from a group of second target lead-out positions BX222 are respectively connected to multiple gate lines GT, and a gate line GT is electrically connected to a row of sub-pixels S0.

In some embodiments, a direction in which the second lead-out line 172 is led out from the second lead-out position B22 is the same or substantially the same as the direction in which the first lead-out line 162 is led out from the first lead-out position B11. In a case where the deviation in direction is within 5°, it may be understood that the directions are substantially the same. The direction in which the second lead-out line 172 is led out from the second lead-out position B22 is the same or substantially the same as the direction in which the first lead-out line 162 is led out from the first lead-out position B11, which may minimize the overlap of the first lead-out line 162 and the second lead-out line 172, so as to reduce the overlapping capacitance.

In some embodiments, the direction in which the second lead-out line 172 is led out from the second target lead-out position B222 is perpendicular or substantially perpendicular to the extension direction of the gate line. In a case where an included angle between the direction in which the second lead-out line 172 is led out from the second target lead-out position B222 and the gate line GT is in a range of 85° to 95°, inclusive, which may be understood that the directions are substantially perpendicular to each other.

In some embodiments, the second lead-out line 172 and the gate line GT may be directly connected or may be indirectly electrically connected through other signal lead lines.

For example, the second lead-out line 172 may be led out from the second target lead-out position B222 and then electrically connected to the gate line GT by a manner of bending and/or lapping. For example, the second lead-out line 172 may be led out from the second target lead-out position B222 and then extend in a straight line until it reaches a side of the corresponding gate line GT, and then be electrically connected to the gate line GT by the manner of bending and/or lapping. For example, the second lead-out line 172 may be connected to the gate line GT through a via hole.

For example, an auxiliary lead line is also provided between the second lead-out line 172 and the gate line GT, an end of the auxiliary lead line is electrically connected to the second lead-out line 172, and the other end of the auxiliary lead line is electrically connected to the gate line GT. The auxiliary lead line is connected to the gate line GT through a via hole. The auxiliary lead line may be arranged to extend between two adjacent columns of sub-pixels S0. An auxiliary lead line may be configured to cross one or more gate lines GT to be electrically connected to a gate line GT. The auxiliary lead line crosses the gate line GT, and is insulated from the gate line GT. The electrical connection between the auxiliary lead line and the crossed gate line GT may be achieved through a via hole passing through the insulating layer. The electrical connection between the auxiliary lead line and the second lead-out line 172 may be realized through a via hole passing through the insulating layer, or the electrical connection may be a direct electrical connection. The direct electrical connection between the auxiliary lead line and the second lead-out line 172 may be understood that the auxiliary lead line and the second lead-out line 172 extend continuously and may be divided in regions in the array substrate; for example, the second lead line 172 located between two adjacent columns of pixels S (or two adjacent columns of sub-pixels S0) is defined as an auxiliary lead line. The auxiliary lead line may be a continuously extending lead line, or may include multiple segments of lead lines, and the multiple segments of lead lines are electrically connected end to end. The auxiliary lead line may be arranged to extend between two adjacent columns of pixels S. In an embodiment, multiple auxiliary lead lines are respectively connected to multiple second lead-out lines 172 in a one-to-one correspondence, and the multiple auxiliary lead lines are jointly arranged to extend between two adjacent columns of sub-pixels S0. In an embodiment, multiple auxiliary lead lines are connected to multiple second lead-out lines 172 in a one-to-one correspondence, and the plurality of auxiliary leads are jointly arranged to extend between two adjacent columns of pixels S. In an embodiment, multiple auxiliary lead lines are jointly arranged to extend between two adjacent columns of pixels S (or between two adjacent columns of sub-pixels S0), and the multiple second lead-out lines 172 electrically connected to the multiple auxiliary lead lines in a one-to-one correspondence constitute a group of second lead-out lines X172. In a case where the multiple auxiliary lead lines electrically connected to a group of second lead-out lines X172 in a one-to-one correspondence are jointly arranged to extend between two adjacent columns of pixels S, the group of second lead-out lines X172 is led out between the two adjacent columns of pixels S; for example, a straight line where a central extension line of the entire group of second lead-out lines X172 passes between the two adjacent columns of pixels S; the second target lead-out positions B222 in a group of the second target lead-out positions BX222 are electrically connected to the second lead-out lines 172 in a group of second lead-out lines X172 in a one-to-one correspondence; the straight line where the central extension line of the entire group of second lead-out lines X172 passes a center of the entire group of second target lead-out positions BX222 corresponding to the group of second lead-out lines X172; with such design, it is possible to avoid signal line redundancy and unnecessary overlap.

For example, in at least part of the second signal line arrangement region B20, m second lead-out positions B22 are provided in a region covered by an orthographic projection of a width interval of a pixel S in the second direction Y. Specifically, in the first direction X, with each passing a width interval of a pixel S, m second target lead-out positions B222 are provided in the second signal line arrangement region B20, and the m second target lead-out positions B222 may belong to a same group of second target lead-out positions BX222. The width interval of the pixel S refers to an interval spanned by an arrangement period P1 of the pixel S in the first direction X. It will be noted that "passing" is used multiple times in the embodiments of the present disclosure. In the present disclosure, "passing" means that orthographic projections of two structures in a specified direction overlap, or an orthographic projection of a structure in a specified direction is within a specified length interval. For example, the second signal line arrangement region B20 passes through the width interval of a pixel S, which means that the width interval of a pixel S covers the projection of the second signal line arrangement region B20 in the second direction Y. For example, the second signal line arrangement region B20 passes through a column of pixels S in the first direction X, which means that an orthographic projection of the column of pixels S in the second direction Y covers the second signal line arrangement region B20. m may be a positive integer.

As shown in FIG. 9A, for the continuously distributed second target lead-out positions B222, every three second target lead-out positions B222 are a group, and with each passing the width interval of a pixel S, a group of second signal lines X171 is led out from the second signal line arrangement region B20 through a group of second lead-out lines X172. Each reduction of a second signal line 171, the width of the second signal line arrangement region B20 will be reduced by $W_{gate}+S_{gate}$.

$\Delta2/P1$ represents the number of width intervals of pixels S passed by the second signal line arrangement region B20 between the second target lead-out position B222 and the second reference lead-out position B221 in the first direction X.

In some examples, in the case where a group of second target lead-out positions BX222 includes multiple second target lead-out positions B222, portions of multiple second lead-out lines 172 corresponding to the multiple second target lead-out positions B222 may extend in the second direction Y. Each gate line GT is connected to a row of sub-pixels S0. Thus, the gate line GT extends in the first direction X. Therefore, the second lead-out line 172 and the gate line GT are not on a same straight line. For example, as shown in FIG. 9A, the second lead-out line 172 needs to be bent at part of the position to be connected to the gate line GT.

With each lead out of a second signal line 171, the width of the second signal line arrangement region B20 will be reduced by $W_{gate}+S_{gate}$. Therefore, after $k\cdot\Delta2/P1$ second signal lines 171 are led out, the width of the second signal line arrangement region B20 will be reduced by $k(\Delta2/P1)$ $(W_{gate}+S_{gate})$.

The first signal line arrangement region B10 and the second signal line arrangement region B20 are each in shape of a narrow strip and include borders that are close to and non-overlapping with each other, the borders extend in the same direction. Thus, among the at least partially continuously distributed second target lead-out positions B222 except for the second reference lead-out position B221, in a case where the width c of the second signal line arrangement region B20 corresponding to each second target lead-out position B222 satisfies: $c0-[int(k\Delta2/P1)](W_{data}+S_{data}) \leq c \leq c0-[int(k\Delta2/P1)-1](W_{data}+S_{data})$, it is possible to achieve orderly lead out of the second signal lines 171 while ensuring that the display panel has a narrow bezel, which avoids unnecessary cross-connections between the second signal line 171 and other signal lines, thereby reducing the overlapping capacitance of signal lines and improving the display effect of the display panel. Optionally, the width of the second signal line arrangement region B20 corresponding to the region between the second target lead-out position B222 and the second reference lead-out position B221 is also designed to satisfy the above formula. Thus, it is possible to further standardize the shape of the second signal line arrangement region B20 between the second lead-out positions B22, so as to ensure the orderly extension of the second signal line arrangement region B20 and improve the reliability of the display panel.

Referring to FIG. 9B, in some other examples, among the at least partially continuously distributed second target lead-out positions B222, a group of second target lead-out positions BX222 may include only one second target lead-out position B222, that is, it may be considered that the second target lead-out positions B222 are not grouped; the second target lead-out positions B222 may be evenly arranged. In this case, with each passing a width interval of pixels S, k second target lead-out positions B222 are provided in the second signal line arrangement region B20.

For example, among the at least partially continuously distributed second target lead-out positions B222, the distance in the first direction X between any two adjacent second target lead-out positions B222 is equal.

For example, among the at least partially continuously distributed second target lead-out positions B222, the distance between two adjacent second target lead-out positions B222 in the first direction X is equal to the arrangement period $P_{sub1}$ of the sub-pixel S0 in the first direction X.

Figure 10:
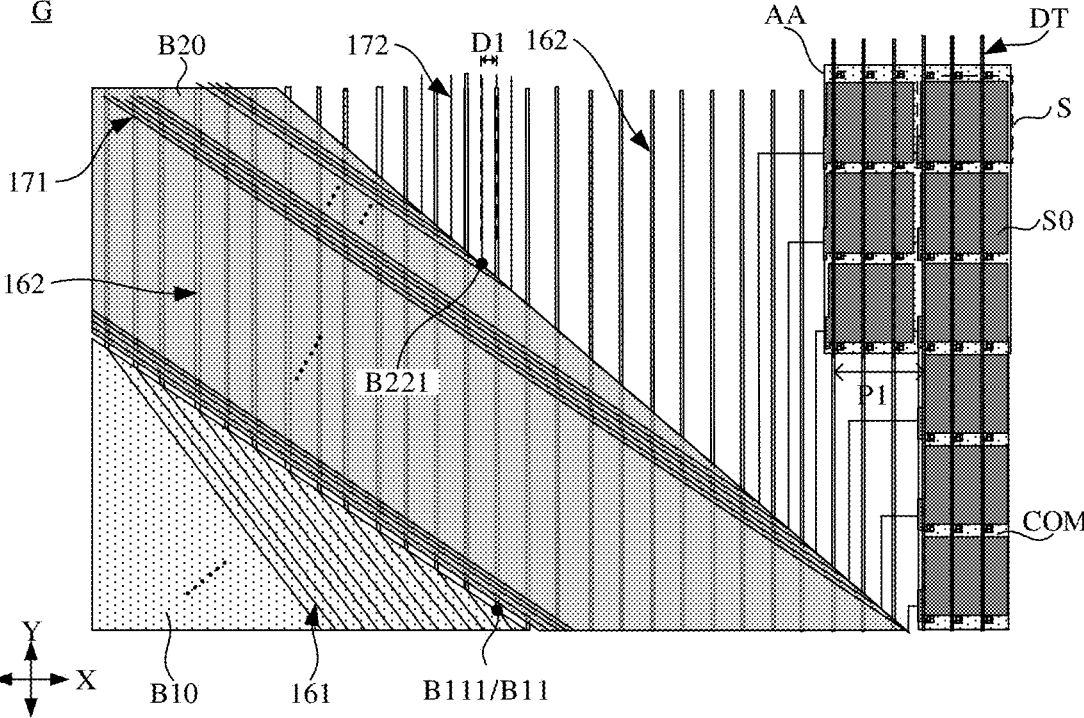
FIG. 10 is a structural diagram of a display panel, in accordance with some embodiments.

FIG. 10 is a structural diagram of the display panel, in accordance with some embodiments.

In some embodiments, as shown in FIG. 10, a distance D1 between the first reference lead-out position B111 and the second reference lead-out position B221 in the first direction X is less than the arrangement period P1 of the pixel S in the first direction X. In some embodiments, the distance D1 between the first reference lead-out position B111 and the second reference lead-out position B221 in the first direction X is less than a width $D_{sub1}$ of a sub-pixel S0 in the first direction X. The arrangement period P1 of the pixel S in the first direction X and the width $D_{sub1}$ of the sub-pixel S0 in the first direction X are shown in FIG. 5C.

The distance between the first reference lead-out position B111 and the second reference lead-out position B221 in the first direction X is less than the arrangement period P1 of the pixel S in the first direction X. Thus, the lead out rule of the first target lead-out positions B112 and the lead out rule of the second target lead-out positions B222 may be realized in the same peripheral area, which improves the compactness of the peripheral area design and the integration of the display panel design. For example, the first target lead-out positions B112 and the second target lead-out positions B222 may be alternately arranged in the first direction X. For example, the group of first target lead-out position BX112 and the group of second target lead-out position BX222 may be alternately arranged in the first direction X. By setting the above target lead-out positions to be alternately arranged, the overall width of the first signal line arrangement region B10 and the second signal line arrangement region B20 may be further reduced, which is beneficial to achieving a narrower bezel for the display panel. It will be understood that the orthographic projections of the first signal line arrangement region B10 and the second signal line arrangement region B20 in the first direction X overlap.

In some embodiments, among the at least partially continuously distributed first target lead-out positions B112, every three first target lead-out positions B112 are provided with m second target lead-out positions B222 on each of two sides thereof, where m is one of the values of 4, 5, and 6; for example, the m second target lead-out positions B222 are composed of a group of second target lead-out positions BX222. At the positions where the first target lead-out positions B112 are led out, the second target lead-out positions B222 also have a high density, which may make the total width of the first signal line arrangement region B10 and the second signal line arrangement region B20 small or quickly small, which is conducive to improving the display appearance.

In some embodiments, referring to FIG. 6, a group of first target lead-out positions BX112 may include three first target lead-out positions B112, and a group of first lead-out lines X162 is led out from a group of first target lead-out positions BX112; therefore, a group of first lead-out lines X162 includes three first lead-out lines 162.

In some embodiments, m is an integer greater than or equal to 3, for example, m is one of 3, 4, 5, and 6; among the at least partially continuously distributed first target lead-out positions B112, every three first target lead-out positions B112 are provided with m second target lead-out positions B222 on each of two sides thereof; the three first target lead-out positions B112 are arranged at equal intervals, and the m second target lead-out positions B222 are arranged at equal intervals. With such arrangement, the lines are arranged regularly, which facilitates the wiring. For example, as shown in FIG. 9A, m second target lead-out positions B222 may belong to a group of second target lead-out positions BX222; the three first target lead-out positions B112 may belong to a group of first target lead-out positions BX112. For example, the three first lead-out lines 162 corresponding to the three first target lead-out positions are arranged at equal intervals, and the m second lead-out lines 172 corresponding to the m second target lead-out positions B222 are arranged at equal intervals. With such arrangement, it is convenient for the first lead-out line 162 to be electrically connected to the corresponding data line DT, and for the second lead-out line 172 to be electrically connected to the corresponding gate line GT. For example, a distance between the three first target lead-out positions B112 is greater than a distance between the m second target lead-out positions B222. The distance between the three first target lead-out positions B112 may be the distance between two adjacent first target lead-out positions B112 in a group of first target lead-out positions BX112; the distance between the m second target lead-out positions B222 may be the distance between two adjacent second target lead-out positions B222 in a group of second target lead-out positions BX222. In this way, all second target lead-out positions B222 in a group of second target lead-out positions BX222 are more concentratedly distributed, which is beneficial to creating a great gap between the first lead-out line 162 and the second lead-out line 172 to reduce interference caused by signal transmission to the display effect. For example, for two first target lead-out positions B112 distributed on the outer sides of the three first target lead-out positions B112, a distance between a first target lead-out position B112 and a second target lead-out position B222 nearest thereto is equal to a distance between the other first target lead-out position B112 and a second target lead-out position B222 nearest thereto. In this way, it is beneficial to have a gap as great as possible between the first lead-out line 162 and the second lead-out line 172 to reduce the interference caused by signal transmission to the display effect.

In some embodiments, m is an integer greater than or equal to 3, for example, m is one of 3, 4, 5, and 6; in the at least partially continuously distributed first target lead-out positions B112, every three first target lead-out positions B112 are provided with m second target lead-out positions B222 on each of two sides thereof; three first lead-out lines 162 are respectively led out from the three first target lead-out positions B112, and m second lead-out lines 172 are respectively led out from the m second target lead-out positions B222. The three first lead-out lines 162 are arranged at equal intervals, and the m second lead-out lines 172 are arranged at equal intervals. With such an arrangement, the lines are arranged regularly. For example, the m second lead-out lines 172 may belong to a group of second lead-out lines X172, and the three first lead-out lines 162 may belong to a group of first lead-out lines X162. For example, the three first lead-out lines 162 are arranged at equal intervals, and the m second lead-out lines 172 are arranged at equal intervals. With such arrangement, the technical effect may, for example, facilitate the electrical connection between the first lead-out line 162 and the corresponding data line DT, and facilitate the electrical connection between the second lead-out line 172 and the corresponding gate line GT. For example, a distance between the three first lead-out lines 162 is greater than a distance between the m second lead-out lines 172. The distance between the three first lead-out lines 162 may be a distance between two adjacent first lead-out lines 162 in a group of first lead-out lines X162; the distance between the m second lead-out lines 172 may be a distance between two adjacent second lead-out lines 172 in a group of second lead-out lines X172. In this way, all second lead-out lines in a group of second lead-out lines X172 are more concentratedly distributed, which is beneficial to creating a great gap between the first lead-out line 162 and the second lead-out line 172 to reduce interference caused by signal transmission to the display effect. Further, for example, for two first lead-out lines 162 located on outer sides of the three first lead-out lines 162, a distance between one first lead-out line 162 and a second lead-out line 172 nearest thereto is equal to a distance between the other first lead-out line 162 and a second lead-out line 172 nearest thereto. With such arrangement, it is beneficial to the uniform arrangement of the signal lines, so that the production yield of the display panel is improved.

In some embodiments, m is an integer greater than or equal to 3, for example, m is one of 3, 4, 5, and 6; in the at least partially continuously distributed first target lead-out positions B112, every three first target lead-out positions B112 are provided with m second target lead-out positions B222 on each of two sides thereof; three first lead-out lines 162 are respectively led out from the three first target lead-out positions B112, and m second lead-out lines 172 are respectively led out from the m second target lead-out positions B222; the three first target lead-out positions B112 are arranged at equal intervals, the m second target lead-out positions B222 are arranged at equal intervals, and an overall width occupied by the three first target lead-out positions B112 in the first direction X is less than an overall width occupied by the m second target lead-out positions B222 in the first direction X; for example, an overall width occupied by a group of first target lead-out positions BX112 in the first direction X is less than an overall width occupied by a group of second target lead-out positions BX222 in the first direction X. With such arrangement, it is possible to prevent the distance between two adjacent second target lead-out positions B222 from being too small, thereby controlling the uniformity of distribution of the first lead-out lines 162 and the second lead-out lines 172 within an ideal range.

In some of the above embodiments, the setting of the second lead-out positions B22 is related to the arrangement period of the pixel S in the first direction X. In some other embodiments, the setting of the second lead-out position B22 may also be related to the arrangement period of the pixel S in the second direction Y.

In some embodiments, referring to FIG. 8, the plurality of second lead-out positions B22 include a second reference lead-out position B221, and the second reference signal line 171$m$ is led out from the second reference lead-out position B221 and is electrically connected to a second reference gate line (i.e., a reference gate line). The width of the second signal line arrangement region B20 corresponding to the second reference lead-out position B221 is c0; among the at least partially continuously distributed second target lead-out positions B222 except for the second reference lead-out position B221, the width c of the second signal line arrangement region B20 corresponding to each second target lead-out position B222 satisfies: $c0-[\text{int}(\Delta3/P_{sub2})+1](W_{gate}+S_{gate})\leq c\leq c0-[\text{int}(\Delta3/P_{sub2})-1](W_{gate}+S_{gate})$, where $\Delta3$ is a distance between the second target lead-out position B222 and the second reference lead-out position B221 in the second direction Y, $P_{sub2}$ is the arrangement period of the sub-pixel S0 in the second direction, $W_{gate}$ is the width of the second signal line 171, and $S_{gate}$ is the distance between adjacent second signal lines 171; with such design, it is possible to achieve orderly lead out of the second signal lines 171 while ensuring that the display panel has a narrow bezel, which avoids unnecessary cross-connections between the second signal line 171 and other signal lines, thereby reducing the overlapping capacitance of signal lines and improving the display effect of the display panel. Optionally, the width of the second signal line arrangement region B20 corresponding to the region between the second target lead-out position B222 and the second reference lead-out position B221 is also designed to satisfy the above formula. Thus, it is possible to further standardize the shape of the second signal line arrangement region B20 between the second lead-out positions B22, so as to ensure the orderly extension of the second signal line arrangement region B20 and improve the reliability of the display panel.

In some examples, the range of c is applicable to a part of the second signal line arrangement region B20 and provided with no second lead-in line 173 on a side of the part away from the display area AA.

In an embodiment, the second direction is a direction perpendicular to the first direction; for example, as shown in FIG. 8, in a case where the first direction is the direction X, the second direction is the direction Y, and the direction X is perpendicular to the direction Y.

In some of the above embodiments, the second reference lead-out position B221, the second target lead-out positions B222 have been described, and will not be repeated here.

The arrangement period P2 of the pixel S in the second direction Y may be understood as a distance between the same positions of two adjacent pixels S in the second direction Y. The same positions of two adjacent pixels S may be understood as the same positions respectively in the two pixels S, for example, may be the center of the pixel S, or the center of the sub-pixel S0 on the left side in the pixel S, or the lower left corner of sub-pixel S0 on the left side of the pixel S, or the lower left corner of the pixel electrode of the sub-pixel S0 on the left side of the pixel S (as shown in FIG. 5C). It will be understood that in a case where the plurality of sub-pixels S0 in the pixel S are arranged only in the direction X, the arrangement period $P_{sub2}$ of the sub-pixel S0 in the second direction Y is equal to the arrangement period P2 of the pixel S in the second direction Y.

In an embodiment, $P_{sub2}>P_{sub1}$, the sub-pixels S0 in the pixel S are only arranged in the first direction.

Referring to FIG. 7, in some examples, a group of second target lead-out positions BX222 includes only one second target lead-out position B222; in this case, it may also be understood that the second target lead-out positions B222 are not grouped. In this case, each second lead-out line 172 may be led out from a second lead-out position B22, and the plurality of second lead-out lines 172 are arranged at equal intervals. Since each gate line GT is connected to a row of sub-pixels S0, the plurality of gate lines GT are arranged at equal intervals. In this case, the distance between two adjacent second lead-out lines 172 may be set to be equal to the distance between two adjacent second gate lines GT. The second lead-out line 172 may be disposed on the same straight line as the gate line GT to which it is connected and the second lead-out position B22 corresponding to the second lead-out line 172. $\Delta3/P_{sub2}$ represents the number of rows of sub-pixels S0 passed by the second signal line arrangement region B20 between the second target lead-out position B222 and the second reference lead-out position B221 in the second direction Y. With each passing a row of sub-pixels S0, a second signal line 171 is led out from the second signal line arrangement region B20. Therefore, the width of the second signal line arrangement region B20 is reduced by $W_{gate}+S_{gate}$.

In some embodiments, an orthographic projection of the second signal line arrangement region B20 in the second direction Y overlaps with an orthographic projection of a part of the sub-pixels S0 in the second direction Y.

In some embodiments, after the second lead-out line 172 is led out from the second signal line arrangement region B20, the second lead-out line 172 extends radially toward the target gate line GT or the sub-pixel S0 controlled by the target gate line GT until it is close to the target gate line GT or the sub-pixel S0 controlled by the target gate line GT. The term "radially" means that the extension direction does not change.

In some embodiments, the second target reference position B222 is located in the same position as the gate line GT electrically connected to the second lead-out line 172 led out therefrom in the first direction X.

In some embodiments, the second target reference position B222 is located in the same position as the sub-pixel S0 controlled by the gate line GT electrically connected to the second lead-out line 172 led out therefrom in the first direction X. For example, referring to FIG. 7, in the figure, the second target reference position B222 is located on the same horizontal plane as the sub-pixel S0 controlled by the gate line GT electrically connected to the second lead-out line 172 led out therefrom.

Figures 11, 12A:
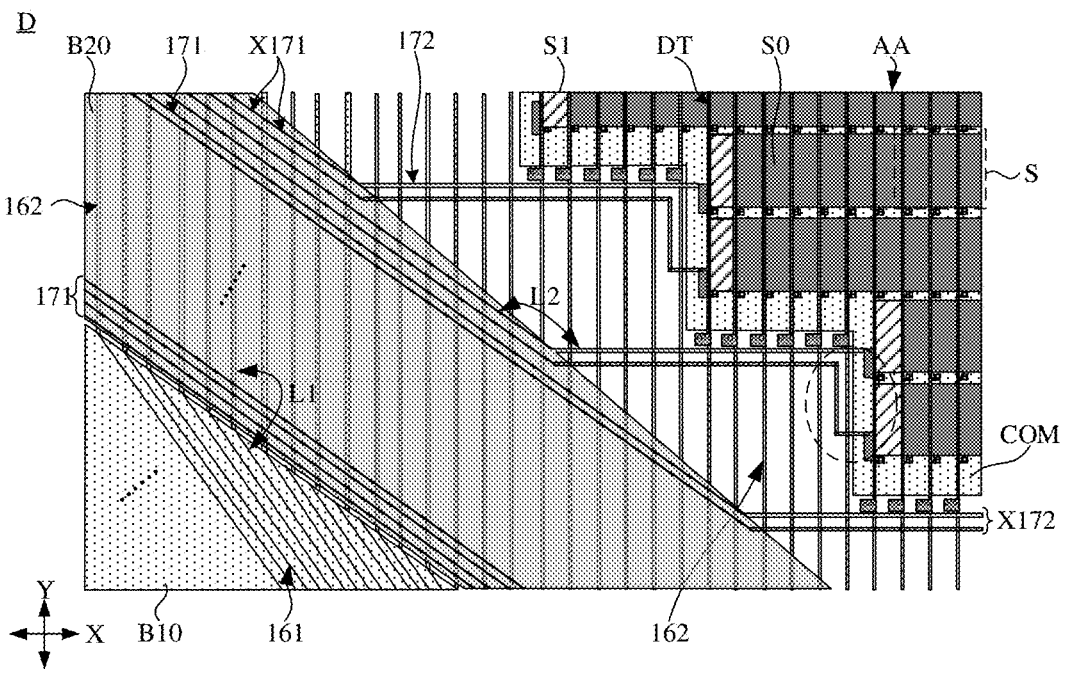
FIG. 11 is yet another partial enlarged view of the region D in FIG. 5A.
FIG. 12A is a structural diagram of a display panel, in accordance with some embodiments.

FIG. 11 is yet another partial enlarged view of the region D in FIG. 5A.

Referring to FIG. 11, in some other examples, in the at least partially continuously distributed second target lead-out positions B222 except for the second reference lead-out position B221, a group of second target lead-out positions BX222 includes multiple second target lead-out positions B222. In this case, the distance between two adjacent groups of second target lead-out positions BX222 is greater than the distance between two adjacent second target lead-out positions B222 in a group of second target lead-out positions BX222. For example, the multiple second lead-out lines 172 led out from a group of second target lead-out positions BX222 are electrically connected to multiple gate lines GT in a one-to-one correspondence, and a gate line GT controls TFT switches of at least some of the sub-pixels in a row of sub-pixels S0.

For example, n second lead-out lines 172 are led out from a group of second target lead-out positions BX222. With each passing n rows of sub-pixels S0, n second lead-out lines 172 are led out. The n second lead lines 172 constitute a group of second lead-out lines X172. n is a positive integer; for example, n is one of 1, 2, 3, 4, 5, and 6.

In some examples, in a case where a group of second target lead-out positions BX222 includes multiple second target lead-out positions B222, portions of the multiple second lead-out lines 172 corresponding to the multiple second target lead-out positions B222 may extend in the first direction X; each gate line GT is connected to a row of sub-pixels S0, the multiple gate lines GT are arranged at equal intervals, and a distance between the adjacent gate lines GT is not equal to a distance between the adjacent second lead-out lines 172 in a group of second lead-out lines X172. The distance between adjacent second lead-out lines 172 in a group of second lead-out lines X172 may be less than the distance between adjacent gate lines GT; for example, near the position where the second lead-out line 172 is connected to the gate line GT, the second lead-out line 172 is bent to achieve the electrical connection.

Referring to FIG. 11, in some embodiments, an included angle L1 between the first lead-out line 162 and the first signal line 161 electrically connected thereto is greater than or equal to 90°.

In some embodiments, an included angle L2 between the second lead-out line 172 and the second signal line 171 electrically connected thereto is greater than or equal to 90°. The included angle between the lead line and the signal line is greater than or equal to 90°, which may avoid excessive bending angle of wiring and reduce the risk of defects.

In some embodiments, for the at least partially continuously distributed second target lead-out positions B222, the width c1 of the second signal line arrangement region B20 corresponding to a second lead-out position B22 electrically connected to a target gate line spaced an odd number of gate lines GT from the second reference gate line satisfies: $c1=c0-[int(\Delta3/P_{sub2})](W_{gate}+S_{gate})$.

Every two adjacent second target lead-out positions B222 constitute a group of second target lead-out positions BX222. Two second signal lines 171 led out from a group of second target lead-out positions BX222 are electrically connected to two gate lines GT through two second lead-out lines 172 respectively. In some embodiments, pixels S corresponding to the outer contour of at least part of the display area AA of the display panel are arranged in a zigzag shape. As shown in FIG. 11, the pixels S corresponding to the outer contour of the display area AA are indented to the right while extending downward, with each extending downward Y-direction arrangement period of two pixels S, the X-direction arrangement period of two pixels S is indented to the right, the pixels S corresponding to the outer contour of at least part of the display area AA may be arranged in such a way in a case where the outer contour of the display area AA of the display panel is in a shape of a circle, which may make the outer contour of the display area AA of the display panel look smooth and conform to the contour characteristic of the circular area AA. In this case, for the at least partially continuously distributed second target lead-out positions B222, the width c1 of the second signal line arrangement region B20 corresponding to a second lead-out position B22 electrically connected to the target gate line spaced an odd-numbered gate lines GT from the second reference gate line satisfies: $c1=c0-[int(\Delta3/P_{sub2})](W_{gate}+S_{gate})$, which may make the second lead-out lines 172 lead out from the second target lead-out positions B222 evenly distributed and avoid wiring redundancy.

In some examples, the above formula $c1=c0-[int(\Delta3/P_{sub2})](W_{gate}+S_{gate})$ is applicable to a part of the second signal line arrangement region B20 and provided with no second lead-in line 173 on a side of the part away from the display area AA.

In some embodiments, the width c satisfies: $c=c0-[int(\Delta3/P_{sub2})](W_{gate}+S_{gate})$. For example, with each passing a row of sub-pixels S0, a second signal line 171 is led out from the second signal line arrangement region B20. Therefore, a second lead-out position B22 corresponds to a row of sub-pixels S0, which may make the second lead-out lines 172 led out from the second target lead-out position B222 evenly distributed and avoid wiring redundancy.

In some examples, the above formula of $c=c0-[int(\Delta3/P_{sub2})](W_{gate}+S_{gate})$ is applicable to a part of the second signal line arrangement region B20 and provided with no second lead-in line 173 on a side of the part away from the display area AA.

Further, in some embodiments, the width b satisfies: $b=b0-[int(k\Delta1/P1)](W_{gate}+S_{gate})$. With this design, the second lead-out lines 172 led out from the second target lead-out positions B222 and the first lead-out lines 162 led out from the first target lead-out positions B112 are arranged to be relatively evenly distributed to avoid wiring redundant.

In some embodiments, the second lead-out lines 172 located in parts of the peripheral area on opposite sides of the display area AA alternately provide driving signals for the plurality of gate lines GT. For example, parts of the peripheral area on opposite sides of the display area AA each include at least one second signal line arrangement region. For example, the second lead-out lines 172 that provides gate driving signals each for a row of sub-pixels S0 from one side of the display area AA are respectively connected to the gate lines GT arranged spaced a row from one another; the second lead-out lines 172 that provides gate driving signals each for a row of sub-pixels S0 from the other side of the display area AA are also respectively connected to the gate lines GT that are arranged spaced a row from one another. In an embodiment, the second lead-out line 172 located on one side of the display area AA drives an odd-numbered row of sub-pixels S0, and the second lead-out line 172 located on the other side of the display area AA 172 drives an even-numbered row sub-pixels S0. In this way, the width of each second signal line arrangement region may be small, so that a narrower bezel of the display panel may be achieved.

In an example, the plurality of second lead-out positions B22 include one second reference lead-out position B221, and the second reference signal line 171m is led out from the second reference lead-out position B221 and is electrically connected to the second reference gate line; the width of the second signal line arrangement region B20 corresponding to the second reference lead-out position B221 is c0; among the at least partially continuously distributed second target lead-out positions B222 except for the second reference lead-out position B221, the width c of the second signal line arrangement region B20 corresponding to each second target lead-out position B222 satisfies: $c0-[int(\Delta3/(2P_{sub2})+1)](W_{gate}+S_{gate})\leq c\leq c0-[int(\Delta3/2P_{sub2}-1)](W_{gate}+S_{gate})$, where $\Delta3$ is a distance between the second target lead-out position B222 and the second reference lead-out position B221 in the second direction Y, $P_{sub2}$ is an arrangement period of the sub-pixel S0 in the second direction Y, $W_{gate}$ is the a width of the second signal line 171, and $S_{gate}$ is a distance between adjacent second signal lines 171. Optionally, the width of the second signal line arrangement region B20 corresponding to the region between the second target lead-out position B222 and the second reference lead-out position B221 is also designed to satisfy the above formula. In some examples, the range of c is applicable to a region in the second signal line arrangement region B20 and provided with no second lead-in line 173 on a side of the region away from the display area AA.

In an example, the width c satisfies: $c=c0-[int(\Delta3/(2P_{sub2})](W_{gate}+S_{gate})$.

In some embodiments, the first signal line arrangement region B10 is closer to the display area AA than the second signal line arrangement region B20. In this case, at least part of the second lead-out lines 172 will extend across the first signal line arrangement region B10 to be electrically connected to the gate line GT.

In some embodiments, the second signal line arrangement region B20 is closer to the display area AA than the first signal line arrangement region B10. In this case, part of the first lead-out lines 162 will extend across the second signal line arrangement region B20 to be electrically connected to the data line DT.

In some examples, a segment of the second lead-out line 172 proximate to the second signal line 171 extends in a straight line. For example, the segment extends in the first direction X; for example, the segment extends in the second direction Y.

In some examples, a segment of the first lead-out line 162 proximate to the first signal line 161 extends in a straight line. For example, the segment extends in the second direction Y. For example, the segment extending in the second direction Y crosses the second signal line arrangement region B20.

FIG. 12A is a structural diagram of the display panel 100, in accordance with some embodiments.

Referring to FIG. 12A, in some embodiments, in a case where the second signal line arrangement region B20 is closer to the display area AA than the first signal line arrangement region B10, and the first lead-out line 162 is led out in the second direction Y, in at least part of the first signal line arrangement region B10 (shown in FIG. 6), an included angle $\theta1$ between the first signal line 161 that is located in the first signal line arrangement region B10 and is immediately adjacent to the second signal line arrangement region B20 (shown in FIG. 6) and the second signal line 171 that is located in the second signal line arrangement region B20 and is immediately adjacent to the first signal line arrangement region B10 satisfies: $\sin\theta1=[I1(W_{data}+S_{data})\cos\alpha1]/P1$, where $\alpha1$ is an included angle between the second signal line 171 that is located in the second signal line arrangement region B20 and is immediately adjacent to the first signal line arrangement region B10 and the first direction X, I1 is the number of the first target lead-out positions B112 corresponding to the range of the arrangement period of a pixel in the first direction X, and P1 is the arrangement period of the pixel in the first direction X.

In a case where the first signal line 161 is led out in the second direction Y, a group of first lead-out lines X162 may include multiple first lead-out lines 162. Of course, in some other examples, a group of first lead-out lines X162 may include one first lead-out line 162, i.e., the first lead-out lines 162 are not grouped.

In the examples shown in FIG. 12A, a group of first lead-out lines X162 includes one first lead-out line 162.

The above embodiments of the present disclosure will be exemplary described by considering FIG. 12A as an example.

For example, the first signal line 161 that is located in the first signal line arrangement region B10 and is immediately adjacent to the second signal line arrangement region B20 is a first signal line 161R, and the second signal line 171 that is located in the second signal line arrangement region B20 and is immediately adjacent to the first signal line arrangement region B10 is a second signal line 171R.

The first signal line arrangement region B10 further includes a first signal line 161S; a distance between an end of the first signal line 161R electrically connected to the first lead-out line 162 and an end of the first signal line 161S electrically connected to the first lead-out line 162 in the first direction X is P1.

A third auxiliary line M3 parallel to the second signal line 171R is made through the end of the first signal line 161R electrically connected to the first lead-out line 162.

Figures 12B, 12C:
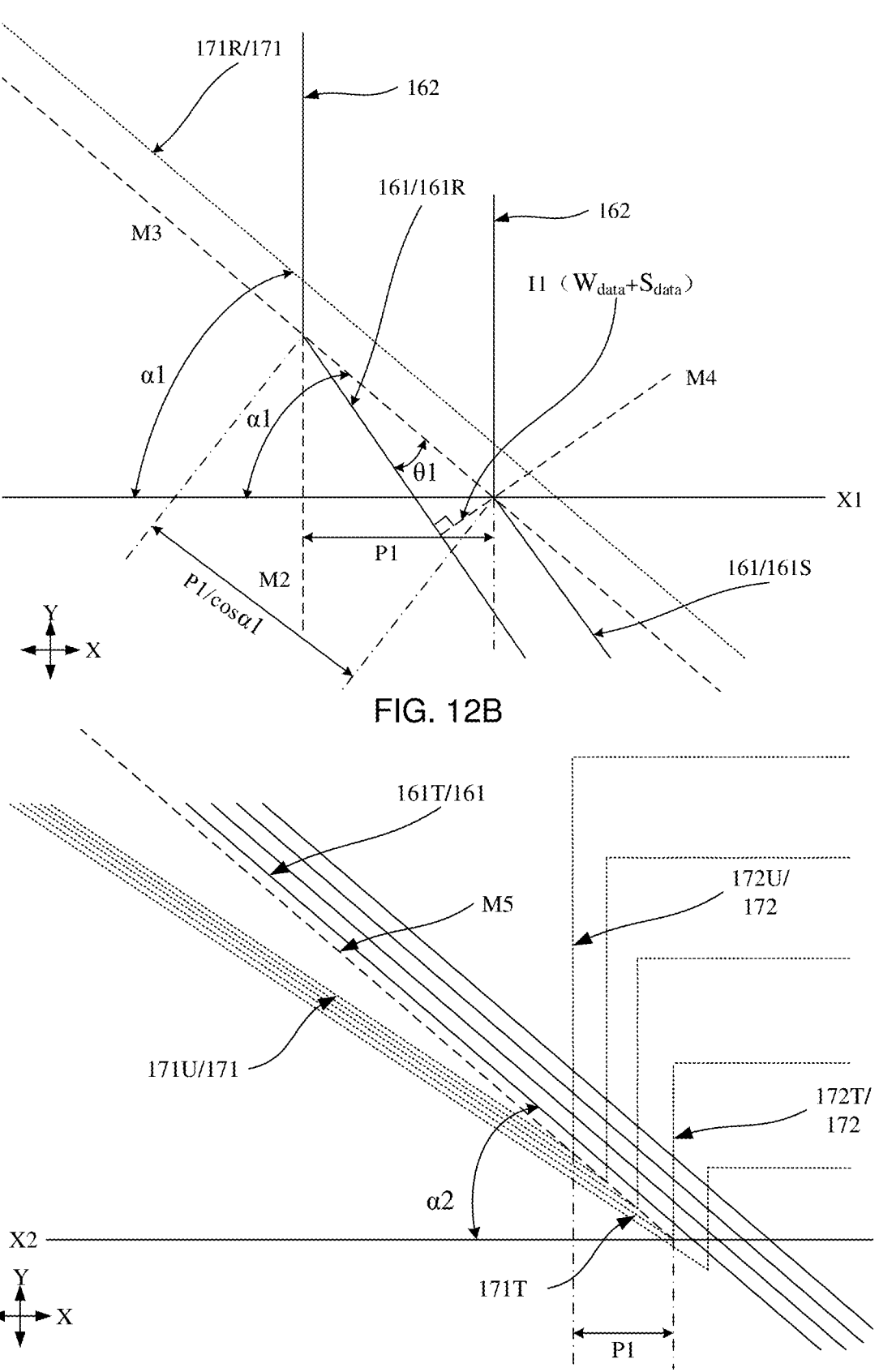
FIG. 12B is a structural diagram of a display panel, in accordance with some embodiments.
FIG. 12C is a structural diagram of a display panel, in accordance with some embodiments.

FIG. 12B is a structural diagram of the display panel 100, in accordance with some embodiments.

Referring to FIG. 12B, a straight line X1 is made, the straight line X1 is parallel to the first direction X, and the straight line X1 passes through the end of the first signal line 161S electrically connected to the first lead-out line 162.

A second auxiliary line M2 perpendicular to the straight line X1 is made through the end of the first signal line 161R electrically connected to the first lead-out line 162, and the second auxiliary line M2 is located in a same straight line as the first lead-out line 162 electrically connected to the first signal line 161R.

The third auxiliary line M3, the straight line X1 and the second auxiliary line M2 may enclose a first right triangle. An acute angle of the first right triangle is an included angle between the third auxiliary line M3 and the straight line X1. Since the third auxiliary line M3 is parallel to the second signal line 171R, and an included angle between the second signal line 171R and the straight line X1 is $\alpha1$, an included angle between the third auxiliary line M3 and the straight line X1 is $\alpha1$. In this case, a part of the third auxiliary line M3 serves as a hypotenuse of the first right triangle.

A length of a right-angled side of the first right triangle immediately adjacent to the acute angle $\alpha1$ is the distance, i.e., P1, between the end of the first signal line 161R electrically connected to the first lead-out line 162 and the end of the first signal line 161S electrically connected to the first lead-out line 162 in the first direction X.

Therefore, a length of the hypotenuse of the first right triangle is P1/cos $\alpha1$.

A fourth auxiliary line M4 perpendicular to the first signal line 161R is made through the end (i.e., an intersection of the first signal line 161S and the straight line X1) of the first signal line 161S electrically connected to the first lead-out line 162. In this case, the fourth auxiliary line M4 is perpendicular to the first signal line 161S and passes through the intersection of the first signal line 161S and the third auxiliary line M3.

In this case, the first signal line 161R, the third auxiliary line M3 and the fourth auxiliary line M4 may enclose a second right-angled triangle. An acute angle of the second right-angled triangle is an included angle between the third auxiliary line M3 and the first signal line 161R. Since the third auxiliary line M3 is parallel to the second signal line 171R, and an included angle between the third auxiliary line M3 and the first signal line 161R is $\theta1$, the acute angle of the second right triangle is $\theta1$. A part of the fourth auxiliary line M4 is an opposite side of the acute angle $\theta1$, and a length of the opposite side of the acute angle $\theta1$ is a distance between the first signal line 161S and the first signal line 161R, and the distance between the first signal line 161S and the first signal line 161R is $11(W_{data}+S_{data})$. Therefore, in the second right-angled triangle, the length of the opposite side of the acute angle $\theta1$ is $11(W_{data}+S_{data})$.

In addition, the hypotenuse of the second right triangle is shared with the hypotenuse of the first right triangle, so that the length of the hypotenuse of the second right triangle is P1/cos $\alpha1$. Therefore, sin $\theta1=[I1(W_{data}+S_{data})]/(P1/cos$ $\alpha1)=[I1(W_{data}+S_{data}) \cos \alpha1]/P1$.

The included angle $\theta1$ satisfies sin $\theta1=[I1(W_{data}+S_{data}) \cos \alpha1]/P1$, which may make the shapes of the adjacent first signal line 161 and the second signal line 171 consistent, thereby reducing the overall width of a corresponding position of the first signal line arrangement region B10 and the second signal line arrangement region B20 and facilitating the realization of a narrower bezel of the display panel.

FIG. 12C is a structural diagram of the display panel 100, in accordance with some embodiments.

Referring to FIG. 12C, in some embodiments, in a case where the first signal line arrangement region B10 is closer to the display area AA than the second signal line arrangement region B20, and the second lead-out line 172 is led out in the second direction Y, in at least part of the first signal line arrangement region B10 (as shown in FIG. 6), an included angle $\theta2$ between the first signal line 161 that is located in the first signal line arrangement region B10 and is immediately adjacent to the second signal line arrangement region B20 and the second signal line 171 that is located in the second signal line arrangement region B20 (as shown in FIG. 6) and is immediately adjacent to the first signal line arrangement region B10 satisfies: sin $\theta2=[I2(W_{data}+S_{data}) \cos \alpha2]/P1$, where $\alpha2$ is an included angle between the first signal line 161 that is located in the first signal line arrangement region B10 and is immediately adjacent to the second signal line arrangement region B20 and the first direction X, 12 is the number of the second target lead-out positions B222 corresponding to the range of the arrangement period of a pixel in the first direction X, and P1 is the arrangement period of the pixel in the first direction X.

In a case where the second signal line 171 is led out in the second direction Y, a group of second target lead-out positions BX222 may include a plurality of second target lead-out positions B222. In this case, the plurality of second lead-out lines 172 are led out as groups. It is also possible that a group of second target lead-out positions BX222 includes one second target lead-out position B222. In FIG. 12C, some of the above embodiments are exemplified by taking an example in which a group of second target lead-out positions BX222 includes one second target lead-out position B222.

As shown in FIG. 12C, the range of the arrangement period of a pixel in the first direction X corresponds to three second target extraction positions B222, i.e., I2=3.

The first signal line 161 that is located in the first signal line arrangement region B10 and is immediately adjacent to the second signal line arrangement region B20 is a first signal line 161T. Therefore, an included angle between the first signal line 161T and the first direction X is $\alpha2$.

The second signal line 171 that is located in the second signal line arrangement region B20 and is immediately adjacent to the first signal line arrangement region B10 is a second signal line 171T. Therefore, an included angle between the second signal line 171 and the first signal line 161T is $\theta2$. The second signal line arrangement region B20 further includes a second signal line 171U; a distance between an end of the second signal line 171T electrically connected to the second lead-out line 172 and an end of the second signal line 171U electrically connected to the second lead-out line 172 in the first direction X is P1.

A fifth auxiliary line M5 is made, and the fifth auxiliary line M5 is parallel to the first signal line 161T and passes through an end of the second signal line 171T connected to the second lead-out line 172. Since the included angle between the second signal line 171T and the first signal line 161T is θ2, the included angle between the fifth auxiliary line M5 and the second signal line 171T is θ2.

Figures 12D, 12E:
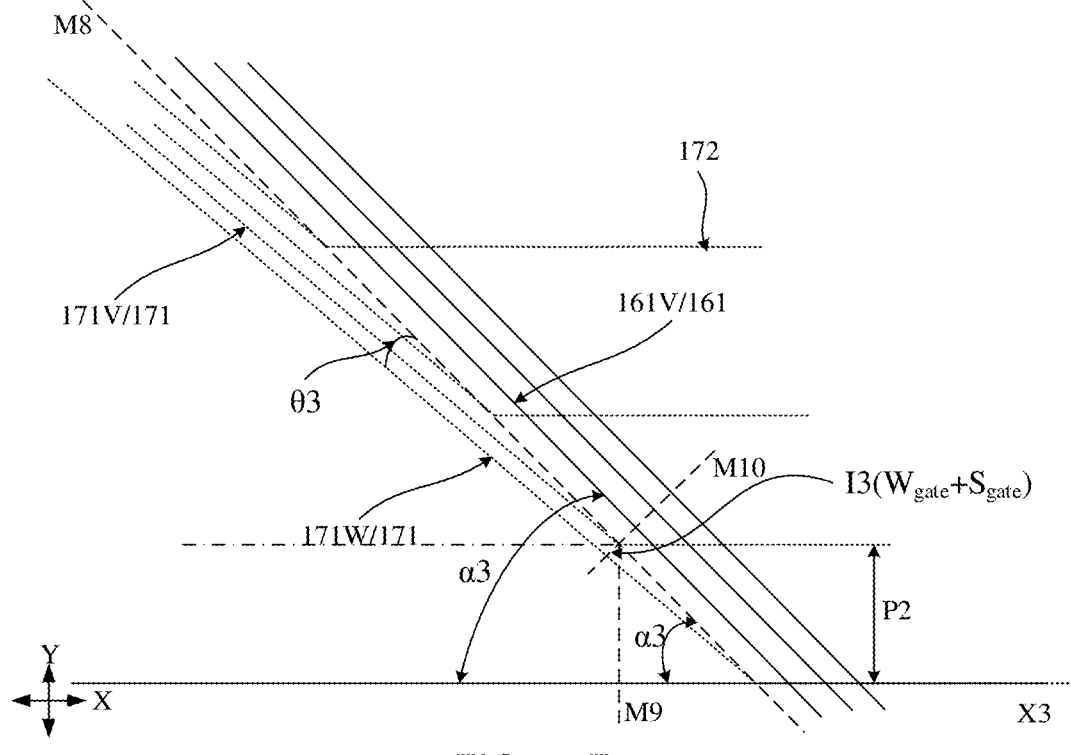
FIG. 12D is a structural diagram of a display panel, in accordance with some embodiments.
FIG. 12E is a structural diagram of a display panel, in accordance with some embodiments.

FIG. 12D is a structural diagram of the display panel 100, in accordance with some embodiments.

Referring to FIG. 12D, a straight line X2 parallel to the first direction X is led out through the end of the second signal line 171T electrically connected to the second lead-out line 172. The straight line X2 also passes through an intersection of the fifth auxiliary line M5 and the second signal line 171T.

A seventh auxiliary line M7 perpendicular to the straight line X2 is made through an end of the second signal line 171U electrically connected to the second lead-out line 172.

In this case, the seventh auxiliary line M7, the fifth auxiliary line M5 and the straight line X2 may enclose a fifth right-angled triangle. An acute angle of the fifth right-angled triangle is an included angle between the fifth auxiliary line M5 and the straight line X2. An included angle between the fifth auxiliary line M5 and the straight line X2 is $\alpha2$, and a length of a right-angled side immediately adjacent to the acute angle $\alpha2$ is P1, so that a length of a hypotenuse of the fifth right-angled triangle is P1/cos $\alpha2$.

A sixth auxiliary line M6 perpendicular to the second signal line 171T is made through an end of the second signal line 171U electrically connected to the second lead-out line 172. In this case, the sixth auxiliary line M6 may be perpendicular to the second signal line 171U and pass through an intersection of the second signal line 171U and the fifth auxiliary line M5.

The second signal line 171T, the fifth auxiliary line M5 and the sixth auxiliary line M6 may enclose a sixth right-angled triangle. An acute angle of the sixth right-angled triangle is an included angle between the fifth auxiliary line M5 and the second signal line 171T, and the included angle between the fifth auxiliary line M5 and the second signal line 171T is θ2. A length of a right-angled side opposite to the acute angle θ2 is a distance between the second signal line 171T and the second signal line 171U, and the distance between the second signal line 171T and the second signal line 171U is I2 ($W_{data}$+$S_{data}$). In addition, the sixth right-angled triangle and the fifth right-angled triangle share a hypotenuse, so that a length of the hypotenuse of the sixth right-angled triangle is P1/cos $\alpha2$. Therefore, sin θ2=[I2 ($W_{data}$+$S_{data}$)](P1/cos $\alpha2$)=[I2($W_{gate}$+$S_{gate}$) cos $\alpha2$]/P1.

The included angle θ2 satisfies sin θ2=[I2($W_{gate}$+$S_{gate}$) cos $\alpha2$]/P1, which may make the shapes of the adjacent first signal line 161 and the second signal line 171 more consistent, thereby reducing the overall width of the corresponding position of the first signal line arrangement region B10 and the second signal line arrangement region B20, and facilitating the realization of a narrower bezel of the display panel.

Figures 12F, 13:
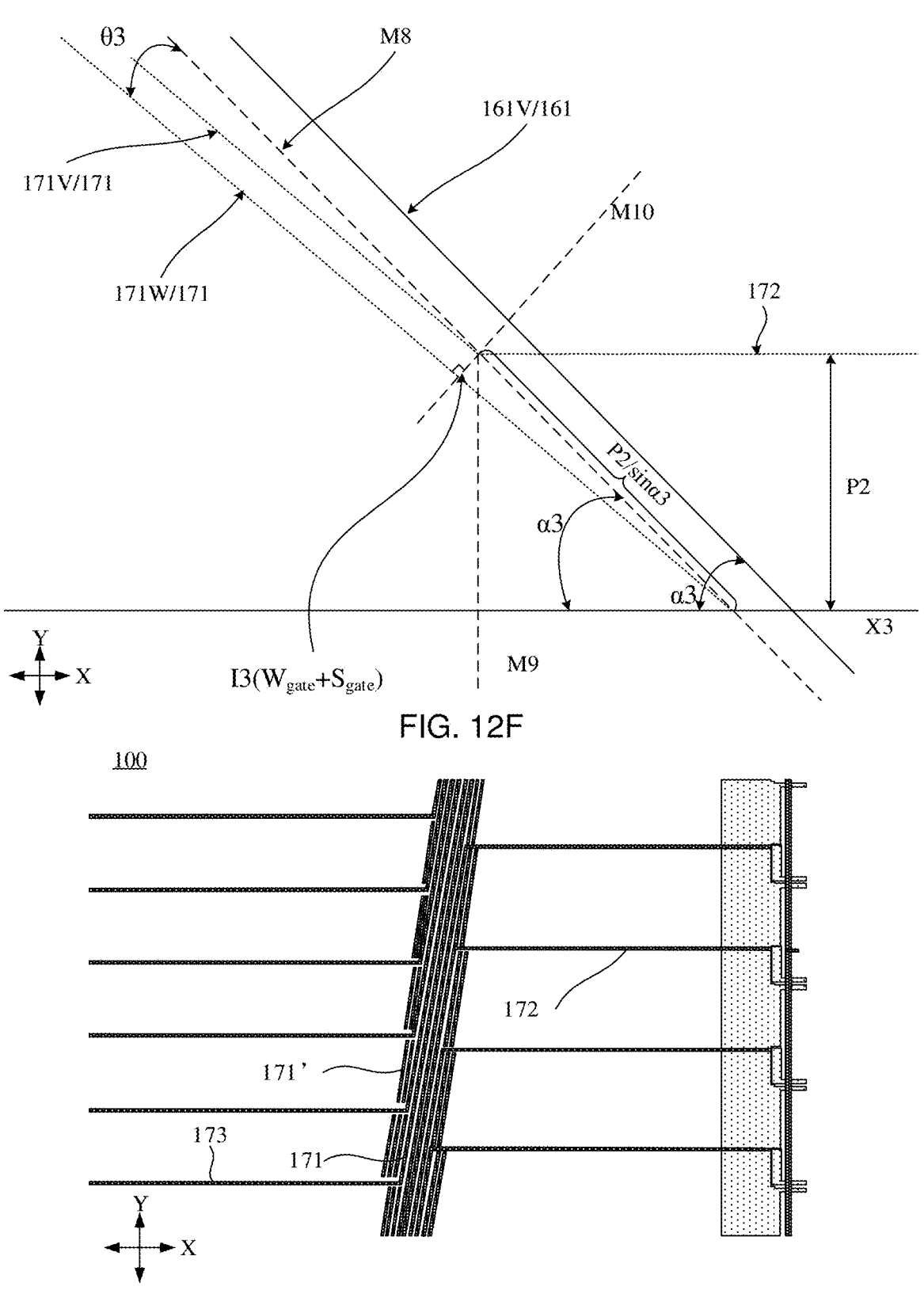
FIG. 12F is a structural diagram of a display panel, in accordance with some embodiments.

FIG. 12E is a structural diagram of the display panel 100, in accordance with some embodiments. FIG. 12F is a structural diagram of the display panel 100, in accordance with some embodiments.

Referring to FIGS. 12E and 12F, in some embodiments, in a case where the first signal line arrangement region B10 is closer to the display area AA than the second signal line arrangement region B20, and the second lead-out line 172 is led out in the first direction X, in at least part of the first signal line arrangement region B10 (shown in FIG. 6), an included angle θ3 between the first signal line 161 that is located in the first signal line arrangement region B10 and is immediately adjacent to the second signal line arrangement region B20 and the second signal line 171 that is located in the second signal line arrangement region B20 (shown in FIG. 6) and is immediately adjacent to the first signal line arrangement region B10 satisfies:

$$\sin θ3=[I3(W_{gate}+S_{gate})\sin \alpha3]/P2.$$

$\alpha3$ is an included angle between the first signal line 161 in the first signal line arrangement region B10 and the second signal line arrangement region B20 and the first direction X; I3 is the number of the second target lead-out positions B222 corresponding to the range of the arrangement period of the pixel in the second direction Y; P2 is the arrangement period of the pixel in the second direction Y.

In a case where the second lead-out line 172 is led out in the first direction X, a group of second target lead-out positions BX222 may include one second target lead-out position B222, i.e., the second target lead-out positions B222 are not grouped. It is also possible that a group of second target lead-out positions BX222 includes multiple second target lead-out position B222.

In some examples, a value of I3 may be 1.

The first signal line 161 in the first signal line arrangement region B10 and immediately adjacent to the second signal line arrangement region B20 is a first signal line 161V, and the second signal line 171 in the second signal line arrangement region B20 and immediately adjacent to the first signal line arrangement region B10 is a second signal line 171W. The second signal line arrangement region B20 further includes a second signal line 171V. A distance between an end of the second signal line 171W electrically connected to the second lead-out line 172 and an end of the second signal line 171V electrically connected to the second lead-out line 172 in the second direction Y is P2.

An eighth auxiliary line M8 is made, and the eighth auxiliary line M8 is parallel to the first signal line 161V and passes through an end of the second signal line 171W electrically connected to the second lead-out line 172. Therefore, an included angle between the eighth auxiliary line M8 and the second signal line 171W is θ3.

A straight line X3 parallel to the first direction X is made through the end of the second signal line 171W electrically connected to the second lead-out line 172.

A ninth auxiliary line M9 perpendicular to the straight line X3 is made at the end of the second signal line 171V electrically connected to the second lead-out line 172.

In this case, the ninth auxiliary line M9, the eighth auxiliary line M8 and the straight line X3 may enclose a seventh right-angled triangle. An acute angle of the seventh right-angled triangle is an included angle between the eighth auxiliary line M8 and the straight line X3. Since the eighth auxiliary line M8 is parallel to the first signal line 161V, the included angle between the eighth auxiliary line M8 and the straight line X3 is $\alpha3$.

A length of a right-angled side opposite to the acute angle $\alpha3$ is the distance between the end of the second signal line 171V electrically connected to the second lead-out line 172 and the end of the second signal line 171W electrically connected to the second lead-out line 172 in the second direction Y, i.e., P2. A part of the eighth auxiliary line M8 may serve as a hypotenuse of the seventh right-angled triangle, and a length of the hypotenuse of the seventh right-angled triangle is P2/sin $\alpha3$.

A tenth auxiliary line M10 perpendicular to the second signal line 171W is made through an intersection of the second signal line 171V and the eighth auxiliary line M8. The tenth auxiliary line M10 is also perpendicular to the second signal line 171V, and passes through both the intersection of the second signal line 171V and the eighth auxiliary line M8 and the end of the second signal line 171V electrically connected to the second lead-out line 172.

The tenth auxiliary line M10, the eighth auxiliary line M8 and the second signal line 171W may enclose an eighth right-angled triangle, and the eighth right-angled triangle and the seventh right-angled triangle share a hypotenuse. Therefore, a length of the hypotenuse of the eighth right-angled triangle is P2/sin α3.

In addition, an acute angle of the eighth right triangle is an included angle between the eighth auxiliary line M8 and the second signal line 171W. Since the eighth auxiliary line M8 is parallel to the first signal line 161V, the included angle between the eighth auxiliary line M8 and the second signal line 171W is θ3.

A length of a right-angled side opposite to the acute angle θ3 is a distance between the second signal line 171W and the second signal line 171V, i.e., $I3(W_{gate}+S_{gate})$, so that sin $\theta3=[I3 (W_{gate}+S_{gate})](P2/\sin \alpha3)=[I3 (W_{gate}+S_{gate}) \sin \alpha3]/P2$.

The included angle θ3 satisfies sin $\theta3=[I3(W_{gate}+S_{gate}) \sin \alpha3]/P2$, which may make the shapes of the adjacent first signal line 161 and the second signal line 171 more consistent, thereby reducing the overall width of the corresponding position of the first signal line arrangement region B10 and the second signal line arrangement region B20, and facilitating the realization of a narrower bezel of the display panel.

In some specific embodiments, the second signal line arrangement region B20 is closer to the display area AA than the first signal line arrangement region B10, and the included angle θ between the first signal line 161 that is located in the first signal line arrangement region B10 and is immediately adjacent to the second signal line arrangement region B20 and the second signal line 171 that is located in the second signal line arrangement region B20 and is immediately adjacent to the first signal line arrangement region B10 is in a range of 1° to 5°, inclusive, i.e., 1°≤θ≤5°. The included angle θ is set to be in this range, it is beneficial to the close arrangement of the first signal line arrangement region B10 and the second signal line arrangement region B20.

In some embodiments, the included angle θ is in a range of 3° to 5°, inclusive.

In some embodiments, a width of the first lead-out line 162 is greater than a width of the first signal line 161 connected thereto.

In an embodiment, the first lead-out line 162 and the first signal line 161 are manufactured through the same process. In a case where the first lead-out line 162 and the first signal line 161 are manufactured, first, a conductive layer needs to be deposited, and then a photoresist layer is formed on the conductive layer, and then the expose and development process will be performed on the photoresist layer to remove the exposed portion of the photoresist layer, thereby forming a photolithography pattern. A portion of the photolithography pattern corresponds to the first signal line 161; then, an etching solution is used to etch the conductive layer, and in this case, the portion covered by the photolithography pattern is retained and the portion is not covered by the photolithography pattern is removed, thereby forming the first signal line 161 and the first lead-out line 162. Then, the photolithography pattern covering the first signal line 161 and the first lead line 162 is removed. In an implementation, the design width of the first lead-out line 162 is equal to the design width of the first signal line 161 connected thereto, and the arrangement density of the first signal lines 161 is relatively large, while the arrangement density of the first lead-out line 162 is relatively small. However, during the process of etching the conductive layer, the etching liquid in the region where the first lead-out lines 162 are located is more than the etching liquid in the region where the plurality of first signal lines 161 are located. Therefore, the etching rate of the first lead-out line 162 is greater than the etching rate of the first signal line 161. Therefore, it is easy to cause the first lead-out line 162 to be over-etched, causing the actual width of the first lead-out line 162 to be less than the design width of the first lead-out line 162, which leads to excessive resistance of the first lead-out line 162. In some embodiments of the present disclosure, the width of the first lead-out line 162 is greater than the width of the first signal line 161 connected thereto, it is possible to prevent the actual width of the first lead-out line 162 from being too small after etching, and resulting in the excessive resistance.

In an embodiment, the metal layer where the first lead-out lines 162 are located is located on a side of the metal layer where the second signal lines 171 are located away from the first substrate 111. For example, in a case where the first lead-out line 162 extend across the second signal line 171 (as shown in FIG. 7), the width of the first lead-out line 162 is greater than the width of the first signal line 161 connected thereto; that is, the first lead-out line 162 is widened to prevent the defects of climbing and short-circuit from occurring when the first lead-out line 162 passes through the second signal line 171.

In an embodiment, the second signal line 171 and the second lead-out line 172 are manufactured through the same process.

In an embodiment, a difference between the width of the first lead-out line 162 and the width of the first signal line 161 is in a range of 0 to 2 μm, inclusive.

In addition, in some other embodiments, at least one first sacrificial conductive line is provided on each of two side of the first lead-out line 162. By providing the first sacrificial conductive line, it is possible to increase the arrangement density of the first lead-out lines 162, which reduces the etching speed of the first lead-out line 162, thereby preventing the actual width of the first lead-out line 162 from being too small and the resistance from being too great.

In some other embodiments, at least one first sacrificial conductive line may be provided on each of two sides of a group of first lead-out lines X162.

FIG. 13 is a structural diagram of the display panel 100, in accordance with some embodiments.

Referring to FIG. 13, in an implementation, the width of the second lead-out line 172 is equal to the width of the second signal line 171 connected thereto, and the arrangement density of the second signal lines 171 is greater than the arrangement density of the second lead-out lines 172.

During the process of etching the conductive layer, there is more etching liquid in the region where the second lead-out lines 172 are located than in the region where the plurality of second signal lines 171 are located. Therefore, the etching rate of the second lead-out line 172 is greater than that of the second lead-out line 172, it is easy to cause the second lead-out line 172 to be over-etched, causing the actual width of the second lead-out line 172 to be less than the design width of the second lead-out line 172, which leads to excessive resistance of the second lead-out line 172.

FIG. 14A is a structural diagram of the display panel 100, in accordance with some embodiments. Referring to FIG. 14A, in some embodiments of the present disclosure, the width of the second lead-out line 172 is greater than the width of the second signal line 171 connected thereto, it is possible to prevent the actual width of the second lead-out line 172 from being too small, and resulting in the excessive resistance.

FIG. 14B is a structural diagram of the display panel 100, in accordance with some embodiments.

Referring to FIG. 14B, in some other embodiments, at least one second sacrificial conductive line is provided on each of two side of the second lead-out line 172. By providing the second sacrificial conductive line 174, it is possible to increase the arrangement density of the second lead-out lines 172, which reduces the etching speed of the second lead-out line 172, thereby preventing the actual width of the second lead-out line 172 from being too small and the resistance from being too great.

A distance between the closest second sacrificial conductive line 174 and the second lead-out line 172 closest thereto may be equal to the distance between the second signal lines 171, so that the etching environment of the second lead-out line 172 is close to that of the second signal line 171.

In some other embodiments, at least one second sacrificial conductive line 174 may be provided on each of two sides of a group of second lead-out lines X172.

In some embodiments, the relationship between the width of the second signal line 171 and the second lead-out line 172 may be similar to that between the first signal line 161 and the first lead-out line 162, that is, the second signal line 171 corresponds to the first signal line 161, and the second lead-out line 172 corresponds to the first lead-out line 162, and will not be repeated in detail in the present disclosure.

In addition, referring to FIG. 13, in some embodiments of the present disclosure, sacrificial conductive lines 171' may also be provided on at least one side of the entire plurality of second signal lines 171.

In an embodiment, a sacrificial conductive line 171' is provided between two adjacent second lead-in lines 173; for example, an extension direction of the sacrificial conductive line 171' is the same as an extension direction of the second signal line 171 at the distribution position thereof. In an embodiment, multiple sacrificial conductive lines 171' are provided between two adjacent second lead-in lines 173; for example, the extension direction of the sacrificial conductive lines 171' is the same as the extension direction of the second signal line 171 at the distribution position thereof. Thus, it is possible to ensure the etching uniformity of the plurality of second signal lines 171 proximate to the second lead-in line 173.

In an embodiment, a sacrificial conductive line 171' is provided between two adjacent second lead-out lines 172; for example, an extension direction of the sacrificial conductive line 171' is the same as the extension direction of the second signal line 171 immediately adjacent to the distribution position thereof. In an embodiment, multiple signal line sacrificial conductive lines 171' are provided between two adjacent second lead-out lines 172; for example, an extension direction of the sacrificial conductive line 171' is the same as the extension direction of second signal line 171 immediately adjacent to the distribution position thereof. Thus, it is possible to ensure the etching uniformity of the plurality of second signal lines 171 proximate to the second lead-out line 172.

FIG. 15 is a structural diagram of the display panel 100, in accordance with some embodiments.

Referring to FIG. 15, in some embodiments, the display panel 100 includes a gate driving circuit 180 located in the peripheral area BB. The gate driving circuit 180 has a plurality of shift register units GOA, at least part of the plurality of shift register units GOA is electrically connected to the gate lines GT for sending gate driving signals to the gate lines GT. The plurality of shift register units GOA may be located on a side or two sides of the display area AA.

For example, in a case where the plurality of shift register units GOA are located on a side of the display area AA, the number of shift register units GOA is equal to the number of gate lines GT, and the shift register units GOA are connected to the gate lines GT in a one-to-one correspondence. In this case, one shift register unit GOA correspondingly sends a gate driving signal to a gate line GT.

For example, the plurality of shift register units GOA are located on two sides of the display area AA; two shift register units GOA respectively located on two sides of the display area AA may be set to be electrically connected to a gate line, i.e., send the gate driving signal to a gate line GT. Thus, it is possible to increase the driving capability of the gate driving circuit 180. For example, the plurality of shift register units GOA may be located on two sides of the display area AA distributed in the direction X.

In some embodiments, an overall span H1 of the shift register units GOA included in the gate driving circuit 180 in the second direction Y is less than an overall span H2 of the pixels S in the display area AA in the second direction Y. Referring to FIG. 15, the overall span H1 of the shift register unit GOA in the second direction Y may be understood as a maximum size occupied by all shift register units GOA in the second direction Y, and the overall span H2 of the pixels S in the second direction Y may be understood is a maximum size occupied by the pixels S with the longest span in the second direction Y.

By making the overall span H1 of the plurality of shift register units GOA in the second direction Y less than the overall span H2 of the pixels S in the display area AA in the second direction Y, the space occupied by the plurality of shift register units GOA in the second direction Y is reduced to avoid interference with the layout of other signal lines.

FIG. 16 is a structural diagram of the display panel 100, in accordance with some embodiments. FIG. 17 is a structural diagram of the display panel 100, in accordance with some embodiments.

Referring to FIGS. 15, 16 and 17, in some embodiments, the display area AA includes a column of pixels S with the longest span; "a column of pixels S with the longest span" refers to a column of pixels S with a longest span, i.e., the greatest size, in the second direction Y among the plurality of columns of pixels S in the display panel 100.

In a plane where the display panel 100 is located, a first orthographic projection of the plurality of shift register units GOA on a straight line where a column of pixels S with the longest span is located is located within a second orthographic projection of a column of pixels S with the longest span on the straight line where the column of pixels S with the longest span is located. Therefore, the shift register units GOA included in the gate driving circuit 180 are only located on one side or two sides, in the first direction X, of the column of pixels S with the longest span, and will not be located on one side or two sides, in the second direction Y, of the column of pixels S with the longest span. Thus, it is possible to reduce the space occupied by the shift register units GOA in the second direction Y to avoid interference with the layout of other signal lines. For example, the third signal line arrangement region B30 occupies at least one side of the display area AA, and the space occupied by the plurality of shift register units GOA in the second direction Y is reduced, which prevents the arrangement of the GOA units from interfering in the arrangement of the third signal line arrangement region B30. Referring to FIG. 15, in the third signal line arrangement region B30, a third ortho-graphic projection of the third signal line arrangement region B30 on the straight line where a column of pixels S with the longest span is located overlaps with the second orthographic projection. For example, the third signal line arrangement region B30 is disposed on two sides of the column of pixels S with the longest span, which makes the wiring in the third signal line arrangement region B30 may be dispersive in the display panel, so that it is conducive to making the display panel achieve the narrow bezels.

In some embodiments, a distribution period of the shift register units GOA on at least one side of the display area AA is less than the arrangement period $P_{sub2}$ of the sub-pixel S0 in the second direction Y. Thus, it is beneficial to the compact design of the shift register units GOA to save the occupied space.

Referring to FIGS. 16 and 17, in some embodiments, a distribution contour of the shift register units GOA distributed on at least one side of the display area AA is the same as an outer contour of the display area AA on a correspond-ing side thereof. With such design, it is beneficial to reducing a distance between the distribution contour of the shift register units GOA and the outer contour of the display area AA, which may reduce the size of the peripheral area BB of the display panel 100, and thereby helping narrow the bezel of the display panel 100.

In some examples, the shift register units GOA distributed on at least one side of the display area AA are distributed conformally to the outer contour of the display area AA. For example, the outer contour of the display area AA is in a shape of a circle, and correspondingly, the distribution contour of the shift register units GOA distributed at least one side is arc-shaped.

In some examples, the shift register units GOA may be arranged in the direction X; that is, the plurality of shift register units GOA may be arranged in parallel. In an embodiment, referring to FIG. 16, the plurality of shift register units GOA include a reference shift register unit GOAm; a distance between the reference shift register unit GOAm and a column of pixels S with the longest span is greater than a distance between other shift register units GOA and the column of pixels S with the longest span. The plurality of shift register units GOA each extend in the first direction X. With such arrangement, the arrangement of TFTs in the shift register units GOA remains consistent, which is beneficial for maintaining the same TFT manufac-turing environment during the etching process.

In some other examples, the shift register units GOA are not all arranged in the direction X. In an embodiment, an included angle between an extension direction of a shift register unit GOA and the direction X is positively related to a distance between the shift register unit GOA and a row of pixels S with the longest span. In an embodiment, an included angle between an extension direction of a shift register unit GOA and the direction X is positively related to a distance between the shift register unit GOA and a straight line extending in the X direction through a center of the display area AA. In an embodiment, an included angle between an extension direction of a shift register unit GOA and the direction X is positively related to a distance between the shift register unit GOA and a center of a whole composed of all the shift register units GOA on a side where the shift register unit GOA is located. In an embodiment, the reference shift register unit GOAm extends in the direction X, and an included angle between an extension direction of the shift register unit GOA is positively related to a distance between the shift register unit GOA and the reference shift register unit GOAm. With such arrangement, each shift register unit GOA may be kept at an equal or approximately equal distance from the outer contour of the display area AA, thereby achieving the narrower bezel of the display panel.

In some embodiments, a ratio of the first orthographic projection to the second orthographic projection is in a range of [0.1, 0.9]; that is, a dimension of the gate driving circuit 180 in the second direction Y is 0.1 to 0.9 times a dimension, in the second direction Y, of a column of pixels S with the longest span.

The ratio of the first orthographic projection to the second orthographic projection is greater than or equal to 0.1. Thus, it may be possible to prevent the defects from being prone to occur due to a fact that the distance between the plurality of transistors in the shift register unit GOA is too small, which is caused by a fact, due to too small dimension of the gate driving circuit 180 in the second direction Y, that the arrangement period of the shift register units GOA is too small.

The ratio of the first orthographic projection to the second orthographic projection is less than or equal to 0.9. Thus, it may be possible to prevent from interfering in the arrange-ment of the third signal line arrangement region B30 due to a too large size occupied by the gate driving circuit 180 in the peripheral area BB, which caused by a fact that the dimension of the gate driving circuit 180 in the second direction Y.

In some of the above embodiments, the gate driving signal is provided by the shift register unit GOA, while in some other embodiments, the gate driving signal may also be provided by a gate driver chip.

FIG. 18 is a structural diagram of the display panel 100, in accordance with some embodiments.

Referring to FIG. 18, the peripheral area BB is further provided with a plurality of gate line bonding pins 190 therein; the plurality of gate line bonding pins 190 are located on one or two sides of the display area AA. The plurality of gate line bonding pins 190 are located in a gate line bonding region 191.

Referring to FIG. 17, in some examples, an overall span of the plurality of gate line bonding pins 190 in the second direction Y is less than an overall span of the pixels S in the display area AA in the second direction Y.

In some examples, in the plane where the display panel 100 is located, a fourth orthographic projection of the plurality of gate line bonding pins 190 on a straight line where a column of pixels S with the longest span is located is within the second orthographic projection of the column of pixels S with the longest span on the straight line where the column of pixels S with the longest span is located.

In some examples, a distribution period, in the second direction Y, of the gate line bonding pins 190 distributed on at least one side of the display area AA is less than an arrangement period of the sub-pixels S0 in the second direction Y.

In some examples, at least part of the gate line bonding pins 190 extend in a straight line.

In some embodiments, a common electrode lead line COM is further provided between the border of the display area AA and the signal line arrangement region closest thereto. The signal line arrangement region closest to the border of the display area AA is the first signal line arrange-ment region B10 or the second signal line arrangement area B20. A contour of at least part of the common electrode lead line COM is the same as the corresponding outer contour of the display area AA. Alternatively, dummy sub-pixels S1 (as shown in FIG. 11) are provided in the periphery of the display area AA, and at least part of the common electrode lead line COM extends to fit an outer contour of a whole composed of the sub-pixels S0 and the dummy sub-pixels S1 in the display area AA.

As shown in FIG. 11, in a case where the periphery of the display area AA includes dummy sub-pixels S1, there are a plurality of dummy sub-pixels S1, and the plurality of dummy sub-pixels S1 are arranged around the periphery of the display area AA. In this case, at least one dummy sub-pixel S1 is provided at each of two ends of each row of sub-pixels S0. Of course, at least one dummy sub-pixel S1 is also provided at each of two ends of each column of sub-pixels S0.

In some examples, a pixel arrangement region includes a whole composed of the sub-pixels S0 and all dummy sub-pixels S1. In some other examples, a pixel arrangement region only includes all sub-pixels S0.

The contour of at least part of the common electrode lead line COM is the same as the outer outline of the corresponding display area AA, which may be understood that the contour of at least part of the common electrode lead line COM proximate to the corresponding display area AA and the contour of the corresponding display area AA are conformal.

At least part of the common electrode lead line COM extends to fit the outer contour of the pixel arrangement region, which is beneficial to the compact arrangement of the display panel to narrow the bezel of the display panel.

In some embodiments, as shown in FIG. 7, a minimum distance a between an outer contour of the display area AA and a signal line arrangement region closest thereto is greater than or equal to $$2\sqrt{P1^2 + P2^2}.$$

A necessary space is left between the display area AA and the signal line arrangement region closest thereto, which facilitates the arrangement of the dummy sub-pixels, common electrode trace lines and signal lines. The signal line arrangement region closest to the border of the display area AA is the first signal line arrangement region B10 or the second signal line arrangement region B20.

The opposite substrate 120 includes black matrix patterns 123 each including a light-transmitting region. For example, the minimum distance a between the outer contour of the display area AA and the signal line arrangement region closest thereto, which may be understood as a distance between a border, proximate to the display area, of a side of the signal line arrangement region closest to the center of the display panel and a light-transmitting position of the light-transmitting region closest to the signal line arrangement region.

FIG. 19 is a structural diagram of the display panel 100, in accordance with some embodiments.

Referring to FIG. 19, in some embodiments, the arrangement period P1 of the pixel S in the first direction X is in a range of [60 μm, 900 μm], and the arrangement period P2 of the pixel S in the second direction Y is in a range of [60 μm, 900 μm]. In a case where the arrangement period P1 of the pixel S in the first direction X approaches 60 μm, and the arrangement period P2 of the pixel S in the second direction Y approaches 60 μm, which makes an area of the pixel S is small, so that the pixels per inch (PPI) of the display panel 100 is high.

In a case where the arrangement period P1 of the pixel S in the first direction X approaches 900 μm, and the arrangement period P2 of the pixel S in the second direction Y approaches 900 μm, which makes an area of the pixel S is great, so that the manufacturing process of the display panel 100 is simple.

The width $P_{sub1}$ of the sub-pixel S0 in the first direction X is in a range of [20 μm, 900 μm]. The width $P_{sub2}$ of the sub-pixel S0 in the second direction Y is in a range of [20 μm, 900 μm].

In a case where the arrangement period $P_{sub1}$ of the sub-pixel S0 in the first direction X approaches 20 μm, and the arrangement period $P_{sub2}$ of the sub-pixel S0 in the second direction Y approaches 20 μm, which makes an area of the sub-pixel S0 is small, so that the PPI of the display panel 100 is high.

In a case where the arrangement period $P_{sub1}$ of the sub-pixel S0 in the first direction X approaches 900 μm, and the arrangement period $P_{sub2}$ of the sub-pixel S0 in the second direction Y approaches 900 μm, which makes an area of the sub-pixel S0 is great, so that the manufacturing process of the display panel 100 is simple. A pixel S may include only one sub-pixel S0.

In some examples, $P_{sub2}=3P_{sub1}$, and $P_{sub2}=P2$.

In some embodiments, the width $W_{data}$ of the first signal line 161 is in a range of [1 μm, 20 μm], with such design, it may be possible to prevent the process difficulty of the first signal line 161 from increasing caused by a fact the width $W_{data}$ of the first signal line 161 from being too small (for example, less than 1 μm), and thereby reduce the occurrence of circuit breakage in the first signal line 161. In addition, it may be possible to prevent the width occupied by the plurality of first signal lines 161 from being too great caused by the excessive width $W_{data}$ of the first signal line 161. Thus, it may be possible to avoid that the narrow bezel is not achieved due to a fact, caused by the excessive width of the first signal line arrangement region B10, that the peripheral area BB of the display panel 100 is too great.

The distance $S_{data}$ between the adjacent first signal lines 161 is in a range of [1 μm, 20 μm]. With such design, it is possible to avoid a short circuit between the two adjacent first signal lines 161 due to the increased process difficulty of the first signal lines 161, caused by a fact that the distance $S_{data}$ between the adjacent first signal lines 161 from being too small (for example, less than 1 μm). In addition, it may also be possible to prevent the width occupied by the plurality of first signal lines 161 from being too great caused by the excessive distance $S_{data}$ between the adjacent first signal lines 161. Thus, it may be possible to avoid that the narrow bezel is not achieved due to a fact, caused by the excessive width of the first signal line arrangement region B10, that the peripheral area BB of the display panel 100 is too great.

The width $W_{gate}$ of the second signal line 171 is in a range of [1 μm, 20 μm], with such design, it may be possible to prevent the process difficulty of the second signal line 171 from increasing caused by a fact that the width $W_{gate}$ of the second signal line 171 from being too small (for example, less than 1 μm), so that the occurrence of circuit breakage in the second signal line 171 is reduce. In addition, it may also be possible to prevent the width occupied by the plurality of second signal lines 171 from being too great caused by the excessive width $W_{gate}$ (for example, greater than 20 μm) of the second signal line 171. Thus, it may be possible to avoid that the narrow bezel is not achieved due to a fact, caused by the excessive width of the second signal line arrangement region B20, that the peripheral area BB of the display panel 100 is too great.

The distance $S_{gate}$ between the second signal lines 171 is in a range of [1 μm, 20 μm]. With such design, it may be possible to prevent a short circuit of two adjacent second signal lines 171 from occurring due to the increased process difficulty of the second signal line 171, caused by a fact that the distance $S_{gate}$ between adjacent second signal lines 171 from being too small (for example, less than 1 μm). In addition, it may also be possible to prevent the width occupied by the plurality of second signal lines 171 from being too great caused by the excessive distance between the distance $S_{gate}$ (for example, greater than 20 μm) of adjacent second signal lines 171. Thus, it may be possible to avoid that the narrow bezel is not achieved due to a fact, caused by the excessive width of the second signal line arrangement region B20, that the peripheral area BB of the display panel 100 is too great.

Referring to FIG. 5A, in some embodiments, the display panel 100 includes a data line bonding region B40; the data line bonding region B40 includes a plurality of data line bonding pins 164, and the first signal lines 161 may be electrically connected to the data line bonding pins 164, respectively. For example, the first signal lines 161 are electrically connected to the data line bonding pins 164 in one-to-one correspondence.

In some examples, the plurality of data line bonding pins 164 in the data line bonding region B40 are electrically connected to a driver chip.

In some examples, there are a plurality of data line bonding regions B40; in this case, a plurality of driver chips are also provided in the display panel 100. For example, there may be four data line bonding regions B40.

In a case where the outer contour of the pixel arrangement region is in a shape of a circle, the plurality of data line bonding regions B40 are arranged symmetrically with a straight line where a column of pixels S with the longest span is located as an axis of symmetry.

For example, two data line bonding regions B40 are provided on each of two sides of the straight line where the column of pixels S with the longest span is located.

Referring to FIG. 15, in some examples, the first signal line arrangement region B10 is located in a region CC1 between a non-display area that is between the gate driving circuit 180 in the peripheral area BB and the display area AA and a non-display area that is between the data line bonding region B40 and the display area AA.

As shown in FIG. 15, in some examples, the second signal line arrangement region B20 is located in a region CC1 between a non-display area that is between the gate driving circuit 180 in the peripheral area BB and the display area AA and a non-display area that is between the data line bonding region B40 and the display area AA.

FIG. 15 illustrates at least partial specific positions of the first signal line arrangement region B10 and the second signal line arrangement region B20 in the entire display panel, the first signal line arrangement region B10 and the second signal line arrangement region B20 are located in the region CC1 circled by the dotted ellipse, and the first signal line arrangement region B10 and the second signal line arrangement region B20 in this region satisfy the above-mentioned wiring rules.

Referring to FIG. 18, the display panel 100 includes data line bonding regions B40; the data line bonding region B40 includes a plurality of data line bonding pins 164, and the first signal lines 161 may be electrically connected to the data line bonding pins 164, respectively.

The display panel 100 includes gate line bonding regions 191; the gate line bonding region 191 includes a plurality of gate line bonding pins 190, and the second signal lines 171 are electrically connected to the gate line bonding pins 190 in a one-to-one correspondence.

The first signal line arrangement region B10 is located in the region CC2 between the non-display area that is between the gate line bonding region 191 in the peripheral area BB and the display area AA and the non-display area that is between the data line bonding region B40 and the display area AA. The second signal line arrangement region B20 is located in the region CC2 between the non-display area that is between the gate line bonding region 191 in the peripheral area BB and the display area AA and the non-display area that is between the data line bonding region B40 and the display area AA.

FIG. 18 illustrates at least partial specific positions of the first signal line arrangement region B10 and the second signal line arrangement region B20 in the entire display panel, the first signal line arrangement region B10 and the second signal line arrangement region B20 are located in the region CC2 circled by the dotted ellipse, and the first signal line arrangement region B10 and the second signal line arrangement region B20 in this region satisfy the above-mentioned wiring rules.

FIG. 20 is a structural diagram of a display module 1000, in accordance with some embodiments.

Referring to FIG. 20, some embodiments of the present disclosure provide a display module 1000. The display module 1000 includes the display panel 100 provided by some of the above embodiments. Therefore, the display module 1000 provided by some embodiments of the present disclosure has all the beneficial effects of the display panel 100 provided by some of the above embodiments, which will not be repeated here.

The display module 1000 further includes a first flexible circuit board 200, a driver chip 300 and a mainboard 400. An end of the first flexible circuit board 200 is bonded to the plurality of data line bonding pins 164 in the display panel 100, and the other end of the first flexible circuit board 200 is bonded to the mainboard 400. In addition, the flexible circuit board 200 may further include a driver chip 300, and the driver chip 300 may transmit a data signal to the first lead-in line 163, the first signal line 161, the first lead-out line 162 and the data line DT that are connected to the data line bonding pin 164 through the first flexible circuit board 200. The mainboard 400 provides necessary input signals to the driver chips 300. The driver chips 300 generate the data signals required by the display panel 100 based on the signals provided by the mainboard 400, and transmit the data signals to the display panel 100.

In a case where the display panel 100 further includes gate line bonding pins 190, the display module 1000 further includes a second flexible circuit board, and an end of the second flexible circuit board is bonded to the plurality of gate line bonding pins 190 in the display panel 100, and the other end of the second flexible circuit board is bonded to the mainboard 400. In addition, the second flexible circuit board is further provided with gate driver chips therein, and the gate driver chip may transmit a gate driving signal to the second lead-in line 173, the second signal line 171, the second lead-out line 172 and the gate line GT that are connected to the gate line bonding pin 190 through the second flexible circuit board. The mainboard 400 provides necessary input signals to the gate driver chips. The gate driver chips generate timing signals required by the display panel 100 based on the signals provided by the mainboard 400 and transmits the timing signals to the display panel 10.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

In the description of the specification, specific features, structures, materials or characteristics may be combined in any suitable manner in any one or more embodiments or examples. In addition, all examples and all embodiments can be freely combined without changing the intention of the invention of the present disclosure.

The invention claimed is:

1. A display panel, comprising: a display area and a peripheral area, the display area including a plurality of pixels arranged in an array extending in a first direction and a second direction, each pixel including a plurality of sub-pixels arranged in the first direction, wherein the peripheral area includes a first signal line arrangement region and a second signal line arrangement region that are arranged around the display area; the first signal line arrangement region includes a plurality of first signal lines extending in a same direction, and the second signal line arrangement region includes a plurality of second signal lines extending in a same direction; the first signal line arrangement region and the second signal line arrangement region are both in a shape of a narrow strip, and include borders that are close to and non-overlapping with each other, and the borders extend in a same direction; the display panel comprises: a plurality of first lead-out lines including a first reference lead-out line, data lines including a first reference data line, a plurality of second lead-out lines, and gate lines;

wherein a border of the first signal line arrangement region proximate to the display area includes a plurality of first lead-out positions, and the plurality of first lead-out lines are led out from the plurality of first lead-out positions in a one-to-one correspondence, and are electrically connected to the plurality of first signal lines in a one-to-one correspondence; a first lead-out line is electrically connected to a data line; the plurality of first lead-out positions include a first reference lead-out position, and the first reference lead-out line is led out from the first reference lead-out position and electrically connected to the first reference data line; a width of the first signal line arrangement region corresponding to the first reference lead-out position is b0; a width b of the first signal line arrangement region corresponding to at least partially continuously distributed first target lead-out positions except for the first reference lead-out position satisfies:

$$b0-[\mathrm{int}(k\Delta1/P1)](W_{data}+S_{data})\leq b\leq b0-[\mathrm{int}(k\Delta1/P1)-1](W_{data}+S_{data});$$

wherein $\Delta1$ is a distance between a first target lead-out position and the first reference lead-out position in the first direction, P1 is an arrangement period of a pixel in the first direction, k is a number of sub-pixels in the pixel, $W_{data}$ is a width of a first signal line, and $S_{data}$ is a distance between the adjacent first signal lines of the plurality of first signal lines;

a border of the second signal line arrangement region proximate to the display area includes a plurality of second lead-out positions, and the plurality of second lead-out lines are led out from the plurality of second lead-out positions in one-to-one correspondence, and are electrically connected to the plurality of the second signal lines in one-to-one correspondence; a second lead-out line is electrically connected to a gate line; at least one first lead-out position and at least one second lead-out position are alternately arranged in the first direction.

2. The display panel according to claim 1, wherein the first direction is perpendicular to the second direction;

an extension direction of at least part of the first signal line arrangement region and an extension direction of at least part of the second signal line arrangement region are each different from both the first direction and the second direction.

3. The display panel according to claim 1, wherein for the at least partially continuously distributed first target lead-out positions, a width b1 of the first signal line arrangement region corresponding to a first target lead-out position corresponding to a sub-pixel with a same color as a sub-pixel electrically connected to the first reference data line satisfies:

$$b1=b0-[\mathrm{int}(k\Delta1/P1)](W_{data}+S_{data}).$$

4. The display panel according to claim 1, wherein the at least partially continuously distributed first target lead-out positions include three continuously distributed first target lead-out positions, and the three continuously distributed first target lead-out positions are electrically connected to three sub-pixels of a pixel in a one-to-one correspondence, an overall width of three first lead-out lines corresponding to the three continuously distributed first target lead-out positions is less than or equal to an arrangement period of a sub-pixel in the first direction.

5. The display panel according to claim 1, wherein the plurality of second lead-out positions include a second reference lead-out position, the plurality of second lead-out lines includes a second reference lead-out line, the gate lines includes a reference gate line; and the second reference lead-out line is led out from the second reference lead-out position and is electrically connected to the reference gate line; a width of the second signal line arrangement region corresponding to the second reference lead-out position is c0; among at least partially continuously distributed second target lead-out positions except for the second reference lead-out position, a width c of the second signal line arrangement region corresponding to each second target lead-out position satisfies:

$$c0-[\mathrm{int}(k\Delta2/P1)+1](W_{gate}+S_{gate})\leq c\leq c0-[\mathrm{int}(k\Delta2/P1)-1](W_{gate}+S_{gate}),$$

wherein $\Delta2$ is a distance between a second target lead-out position and the second reference lead-out position in the first direction, $W_{gate}$ is a width of a second signal line, and $S_{gate}$ is a distance between adjacent second signal lines of the plurality of signal lines.

6. The display panel according to claim 5, wherein a distance between the first reference lead-out position and the second reference lead-out position in the first direction is less than the arrangement period of the pixel in the first direction;

the at least partially continuously distributed second target lead-out positions and the at least partially continuously distributed first target lead-out positions are alternately distributed in the first direction.

7. The display panel according to claim 6, characterized wherein among the at least partially continuously distributed first target lead-out positions, m second target lead-out positions are provided on each of two sides of every three first target lead-out positions, where m is one of three values 4, 5, or 6.

8. The display panel according to claim 7, wherein the three first target lead-out positions are arranged at equal intervals, and the m second target lead-out positions are arranged at equal intervals; a distance between adjacent first target lead-out positions of the three first target lead-out positions is greater than a distance between adjacent second target lead-out positions of the m second target lead-out positions; and/or the three first target lead-out positions are arranged at equal intervals, and the m second target lead-out positions are arranged at equal intervals; a width occupied by the three first target lead-out positions in the first direction is less than a width occupied by the m second target lead-out positions in the first direction.

9. The display panel according to claim 1, wherein an included angle between a first lead-out line and a first signal line electrically connected thereto is greater than or equal to 90 degrees; an included angle between a second lead-out line and a second signal line electrically connected thereto is greater than or equal to 90 degrees; and/or a width of the first lead-out line is greater than a width of the first signal line connected thereto; and/or a width of the second lead-out line is greater than a width of the second signal line connected thereto.

10. The display panel according to claim 1, wherein the plurality of second lead-out positions include a second reference lead-out position, the plurality of second signal lines includes a second reference signal line, and the gate lines includes a reference gate line; and the second reference signal line is led out from the second reference lead-out position and is electrically connected to the reference gate line; a width of the second signal line arrangement region corresponding to the second reference lead-out position is c0; among at least partially continuously distributed second target lead-out positions except for the second reference lead-out position, a width c of the second signal line arrangement region corresponding to each second target lead-out position satisfies:

$$c0-[\mathrm{int}(\Delta3/P_{sub2})+1](W_{gate}+S_{gate})\leq c\leq c0-[\mathrm{int}(\Delta3/P_{sub2})-1](W_{gate}+S_{gate}),$$

wherein $\Delta3$ is a distance between a second target lead-out position and the second reference lead-out position in the second direction, $P_{sub2}$ is an arrangement period of a sub-pixel in the second direction, $W_{gate}$ is a width of a second signal line, and $S_{gate}$ is a distance between adjacent second signal lines of the plurality of second signal lines.

11. The display panel according to claim 10, wherein the gate lines further include a target gate line; for the at least partially continuously distributed second target lead-out positions, a width c1 of the second signal line arrangement region corresponding to a second lead-out position electrically connected to the target gate line spaced an odd-numbered gate lines from the reference gate line satisfies:

$$c1=c0-[\mathrm{int}(\Delta3/P_{sub2})](W_{gate}+S_{gate}); \text{ and/or}$$

the width b satisfies: $b=b0-[\mathrm{int}(k\Delta1/P1)](W_{gate}+S_{gate})$, wherein P1 is the arrangement period of the pixel in the first direction.

12. The display panel according to claim 1, wherein the first signal line arrangement region is closer to the display area than the second signal line arrangement region, or the second signal line arrangement region is closer to the display area than the first signal line arrangement region.

13. The display panel according to claim 12, wherein in a case where the second signal line arrangement region is closer to the display area than the first signal line arrangement region, and the first lead-out lines are led out in the second direction, an included angle $\theta1$ between a first signal line that is located in the first signal line arrangement region and is immediately adjacent to the second signal line arrangement region and a second signal line that is located in the second signal line arrangement region and is immediately adjacent to the first signal line arrangement region satisfies:

$$\sin\theta1=[I1(W_{data}+S_{data})\cos\alpha1]/P1,$$

wherein $\alpha1$ is an included angle between the second signal line that is located in the second signal line arrangement region and is immediately adjacent to the first signal line arrangement region and the first direction, I1 is a number of first target lead-out positions corresponding to a range of the arrangement period of the pixel in the first direction, and P1 is the arrangement period of the pixel in the first direction; or in a case where the first signal line arrangement region is closer to the display area than the second signal line arrangement region, and the second lead-out lines are led out in the second direction, an included angle $\theta2$ between a first signal line that is located in the first signal line arrangement region and is immediately adjacent to the second signal line arrangement region and a second signal line that is located in the second signal line arrangement region and is immediately adjacent to the first signal line arrangement region satisfies:

$$\sin\theta2=[I2(W_{gate}+S_{gate})\cos\alpha2]/P1$$

wherein $\alpha2$ is an included angle between the first signal line that is located in the first signal line arrangement region and is immediately adjacent to the second signal line arrangement region and the first direction, I2 is a number of second target lead-out positions corresponding to a range of the arrangement period of the pixel in the first direction, and P1 is the arrangement period of the pixel in the first direction; or in a case where the first signal line arrangement region is closer to the display area than the second signal line arrangement region, and the second lead-out lines are led out in the first direction, an included angle $\theta3$ between a first signal line that is located in the first signal line arrangement region and is immediately adjacent to the second signal line arrangement region and a second signal line that is located in the second signal line arrangement region and is immediately adjacent to the first signal line arrangement region satisfies:

$$\sin\theta3=[I3(W_{gate}+S_{gate})\sin\alpha3]/P2,$$

wherein $\alpha3$ is an included angle between the first signal line that is located in the first signal line arrangement region and is immediately adjacent to the second signal line arrangement region and the first direction, I3 is a number of second target lead-out positions corresponding to a range of an arrangement period of a pixel in the second direction, and P2 is the arrangement period of the pixel in the second direction.

14. The display panel according to claim 12, wherein the second signal line arrangement region is closer to the display area than the first signal line arrangement region, and an included angle θ between a first signal line that is located in the first signal line arrangement region and is immediately adjacent to the second signal line arrangement region and a second signal line that is located in the second signal line arrangement region and is immediately adjacent to the first signal line arrangement region is in a range of 1° to 5°, inclusive.

15. The display panel according to claim 1, wherein the display panel comprises a gate driving circuit located in the peripheral area, wherein the gate driving circuit has a plurality of shift register units, at least part of the plurality of shift register units are electrically connected to the gate lines for sending gate driving signals to the gate lines; an overall span of the plurality of shift register units in the second direction is less than an overall span of the pixels in the display area in the second direction.

16. The display panel according to claim 15, wherein the display area includes a column of pixel with a longest span, in a plane where the display panel is located, a first orthographic projection of the plurality of shift register units on a straight line where the column of pixels with the longest span is located is within a second orthographic projection of the column of pixels with the longest span on the straight line where the column of pixels with the longest span is located.

17. The display panel according to claim 16, wherein the plurality of shift register units are located on two sides of the display area.

18. The display panel according to claim 1, wherein a border of the display area and a signal line arrangement region closest thereto are further provided with a common electrode lead line therebetween, and the signal line arrangement region closest to the border of the display area is the first signal line arrangement region or the second signal line arrangement region, wherein a contour of at least part of the common electrode lead line is the same as an corresponding outer contour of the display area, or dummy sub-pixels are provided at a periphery of the display area, and the at least part of the common electrode lead line extends to fit an outer contour of a whole composed of sub-pixels and the dummy sub-pixels in the display area.

19. The display panel according to claim 1 wherein the first reference lead-out position is a first lead-out position closest to a position of the first signal line arrangement region with a maximum width; and/or the second reference lead-out position is a second lead-out position closest to a position of the second signal line arrangement region with a maximum width.

20. The display panel according to claim 1, the display panel comprises a gate driving circuit located in the peripheral area, wherein the gate driving circuit has a plurality of shift register units, at least part of the plurality of shift register units are electrically connected to the gate lines for sending gate driving signals to the gate lines; an overall span of the plurality of shift register units in the second direction is less than an overall span of the pixels in the display area in the second direction; the display panel comprises a data line bonding region, wherein the data line bonding region includes a plurality of data line bonding pins, and the first signal lines are electrically connected to the data line bonding pins in a one-to-one correspondence; wherein the first signal line arrangement region is located in a region between a non-display area that is between the gate driving circuit in the peripheral area and the display area and a non-display area that is between the data line bonding region and the display area; and the second signal line arrangement region is located in a region between a non-display area that is between the gate driving circuit in the peripheral area and the display area and a non-display area that is between the data line bonding region and the display area; or the display panel comprises a data line bonding region, wherein the data line bonding region includes a plurality of data line bonding pins, and the first signal lines are electrically connected to the data line bonding pins in a one-to-one correspondence; and the display panel comprises a gate line bonding region, wherein the gate line bonding region includes a plurality of gate line bonding pins, and the second signal lines are electrically connected to the gate line bonding pins in a one-to-one correspondence; wherein the first signal line arrangement region is located in a region between a non-display area that is between the gate line bonding region in the peripheral area and the display area and a non-display area that is between the data line bonding region and the display area; and the second signal line arrangement region is located in a region between a non-display area that is between the gate line bonding region in the peripheral area and the display area and a non-display area that is between the data line bonding region and the display area.

* * * * *